United States Patent
Krishnamoorthy et al.

(10) Patent No.: US 8,901,268 B2
(45) Date of Patent: Dec. 2, 2014

(54) COMPOSITIONS, LAYERS AND FILMS FOR OPTOELECTRONIC DEVICES, METHODS OF PRODUCTION AND USES THEREOF

(76) Inventors: Ahila Krishnamoorthy, San Jose, CA (US); Richard Spear, Santa Cruz, CA (US); Amanuel Gebrebrhan, Mountain View, CA (US)

(*) Notice: Subject to any disclaimer, the term of this patent is extended or adjusted under 35 U.S.C. 154(b) by 1587 days.

(21) Appl. No.: 12/027,113

(22) Filed: Feb. 6, 2008

(65) Prior Publication Data

US 2011/0171447 A1    Jul. 14, 2011

Related U.S. Application Data

(63) Continuation-in-part of application No. 11/784,966, filed on Apr. 10, 2007, which is a continuation-in-part of application No. 11/192,352, filed on Jul. 29, 2005, now Pat. No. 7,445,953, which is a continuation-in-part of application No. 10/910,673, filed on Aug. 3, 2004, now Pat. No. 7,015,061.

(51) Int. Cl.
| | |
|---|---|
| C08G 77/06 | (2006.01) |
| H01L 35/24 | (2006.01) |
| H01L 21/02 | (2006.01) |
| C09D 183/04 | (2006.01) |
| H01L 21/312 | (2006.01) |
| H01L 51/52 | (2006.01) |
| C08G 77/00 | (2006.01) |

(52) U.S. Cl.
CPC ...... *H01L 51/5262* (2013.01); *H01L 21/02216* (2013.01); *H01L 21/02126* (2013.01); *H01L 21/02282* (2013.01); *C09D 183/04* (2013.01); *H01L 21/02137* (2013.01); *C08G 77/70* (2013.01); *H01L 21/3122* (2013.01)

USPC .............................................. 528/12; 257/40

(58) Field of Classification Search
USPC ............... 257/40, E21.26, E21.261, E21.262, 257/E21.263; 528/12
See application file for complete search history.

(56) References Cited

U.S. PATENT DOCUMENTS

| | | | |
|---|---|---|---|
| 2,986,548 A * | 5/1961 | McLoughlin | ............... 524/319 |
| 2,986,549 A | 5/1961 | McLoughlin | |
| 3,294,737 A | 12/1966 | Krantz | |
| 3,547,766 A | 12/1970 | Chu | |
| 3,817,902 A | 6/1974 | Gomyo | |
| 4,107,133 A | 8/1978 | Sawai et al. | |
| 4,302,503 A | 11/1981 | Mattimoe | |

(Continued)

FOREIGN PATENT DOCUMENTS

| | | |
|---|---|---|
| EP | 0494744 A1 | 7/1992 |
| EP | 0659904 B1 | 6/1995 |

(Continued)

OTHER PUBLICATIONS

Sigma-Aldrich, Product Specification, Alphazurine A—Die Content 40%, one page downloaded from Sigma-aldrich.com on Feb. 22, 2014, one page.

(Continued)

*Primary Examiner* — Jose R Diaz
(74) *Attorney, Agent, or Firm* — Faegre Baker Daniels LLP

(57) ABSTRACT

Crosslinkable compositions are disclosed herein that comprise at least one silicon-based material comprising at least one alkyl group and at least one aryl or aromatic group, at least one catalyst, and at least one solvent.

21 Claims, 45 Drawing Sheets

(56) References Cited

U.S. PATENT DOCUMENTS

| | | | |
|---|---|---|---|
| 4,388,449 A * | 6/1983 | Bonnet et al. ............. 525/477 |
| 4,590,117 A | 5/1986 | Taniguchi et al. |
| 4,746,693 A | 5/1988 | Meder |
| 4,778,624 A | 10/1988 | Ohashi et al. |
| 4,962,996 A | 10/1990 | Cuellar et al. |
| 4,981,778 A | 1/1991 | Brault |
| 5,082,758 A | 1/1992 | Hoffend et al. |
| 5,116,637 A | 5/1992 | Baney et al. |
| 5,152,834 A | 10/1992 | Allman |
| 5,179,185 A | 1/1993 | Yamamoto et al. |
| 5,198,518 A | 3/1993 | Yamamoto et al. |
| 5,204,432 A | 4/1993 | Saito et al. |
| 5,227,334 A | 7/1993 | Sandhu |
| 5,236,984 A | 8/1993 | Yamamoto et al. |
| 5,319,049 A | 6/1994 | Yoshioka et al. |
| 5,320,868 A | 6/1994 | Ballance et al. |
| 5,340,644 A | 8/1994 | Babcock et al. |
| 5,387,480 A | 2/1995 | Haluska et al. |
| 5,415,927 A | 5/1995 | Hirayama et al. |
| 5,441,765 A | 8/1995 | Ballance et al. |
| 5,460,911 A | 10/1995 | Yu et al. |
| 5,523,163 A | 6/1996 | Ballance et al. |
| 5,635,240 A | 6/1997 | Haluska et al. |
| 5,693,701 A | 12/1997 | Camilletti et al. |
| 5,744,244 A | 4/1998 | Camilletti et al. |
| 5,767,014 A | 6/1998 | Hawker et al. |
| 5,776,559 A | 7/1998 | Woolford |
| 5,858,547 A | 1/1999 | Drage |
| 5,922,299 A | 7/1999 | Bruinsma et al. |
| 5,953,627 A | 9/1999 | Carter et al. |
| 5,962,067 A | 10/1999 | Bautista et al. |
| 6,000,339 A | 12/1999 | Matsuzawa |
| 6,020,410 A | 2/2000 | Hacker et al. |
| 6,022,812 A | 2/2000 | Smith et al. |
| 6,037,275 A | 3/2000 | Wu et al. |
| 6,040,053 A | 3/2000 | Scholz et al. |
| 6,042,994 A | 3/2000 | Yang et al. |
| 6,048,804 A | 4/2000 | Smith et al. |
| 6,074,695 A | 6/2000 | Kobayashi et al. |
| 6,090,448 A | 7/2000 | Wallace et al. |
| 6,117,360 A | 9/2000 | Miyazawa et al. |
| 6,126,733 A | 10/2000 | Wallace et al. |
| 6,140,254 A | 10/2000 | Endisch et al. |
| 6,143,855 A | 11/2000 | Hacker et al. |
| 6,149,966 A | 11/2000 | Kobayashi et al. |
| 6,177,199 B1 | 1/2001 | Hacker et al. |
| 6,204,202 B1 | 3/2001 | Leung et al. |
| 6,208,041 B1 | 3/2001 | Majumdar et al. |
| 6,210,856 B1 | 4/2001 | Lin et al. |
| 6,214,104 B1 | 4/2001 | Iida et al. |
| 6,218,020 B1 | 4/2001 | Hacker et al. |
| 6,218,497 B1 | 4/2001 | Hacker et al. |
| 6,231,989 B1 | 5/2001 | Chung et al. |
| 6,251,486 B1 | 6/2001 | Chandross et al. |
| 6,268,457 B1 | 7/2001 | Kennedy et al. |
| 6,318,124 B1 | 11/2001 | Rutherford et al. |
| 6,319,855 B1 | 11/2001 | Hendricks et al. |
| 6,329,017 B1 | 12/2001 | Liu et al. |
| 6,340,735 B1 | 1/2002 | Yagihashi |
| 6,358,559 B1 | 3/2002 | Hacker et al. |
| 6,359,099 B1 | 3/2002 | Hacker et al. |
| 6,361,820 B1 | 3/2002 | Hacker et al. |
| 6,365,266 B1 | 4/2002 | MacDougall et al. |
| 6,365,765 B1 | 4/2002 | Baldwin et al. |
| 6,368,400 B1 | 4/2002 | Baldwin et al. |
| 6,383,466 B1 | 5/2002 | Domansky et al. |
| 6,485,368 B2 | 11/2002 | Jones et al. |
| 6,506,497 B1 | 1/2003 | Kennedy et al. |
| 6,509,279 B2 | 1/2003 | Fujii et al. |
| 6,512,071 B1 | 1/2003 | Hacker et al. |
| 6,517,951 B2 | 2/2003 | Hacker et al. |
| 6,548,113 B1 | 4/2003 | Birnbaum et al. |
| 6,592,980 B1 | 7/2003 | MacDougall et al. |
| 6,596,404 B1 | 7/2003 | Albaugh et al. |
| 6,605,362 B2 | 8/2003 | Baldwin et al. |
| 6,607,991 B1 | 8/2003 | Livesay et al. |
| 6,617,609 B2 | 9/2003 | Kelley et al. |
| 6,649,534 B2 | 11/2003 | Fujii et al. |
| 6,664,199 B2 | 12/2003 | Fujii et al. |
| 6,674,106 B2 | 1/2004 | Tanaka et al. |
| 6,770,327 B2 | 8/2004 | Edelmann et al. |
| 6,780,498 B2 | 8/2004 | Nakata et al. |
| 6,818,289 B2 | 11/2004 | MacDougall et al. |
| 6,824,879 B2 | 11/2004 | Baldwin et al. |
| 6,846,568 B2 | 1/2005 | Yamaya et al. |
| 6,875,262 B1 | 4/2005 | Shibuya et al. |
| 6,891,237 B1 * | 5/2005 | Bao et al. ............. 257/410 |
| 6,896,955 B2 | 5/2005 | Mandal et al. |
| 6,902,771 B2 | 6/2005 | Shiota et al. |
| 6,914,114 B2 | 7/2005 | Baldwin et al. |
| 6,942,918 B2 | 9/2005 | MacDougall et al. |
| 6,956,097 B2 | 10/2005 | Kennedy et al. |
| 6,969,753 B2 | 11/2005 | Baldwin et al. |
| 7,011,889 B2 | 3/2006 | Bedwell et al. |
| 7,012,125 B2 | 3/2006 | Kennedy et al. |
| 7,026,053 B2 | 4/2006 | Shiota et al. |
| 7,109,519 B2 | 9/2006 | Gerlach |
| 7,119,354 B2 | 10/2006 | Yagihashi et al. |
| 7,128,976 B2 | 10/2006 | Hayashi et al. |
| 7,132,473 B2 | 11/2006 | Ogihara et al. |
| 7,135,064 B2 | 11/2006 | Shibuya et al. |
| 7,172,913 B2 | 2/2007 | Lee et al. |
| 7,173,371 B2 | 2/2007 | Pang et al. |
| 7,173,372 B2 | 2/2007 | Koo et al. |
| 7,176,493 B2 | 2/2007 | So et al. |
| 7,176,535 B2 | 2/2007 | Chae |
| 7,176,994 B2 | 2/2007 | Maeda et al. |
| 7,177,000 B2 | 2/2007 | Hu et al. |
| 7,179,673 B2 | 2/2007 | Song et al. |
| 7,180,090 B2 | 2/2007 | Chen et al. |
| 7,180,198 B2 | 2/2007 | Kim |
| 7,180,559 B2 | 2/2007 | Chang et al. |
| 7,180,563 B2 | 2/2007 | Kim |
| 7,180,565 B2 | 2/2007 | Hong et al. |
| 7,198,823 B2 | 4/2007 | Lee et al. |
| 7,202,013 B2 | 4/2007 | Ogihara et al. |
| 7,244,960 B2 | 7/2007 | Spreitzer et al. |
| 7,297,464 B2 | 11/2007 | Sakurai et al. |
| 2001/0024685 A1 | 9/2001 | Boulton et al. |
| 2002/0020327 A1 | 2/2002 | Hayashi et al. |
| 2002/0061453 A1 | 5/2002 | Sato et al. |
| 2002/0074625 A1 | 6/2002 | Wang et al. |
| 2002/0102396 A1 | 8/2002 | MacDougall |
| 2002/0169269 A1 | 11/2002 | Hwang et al. |
| 2002/0192981 A1 | 12/2002 | Fujii et al. |
| 2003/0091838 A1 | 5/2003 | Hayashi |
| 2003/0104225 A1 | 6/2003 | Shiota et al. |
| 2003/0157311 A1 | 8/2003 | MacDougall |
| 2003/0157340 A1 | 8/2003 | Shiota et al. |
| 2003/0193624 A1 | 10/2003 | Kobayashi et al. |
| 2003/0214042 A1 | 11/2003 | Miyazawa |
| 2003/0235785 A1 | 12/2003 | Barclay et al. |
| 2004/0028915 A1 | 2/2004 | Shibuya et al. |
| 2004/0087184 A1 | 5/2004 | Mandal et al. |
| 2004/0089238 A1 | 5/2004 | Birnbaum |
| 2004/0161698 A1 | 8/2004 | Kanagasabapathy et al. |
| 2004/0180011 A1 * | 9/2004 | Schlosser ............. 424/64 |
| 2004/0180223 A1 | 9/2004 | Shibuya et al. |
| 2004/0201007 A1 | 10/2004 | Yagihashi et al. |
| 2004/0219372 A1 | 11/2004 | Ogihara et al. |
| 2005/0003681 A1 | 1/2005 | Lyu |
| 2005/0058929 A1 | 3/2005 | Kennedy et al. |
| 2005/0064726 A1 | 3/2005 | Reid et al. |
| 2005/0090570 A1 | 4/2005 | Lyu |
| 2005/0092206 A1 | 5/2005 | Sakamoto |
| 2005/0096408 A1 | 5/2005 | Wakamura |
| 2005/0119394 A1 | 6/2005 | Sakurai |
| 2005/0136268 A1 | 6/2005 | Shin et al. |
| 2005/0171277 A1 | 8/2005 | Li et al. |
| 2005/0221225 A1 | 10/2005 | Kawana |
| 2005/0225238 A1 | 10/2005 | Yamazaki |
| 2005/0234167 A1 | 10/2005 | Bae et al. |
| 2005/0245717 A1 | 11/2005 | Kennedy et al. |
| 2005/0255326 A1 | 11/2005 | Sakurai et al. |

(56) References Cited

U.S. PATENT DOCUMENTS

| | | |
|---|---|---|
| 2006/0027803 A1 | 2/2006 | Lu et al. |
| 2006/0046079 A1 | 3/2006 | Lee et al. |
| 2006/0047034 A1 | 3/2006 | Sakurai |
| 2006/0052566 A1 | 3/2006 | Sakurai et al. |
| 2006/0132459 A1 | 6/2006 | Huddleston et al. |
| 2006/0134441 A1 | 6/2006 | Mah et al. |
| 2006/0141163 A1 | 6/2006 | Choi |
| 2006/0141641 A1 | 6/2006 | Fan et al. |
| 2006/0159938 A1 | 7/2006 | Lee et al. |
| 2006/0205236 A1 | 9/2006 | Li et al. |
| 2006/0264595 A1 | 11/2006 | Lyu |
| 2006/0289849 A1 | 12/2006 | Yagihashi et al. |
| 2007/0004587 A1 | 1/2007 | Chebiam et al. |
| 2007/0018926 A1 | 1/2007 | Shin et al. |
| 2007/0020899 A1 | 1/2007 | Hirai et al. |
| 2007/0021025 A1 | 1/2007 | Kim et al. |
| 2007/0022909 A1 | 2/2007 | Kennedy et al. |
| 2007/0023837 A1 | 2/2007 | Lee et al. |
| 2007/0023864 A1 | 2/2007 | Khater |
| 2007/0024181 A1 | 2/2007 | Oh |
| 2007/0024766 A1 | 2/2007 | Song et al. |
| 2007/0024770 A1 | 2/2007 | Jang |
| 2007/0024775 A1 | 2/2007 | Lee |
| 2007/0024783 A1 | 2/2007 | Joo |
| 2007/0024788 A1 | 2/2007 | Kamiya |
| 2007/0024790 A1 | 2/2007 | Chang |
| 2007/0026104 A1 | 2/2007 | Nakano |
| 2007/0029547 A1 | 2/2007 | Parker |
| 2007/0030407 A1 | 2/2007 | Kwak et al. |
| 2007/0030428 A1 | 2/2007 | Lu et al. |
| 2007/0030431 A1 | 2/2007 | Lee et al. |
| 2007/0030434 A1 | 2/2007 | Hirabayashi et al. |
| 2007/0030437 A1 | 2/2007 | Kim |
| 2007/0034879 A1 | 2/2007 | Park |
| 2007/0035225 A1 | 2/2007 | Lee et al. |
| 2007/0035673 A1 | 2/2007 | Sakurai et al. |
| 2007/0035675 A1 | 2/2007 | Um et al. |
| 2010/0267920 A1 | 10/2010 | Smith |

FOREIGN PATENT DOCUMENTS

| | | | |
|---|---|---|---|
| EP | 1142832 A1 | 4/2000 | |
| EP | 1674904 A | 6/2006 | |
| EP | 1829945 A1 | 9/2007 | |
| JP | 59109565 A | 6/1984 | |
| JP | 6158788 A | 3/1986 | |
| JP | 63-218948 | 9/1988 | |
| JP | 6056560 A | 3/1994 | |
| JP | 6095385 A | 4/1994 | |
| JP | 9183853 A | 7/1997 | |
| JP | 10502461 T | 3/1998 | |
| JP | 10161315 A | 6/1998 | |
| JP | 2001092122 A | 6/2001 | |
| JP | 2002-129103 | 5/2002 | |
| JP | 2002-235037 | 8/2002 | |
| JP | 2003-064306 | 3/2003 | |
| JP | 2003-064307 | 3/2003 | |
| JP | 2003-183575 | 7/2003 | |
| JP | 2003-253204 | 9/2003 | |
| JP | 2003-257963 | 9/2003 | |
| JP | 2004-277501 | 10/2004 | |
| JP | 2005-042118 | 2/2005 | |
| JP | 2005-048190 | 2/2005 | |
| JP | 2005-072615 | 3/2005 | |
| JP | 2005-099693 | 4/2005 | |
| JP | 2005-105281 | 4/2005 | |
| JP | 2005-105282 | 4/2005 | |
| JP | 2005-105283 | 4/2005 | |
| JP | 2005-105284 | 4/2005 | |
| JP | 2005-136429 | 5/2005 | |
| JP | 2005-139265 | 6/2005 | |
| JP | 2005-146282 | 6/2005 | |
| JP | 2006-045352 | 2/2006 | |
| JP | 2006-182811 | 7/2006 | |
| JP | 2006-183028 | 7/2006 | |
| JP | 2006-183029 | 7/2006 | |
| JP | 2006-213908 | 8/2006 | |
| JP | 2006-249181 | 9/2006 | |
| WO | 9600758 | 1/1996 | |
| WO | 00/41231 A1 | 7/2000 | |
| WO | 00/77575 A1 | 12/2000 | |
| WO | 0077575 A | 12/2000 | |
| WO | 01/29052 A1 | 4/2001 | |
| WO | 03/044600 A1 | 5/2003 | |
| WO | 03044077 A1 | 5/2003 | |
| WO | 03044078 A1 | 5/2003 | |
| WO | 03/089992 A1 | 10/2003 | |
| WO | 2005/037907 A1 | 4/2005 | |
| WO | 2005036270 A1 | 4/2005 | |

OTHER PUBLICATIONS

Pigment Green 7, 15832-14-5, Chemical Book obtained from Google search the page is http://www.chemicalbook.com/ChemicalProductProperty_EN_CB399460.htm and was downloaded on Feb. 20, 2014, 3 pages.

Xu et al, "Absorption and Exciton Emission by an Aggregated Cyanine Dye Occluded within Mesoporous SBA-15", J. Phys. Chem. B, vol. 106, 2002, pp. 1991-1994, published on line Jan. 29, 2002.

* cited by examiner

FIG. 13A

*TABLE 1*
showing the weight loss (measured by TGA)
of film cured at 230°C and 300°C

| Cure temperature, °C | Weight loss, % | | | |
|---|---|---|---|---|
| | after ramp | After Isothermal TGA (i-TGA) | | |
| | | 1hr | 2hrs | 3hrs |
| 230 | 0.07 | 0.08 | 0.12 | 0.15 |
| 300 | 0.13 | 0.12 | 0.19 | 0.25 |

FIG. 15A

*TABLE 2*
showing the OTFT device parameters with the
contemplated material or thermal oxide as
gate dielectric

| Gate dielectric | Annealing conditions | device width/ length W/L in μm/μm | Threshold voltage Vth (v) | Mobility, μ (cm2/V/s) | Off current Ioff (min) (A) | On current Ion (max) (A) | Ion / Ioff |
|---|---|---|---|---|---|---|---|
| HON material | 110°C/30min | 20/10 | -1.179 | 0.012 | 4.49E-11 | 2.42E-07 | 5.39+03 |
| | 120°C/30min | 20/10 | -1.208 | 0.015 | 1.61E-12 | 2.33E-07 | 1.45E+05 |
| Thermal oxide | 110°C/30min | 20/10 | -1.799 | 0.005 | 2.80E-10 | 1.63E-07 | 5.84E+02 |
| | 120°C/30min | 20/10 | -4.013 | 0.005 | 2.32E-10 | 1.56E-07 | 6.70E+02 |

Table 13

| | RI | % methyl | %phenyl | % methyl | %phenyl | |
|---|---|---|---|---|---|---|
| GR950F | 1.56 | 0 | 1 | 0% | 100% | ← PTSE |
| GR908F | 1.553 | 0.05 | 0.95 | 5% | 95% | |
| | 1.546 | 0.1 | 0.9 | 10% | 90% | |
| | 1.539 | 0.15 | 0.85 | 15% | 85% | |
| | 1.532 | 0.2 | 0.8 | 20% | 80% | |
| | 1.525 | 0.25 | 0.75 | 25% | 75% | |
| | 1.518 | 0.3 | 0.7 | 30% | 70% | |
| GR150F | 1.511 | 0.35 | 0.65 | 35% | 65% | |
| | 1.504 | 0.4 | 0.6 | 40% | 60% | |
| | 1.497 | 0.45 | 0.55 | 45% | 55% | |
| GR100F | 1.49 | 0.5 | 0.5 | 50% | 50% | |

FIG. 19A

Table 14

| Material | Lot # | rpm | Bake (C/min) | Oven cure | Post Bake ||| Post Cure ||||
|---|---|---|---|---|---|---|---|---|---|---|---|
| | | | | | Thickn (A) | RI | %sig | Thickn (A) | RI | %sig | %sh r | Film Q. |
| 30% GR90BF | HB40847-48-4 | 1600 | 160/170 | 250C/60min | 10807 | 1.5411 | 0.19 | 10768 | 1.5375 | 0.22 | -0.4 | Good |
| 30% GR90BF | HB40847-48-4 | 1800 | 160/170 | 250C/60min | 10798 | 1.5412 | 0.35 | 10780 | 1.5375 | 0.35 | -0.4 | Good |
| 30% GR90BF | HB40847-48-4 | 1600 | 160/170 | 250C/60min | 10815 | 1.5411 | 0.17 | 10778 | 1.5375 | 0.19 | -0.3 | Good |
| 30% GR90BF | HB40847-48-4 | 1600 | 160/170 | 250C/60min | 10830 | 1.5410 | 0.20 | 10792 | 1.5375 | 0.21 | -0.4 | Good |
| 30% GR150F | HB40847-48-5 | 1600 | 160/170 | 250C/60min | 11149 | 1.5077 | 0.22 | 11148 | 1.5014 | 0.23 | 0.0 | Good |
| 30% GR150F | HB40847-48-5 | 1800 | 160/170 | 250C/60min | 11149 | 1.5076 | 0.20 | 11147 | 1.5015 | 0.16 | 0.0 | Good |
| 30% GR150F | HB40847-48-5 | 1600 | 160/170 | 250C/60min | 11152 | 1.5077 | 0.18 | 11152 | 1.5015 | 0.17 | 0.0 | Good |
| 30% GR150F | HB40847-48-5 | 1600 | 160/170 | 250C/60min | 11143 | 1.5079 | 0.13 | 11150 | 1.5015 | 0.18 | 0.1 | Good |

FIG. 19B

Table 15

| Lot # | Description | Pre etch thickness | | Post straight 6 min etch at 70C | | Comment |
|---|---|---|---|---|---|---|
| | | Thickness (A) | RI | Thicknes (A) | RI | |
| HB40847-48-4 | 30%GR90BF | 11110 | 1.5275 | 10512 | 1.5182 | It etches ~500A for 6min |
| HB40847-48-5 | 30%GR150F | 11525 | 1.4916 | 11522 | 1.4965 | It doesn't etch after 6min |
| HB40847-48-6 | 30%GR100F | 11590 | 1.4704 | 11584 | 1.4733 | It doesn't etch after 6min |

FIG. 19C

Table 16

| Lot # | Description | Pre etch thickness | | Post 3min etch at 70C | | Post additional 3min etch at 70C | | Etch rate (A/min) | Total Etch (6min) |
|---|---|---|---|---|---|---|---|---|---|
| | | Thickn (A) | RI | Thickn (A) | RI | Thickn (A) | RI | | |
| HB40847-50-1 | GR908F + 5% AO-C | 11542 | 1.5285 | 11678 | 1.5230 | 11684 | 1.5200 | -24 | -142 |
| HB40847-50-2 | GR908F + 5% GR100F | 11140 | 1.5258 | 11275 | 1.5168 | 11032 | 1.5242 | 18 | 108 |
| HB40847-50-3 | GR908F + 5% GR150F | 11191 | 1.5292 | 11257 | 1.5218 | 10849 | 1.5241 | 57 | 342 |
| HB40847-50-4 | GR908F+ 2.5% GR150F | 11085 | 1.5304 | 11127 | 1.5235 | 10710 | 1.5275 | 63 | 375 |
| HB40847-50-5 | GR908F +1% GR150F | 11155 | 1.5255 | 11108 | 1.5280 | 10620 | 1.5272 | 89 | 535 |

FIG. 19D

Table 17

| Lot # | Material | Oven Cure | K (Hg-probe) | FBD (MV/cm) | FBD @1um/cm2 | J @ 2MV/cm (A/cm2) |
|---|---|---|---|---|---|---|
| 30% GR908F | HB40848-4 | 250C/60min | 3.17 | 7.16 | 5.76 | 6.07E-08 |
| 30% GR908F | HB40848-4 | 250C/60min | 3.18 | 7.77 | 6.12 | 6.85E-08 |
| 30% GR150F | HB40848-5 | 250C/60min | 3.34 | 5.27 | 3.66 | 6.31E-08 |
| 30% GR150F | HB40848-5 | 250C/60min | 3.33 | 5.20 | 4.18 | 5.24E-08 |

FIG. 19E

| MASS # | SYMBOL |
|---|---|
| 18 | H2O |
| 28 | CO+, Si+, C2H4 |
| 43 | CH2=SiH+ |
| 44 | CO2+, C2H4O, C3H8 |
| 57 | C2H5Si+, (CH2-SiH+-CH2), C4H9+, C3H5O+ |
| 78 | C6H6+ |
| 91 | C7H7+, C6H5+ |

- AN INCREASED OUT-GASSING ABOVE 135°C DURING RAMP UP.
- OUT-GASSING OF ALL SPECIES DIMINISHING DURING ISOTHERMAL HOLDING AT 250°C (FOR 30MIN).

Table 18

| Properties | Color filter overcoat | TFT passivation / ILD | TFT gate dielectric | Substrate planarization |
|---|---|---|---|---|
| Thermal Budget | < 230°C / 30 min to 1 hr (oven cure is preferred) | ~ 400°C (LTPS) ~ 350°C (a-Si) < 200°C (org SC) | < 250°C | ~ 400°C ~ 200°C (for laminated SS/plastic substrates) |
| Film Thickness | > 1.5μm | > 1.5μm up to 2.5μm | 2kÅ to 4Å | > 2μm |
| Transmittance | > 95% | > 95% | > 95% | For SS: no need For plastic > 95% |
| Planarization | > 98% | > 98% | > 95% | > 98% |
| Chemical plasma resistance | Oxalic acid, ST106, HCl, KOH | ST106, O$_2$ plasma resistance, TMAH, KOH | Not required | Not required |
| Hardness | >4H (i.e. should not be scratched by 4H pencil) | > 4H | Not applicable | Not a concern |
| Adhesion | Al, Cr, ITO, SiN, organic resist | Al, Cr, ITO, SiN, polyimide | Mo, Cr, Cr, SiN, organic material | Plastic, stainless steel, SiN, Al, Cr, Mo |
| Outgassing | Low (< 10$^{-8}$ torr) at process conditions | Low (< 10$^{-8}$ torr) at process conditions | Low (< 10$^{-8}$ torr) at process conditions | Low (< 10$^{-8}$ torr) at process conditions |
| Moisture uptake / O$_2$ diffusion | Must be resistant to moisture diffusion / absorption | Low moisture uptake | Low | Moisture absorption / diffusion should be low |
| Dispense tool | Spin or slot die coaters | Spin or slot die coaters | Spin or slot die coaters | Spin or slot die coaters |
| HON offerings | POC-R and POC-G | PTS-E and PTS-R | PTS-E and PTS-R | PTS-R |

FIG. 23A

Table 19

| Properties | PTS-E | PTS-G | PTS-R |
|---|---|---|---|
| Thermal Budget | Cures above 230°C | Cures above 230°C | Cures above 230°C |
| Film Thickness | Single coat → 1µm to 1.5µm | Single coat → up to 3.5µm | Single coat → up to 3.5µm |
| Transmittance | 98% (400 – 700nm) similar to glass | 98% (400 – 700nm) – similar to glass | 98% (400 – 700nm) – similar to glass |
| Outgas | 0.02% (1hr hold at 200°C) | 0.02% (1hr hold at 200°C) | 0.02% (1hr hold at 200°C) |
| Dielectric Constant | 3.1 | 3.1 | 3.1 |
| Field to breakdown | 4.0 MV/cm (at 1 µA) | 4.2 MV/cm (at 1 µA) | 4.2 MV/cm (at 1 µA) |
| Leakage at 2MV/cm | 8x10⁻⁴ A/cm² | 2 to 3 x10⁻⁴ A/cm² | 2 to 3 x10⁻⁴ A/cm² |
| Queue Time | Stable – no moisture absorption | Stable – no moisture absorption | Stable – no moisture absorption |
| Slot die coating | Yes | Yes | Yes |
| Chemical Resistance | Resistant to HF (not resistant to PR strippers such as PRS2000 and NMP) | Resistant to HF and other stripping chemistries | Resistant to HF and other stripping chemistries |
| Adhesion (Al, Cr, Mo, SiN, organic materials) | Passes 3M scotch tape test | Passes 3M scotch tape test | Passes 3M scotch tape test |
| Film quality | No defects | No defects | No defects |
| O₂ Plasma resistance | Resistant. Only the surface becomes hydrophilic | Resistant. Only the surface becomes hydrophilic | Resistant. Only the surface becomes hydrophilic |

Color coding: Does not meet; to be determined; meets requirements

FIG. 23B

Table 20

| Material | bake (C/1min) | Cure (°C) | Post-bake | | | Post-cure | | | Shrinkage |
|---|---|---|---|---|---|---|---|---|---|
| | | | Thickness (Å) | RI (670nm) | % std. dev. | Thickness (Å) | RI (670nm) | % std. dev. | |
| PTS-E-8 | 160/200/230 | 230/1hr | 10418 | 1.5548 | 0.1 | 10364 | 1.5543 | 0.1 | -0.5 |
| PTS-E-8 | 160/200/230 | 230/1hr | 10404 | 1.5555 | 0.1 | 10350 | 1.5542 | 0.1 | -0.5 |
| PTS-R-8 | 160/170 | 230/1hr | 14402 | 1.5036 | 0.39 | 14411 | 1.4994 | 0.39 | 0.1 |
| PTS-R-8 | 160/170 | 230/1hr | 14369 | 1.5034 | 0.25 | 14398 | 1.4995 | 0.25 | 0.1 |
| PTS-G-6 | 80/2min | 230/30min | 13955 | 1.5449 | 0.28 | 13624 | 1.5356 | 0.27 | -2.4 |
| PTS-G-6 | 80/2min | 230/30min | 14002 | 1.5448 | 0.36 | 13666 | 1.5356 | 0.33 | -2.4 |
| PTS-G-9 | 80/2min | 230/30min | 34690 | 1.5457 | 0.25 | 34092 | 1.5362 | 0.23 | -2.5 |
| PTS-G-9 | 80/2min | 230/30min | 34961 | 1.5459 | 0.25 | 34109 | 1.5362 | 0.23 | -2.4 |

- Thickness uniformity on 8" is very good (~ 0.4% max)
- The bake to cure film shrinkage is < 2%

FIG. 23C

| FILM | RI |
|---|---|
| GLASS | 1.502 |
| PTSE | 1.5549 |
| PTS-G | 1.5449 |
| PTS-R | 1.5036 |

Table 21

| Material | Thickness (Å) | Cure temperature/time | Wavelength (nm) | Refractive index (n) | Absorption coefficient (k) |
|---|---|---|---|---|---|
| PTS-G-6 | 13664 | 230°C/30min | 380 | 1.5806 | 0.0 |
| | | | 400 | 1.5792 | 0.0 |
| | | | 500 | 1.5560 | 0.0 |
| | | | 600 | 1.5438 | 0.0 |
| | | | 700 | 1.5362 | 0.0 |
| | | | 780 | 1.5264 | 0.0 |
| PTS-R-6 | 14663 | 250°C/60min | 380 | 1.5386 | 0.0 |
| | | | 400 | 1.5382 | 0.0 |
| | | | 500 | 1.5180 | 0.0 |
| | | | 600 | 1.5071 | 0.0 |
| | | | 700 | 1.5002 | 0.0 |
| | | | 780 | 1.4916 | 0.0 |
| PTS-E-5 | 9124 | 250°C/60min | 380 | 1.6027 | 0.0 |
| | | | 400 | 1.5995 | 0.0 |
| | | | 500 | 1.5758 | 0.0 |
| | | | 600 | 1.5635 | 0.0 |
| | | | 700 | 1.5561 | 0.0 |
| | | | 780 | 1.5455 | 0.0 |

* The material does not absorb light in the visible region

FIG. 25A

Table 22

| Material | Dielectric constant (k) | % std. dev. | Field at 1µA - FBD* (MV/cm) | % sig | Field at 1µA/cm² -FBD(j) - (MV/cm) | % std. dev. | J at 2MV/cm (A/cm²) |
|---|---|---|---|---|---|---|---|
| PTS-E | 3.09 | 0.3 | 4.50 | 4.9 | 3.36 | 7.1 | 8.90E-08 |
| | 3.08 | 0.4 | 4.39 | 4.2 | 3.50 | 3.1 | 7.06E-08 |
| PTS-G | 3.29 | 0.3 | 4.96 | 1.8 | 3.85 | 4.4 | 6.78E-8 |
| | 3.30 | 0.5 | 5.00 | 2.0 | 4.16 | 1.9 | 5.54E-8 |
| PTS-R | 3.3 | 0.4 | 4.79 | 3.2 | 4.11 | 5.5 | 2.49E-8 |
| | 3.31 | 0.3 | 4.70 | 4.5 | 4.28 | 4.5 | 2.37E-8 |

MIS capacitor configuration – measured using mercury probe at 100kHz

- FBD: field to breakdown expressed at fixed current;
- FBD(j): field to breakdown expressed at fixed current density;
- J: current density

FIG. 25B

Table 23

| Material | Before Exposure to moisture | | | After exposure to moisture | | | |
|---|---|---|---|---|---|---|---|
| | Dielectric constant (Hg- probe) | FBD (MV/cm) | FBD (i) 1µA/cm² | J at 2MV/cm (A/cm²) | K (Hg- probe) | FBD (MV/cm) | FBD at 1µA/cm² | J at 2MV/cm (A/cm²) |
| PTS-E-6 | 3.22 | 4.50 | 3.36 | 7.93E-08 | 3.19 | 4.3 | 3.40 | 8.36E-08 |
| PTS-G-6 | 3.30 | 5.00 | 4.16 | 5.54E-08 | 3.29 | 5.07 | 4.01 | 5.87E-08 |
| PTS-R-6 | 3.24 | 5.31 | 4.34 | 2.07E-08 | 3.26 | 5.21 | 4.44 | 2.27E-08 |

FIG. 25C

Table 24

| Material | rpm | Post-bake | | | Post-cure | | | % shrinkage |
|---|---|---|---|---|---|---|---|---|
| | | Thickness (Å) | RI | % std. dev. | Thickness (Å) | RI | % std. dev. | |
| PTS-E-9 | 1000 | 32603 | 1.5533 | 0.53 | 32456 | 1.5526 | 0.47 | -0.4 |
| | 1500 | 26470 | 1.5529 | 0.81 | 26716 | 1.5522 | 0.80 | 0.9 |
| | 2000 | 23107 | 1.5524 | 0.63 | 23090 | 1.5517 | 0.46 | -0.1 |
| PTS-G-9 | 1000 | 34599 | 1.5380 | 0.37 | 34511 | 1.5366 | 0.35 | -0.3 |
| | 1500 | 28274 | 1.5376 | 0.10 | 28198 | 1.5365 | 0.12 | -0.3 |
| | 2000 | 24523 | 1.5367 | 0.12 | 24450 | 1.5359 | 0.14 | -0.3 |
| PTS-R-9 | 1000 | 35859 | 1.5029 | 0.42 | 35807 | 1.5002 | 0.45 | -0.1 |
| | 1500 | 29328 | 1.5015 | 0.22 | 29287 | 1.4994 | 0.23 | -0.1 |
| | 2000 | 25392 | 1.5019 | 0.16 | 25363 | 1.4996 | 0.16 | -0.1 |

FIG. 25D

Table 25

| Material | Weight average molecular weight $M_w$ | | Number average molecular weight $M_n$ | | Polydispersity | |
|---|---|---|---|---|---|---|
| | 0 Days | 7 Days | 0 Days | 7 Days | 0 Days | 7 Days |
| PTS-E-9 | 1290 | 1295 | 1041 | 1036 | 1.24 | 1.25 |
| PTS-G-9 | 1766 | 1740 | 1204 | 1068 | 1.47 | 1.63 |
| PTS-R-9 | 2709 | 2639 | 1428 | 1403 | 1.90 | 1.88 |

FIG. 25E

Table 26

| Lot # | Material | rpm | bake (C/1min each) | Furnace Cure | Post Bake | | | Post Oven Cure | | | |
|---|---|---|---|---|---|---|---|---|---|---|---|
| | | | | | Thickn (A) | RI | % sig | Thickn (A) | RI | % sig | % exp |
| 40854-22-1 | PTS-T-6 | 1000 | 160/170 | 250/60min | 14426 | 1.4172 | 0.20 | 14691 | 1.3931 | 0.53 | 1.8 |
| 40854-22-1 | PTS-T-6 | 1000 | 160/170 | 250/60min | 14432 | 1.4182 | 0.42 | 14685 | 1.3930 | 0.33 | 1.4 |
| 40854-22-1 | PTS-T-6 | 1000 | 160/170 | 250/60min | 14463 | 1.4183 | 0.30 | 14681 | 1.3928 | 0.43 | 1.5 |
| 40854-22-1 | PTS-T-6 | 1000 | 160/170 | 250/60min | 14489 | 1.4194 | 0.78 | 14744 | 1.3927 | 0.24 | 1.8 |
| 40854-22-1 | PTS-T-6 | 1000 | 160/170 | 250/60min | 14499 | 1.4185 | 0.88 | 14729 | 1.3929 | 0.10 | 1.6 |

FIG. 25F

Table 27

| Material | Oven cure | pre-etch-Thickness | | Etch time (min) | post-etch-Thickness | | Etch Rate (Å/min) |
|---|---|---|---|---|---|---|---|
| | | Thickn (Å) | RI | | Thickn (Å) | RI | |
| PTS-T-6 | 250/60min | 14763 | 1.3764 | 3 | 15219 | 1.3718 | -152 |
| | | 15021 | 1.3655 | 6 | 14984 | 1.3725 | 6 |
| | | 15026 | 1.3656 | 9 | 14916 | 1.3772 | 12 |
| | | 14919 | 1.3724 | 30 | 15131 | 1.3689 | -7 |

FIG. 25G

Table 28 A

| Lot # | Material | Furnace cure | K (Hg-probe) | FBD (MV/cm) | FBD @1um/cm2 | J @ 2MV/cm (A/cm2) |
|---|---|---|---|---|---|---|
| 40854-22-1 | PTS-T-6 | 250/60min | 3.40 | 1.94 | 1.11 | 5.52E-08 |
| 40854-22-1 | PTS-T-6 | 250/60min | 3.36 | 2.18 | 1.01 | 6.38E-08 |

FIG. 25H

Table 28 B

| Lot # | Material | Days at room temp | Furnace Cure | Post Bake | | | Post Oven Cure | | | | |
|---|---|---|---|---|---|---|---|---|---|---|---|
| | | | | Thicken (A) | RI | % sig | Thicken (A) | RI | % sig | %Exp | Film Quality |
| 40854-22-1 | PTS-T-6 | 0 days | 250/60min | 14428 | 1.4172 | 0.20 | 14691 | 1.3931 | 0.53 | 1.8 | OK |
| 40854-22-1 | PTS-T-6 | 0 days | 250/60min | 14482 | 1.4182 | 0.42 | 14685 | 1.3930 | 0.33 | 1.4 | OK |

| Lot # | Material | Days at room temp | Furnace Cure | Post Bake | | | Post Oven Cure | | | | |
|---|---|---|---|---|---|---|---|---|---|---|---|
| | | | | Thicken (A) | RI | % sig | Thicken (A) | RI | % sig | %Exp | Film Quality |
| 40854-22-1 | PTS-T-6 | 5 days | 250/60min | 14514 | 1.4175 | 0.70 | 14739 | 1.3918 | 0.59 | 1.6 | OK |
| 40854-22-1 | PTS-T-6 | 5 days | 250/60min | 14587 | 1.4202 | 0.78 | 14746 | 1.3919 | 0.35 | 1.1 | OK |

FIG. 28A

Table 29

| Material | Shelf Life Time (at RT) | Mw | Mn | PDI |
|---|---|---|---|---|
| PTS-T-6 | 0 days | 9308 | 2085 | 4.465 |
| PTS-T-6 | 3 days | 9302 | 2016 | 4.613 |
| PTS-T-6 | 8 days | 9410 | 2057 | 4.574 |

FIG. 28B

COMPOSITIONS, LAYERS AND FILMS FOR OPTOELECTRONIC DEVICES, METHODS OF PRODUCTION AND USES THEREOF

This utility application is a continuation-in-part of U.S. patent application Ser. No. 11/784,966 filed on Apr. 10, 2007, which is a continuation-in-part of U.S. patent application Ser. No. 11/192,352 filed on Jul. 29, 2005 and issued as U.S. Pat. No. 7,445,953 on Nov. 4, 2008, which is a continuation-in-part of U.S. patent application Ser. No. 10/910,673, which was filed on Aug. 3, 2004 and issued as U.S. Pat. No. 7,015,061 on Mar. 21, 2006. All of these applications are commonly-owned and incorporated by reference in their entirety.

FIELD OF THE SUBJECT MATTER

The field of the subject matter is compositions and films made from those compositions that are utilized in optoelectronic devices and applications. Methods of production of the compositions and films are also disclosed, along with methods of using same in the production of the optoelectronic devices and applications.

BACKGROUND

The production of display devices, such as electrooptic elements and thin film transistors, is known from U.S. Pat. No. 6,674,106, which is incorporated herein by reference. One of the challenges of producing optoelectronic and microelectronic devices and using them in various applications is the production of materials that can be utilized to serve several different functions, such as dielectric coatings, planarization films and layers, passivation layers, color filter planarizing overcoats for Liquid Crystal Displays (LCDs) and/or other displays, Organic Light-Emitting Diodes (OLED) moisture barrier coatings and adhesives, films and layers in flat panel displays and transistors.

U.S. Pat. No. 6,177,360 issued to Carter et al. ("Carter") discloses a process for making an integrated circuit device that comprises a substrate, a series of metallic circuit lines and a dielectric material positioned on the circuit lines. Although the dielectric material comprises the condensation product of silsesquioxane in the presence of a photosensitive or thermally sensitive base generator, it is not disclosed that this dielectric material can crossover into optoelectronic applications. It is also not clear from Carter that the dielectric materials contemplated should be transparent or light transmissive. Further, there is nothing in Carter to indicate that the dielectric materials can be modified with surfactants, crosslinking agents or adhesion promoters, which would be useful when working with a number of different types of materials, layers and substrates, as are often present in optoelectronic applications. Also, Carter is silent concerning characteristics relevant to some of the end uses herein, such as planarization, surface roughness or index of refraction and other end uses, such as those described herein.

To this end, it would be desirable to form and utilize a light transmissive composition that can satisfy one or more of the following: a) serve several different functions, including as a passivation layer, a color filters coating, an OLED moisture barrier coating and adhesive, and a film and/or layer in flat panel displays and transistors; b) adequately gap fill in narrow trenches and channels; c) be formed using conventional structural and solvent constituents; d) withstand incorporation of other composition-modifying constituents, such as surfactants, crosslinking agents, additives and adhesion promoters; e) planarize a surface or substrate to form a component that can be easily incorporated into an optoelectronic application; and/or f) be laid down in ultra-thin, thin and thicker films for multiple applications.

SUMMARY OF THE SUBJECT MATTER

Crosslinkable compositions are disclosed herein that comprise at least one silicon-based material comprising at least one alkyl group and at least one aryl or aromatic group, at least one catalyst, and at least one solvent.

BRIEF DESCRIPTION OF THE FIGURES

FIG. 13A shows Table 1, which shows the cumulative weight loss after ramp and after 1, 2 and 3 hours of holding at a cure temperature.

FIG. 15A shows Table 2, which shows the annealing conditions for the semiconductor of Example 5.

FIG. 19A shows Table 13, which shows contemplated compositions and their film properties.

FIG. 19B shows Table 14, which shows the processes for producing layers and then films of several of the contemplated compositions.

FIG. 19C shows Table 15, and FIG. 19D shows Table 16, which show the PRS 2000 resistance for a continuous six minute exposure at 70 C.

FIG. 19E shows Table 17, which shows a collection of electrical properties monitored for these compositions.

FIG. 23A shows Table 18, which shows a collection of required properties for display dielectrics.

FIG. 23B shows Table 19, which shows the comparison of the properties for each of the three contemplated materials reviewed for this example.

FIG. 23C shows Table 20, which shows physical properties of films produced using the contemplated materials on 8" wafers.

FIG. 25A shows Table 21, which shows the "n" and "k" measurements of the materials.

Electrical data was collected for these contemplated materials and is shown in Table 22, which is shown in FIG. 25B.

FIG. 25C shows Table 23, which shows moisture resistance data using a similar procedure as that in Example 6.

FIG. 25D shows Table 24, and FIG. 25E shows Table 25, which show shelf life data for the formulations described in Example 9.

FIG. 25F shows Table 26, which shows the processes for producing layers and then films of each of these compositions.

FIG. 25G shows Table 27, which shows the PRS 2000 resistance for a continuous exposure of at least 30 minutes at 70° C.

FIG. 25H shows Table 28A, which shows a collection of electrical properties monitored for these compositions.

Figure 26:
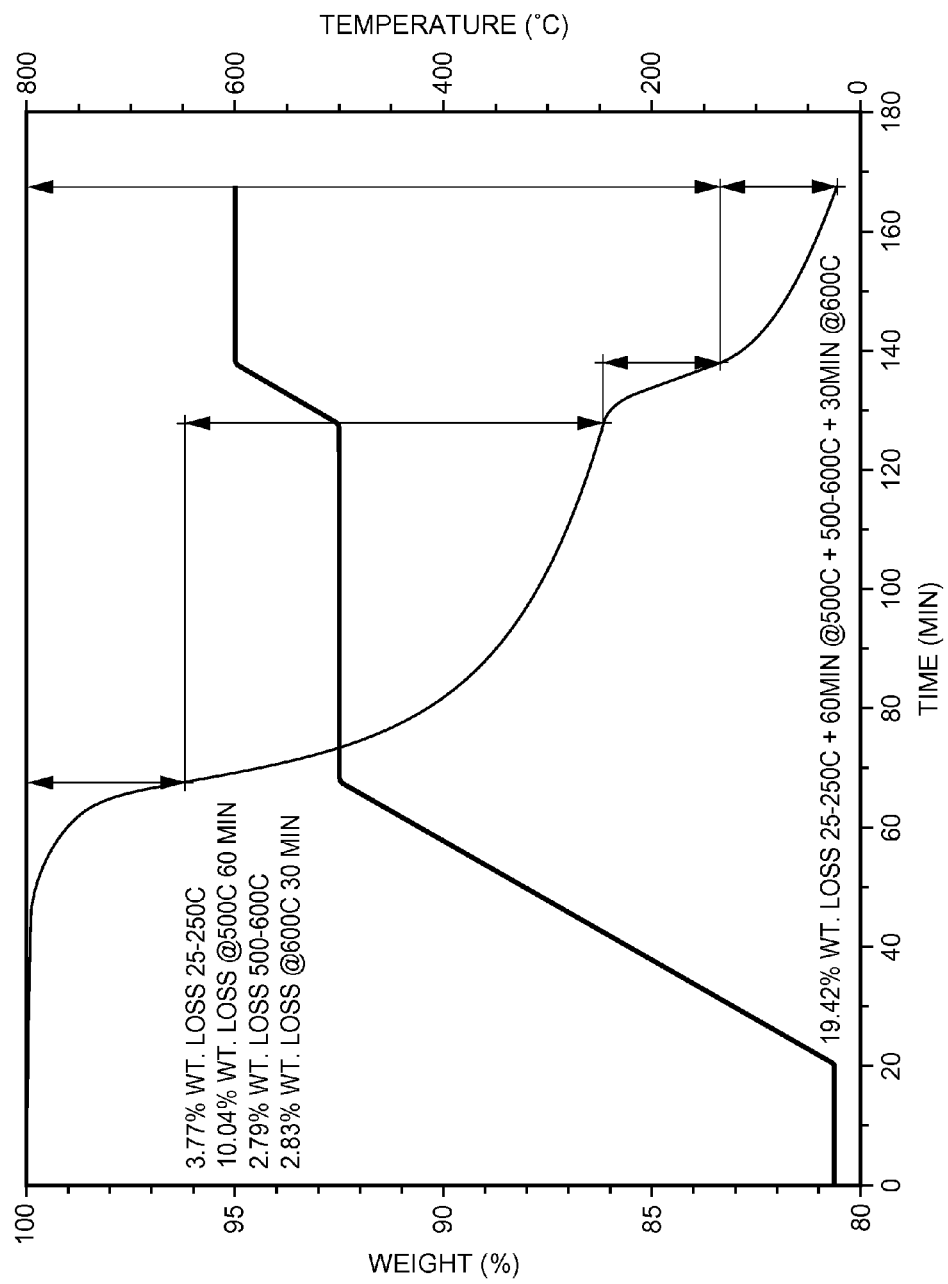
Figure 27:
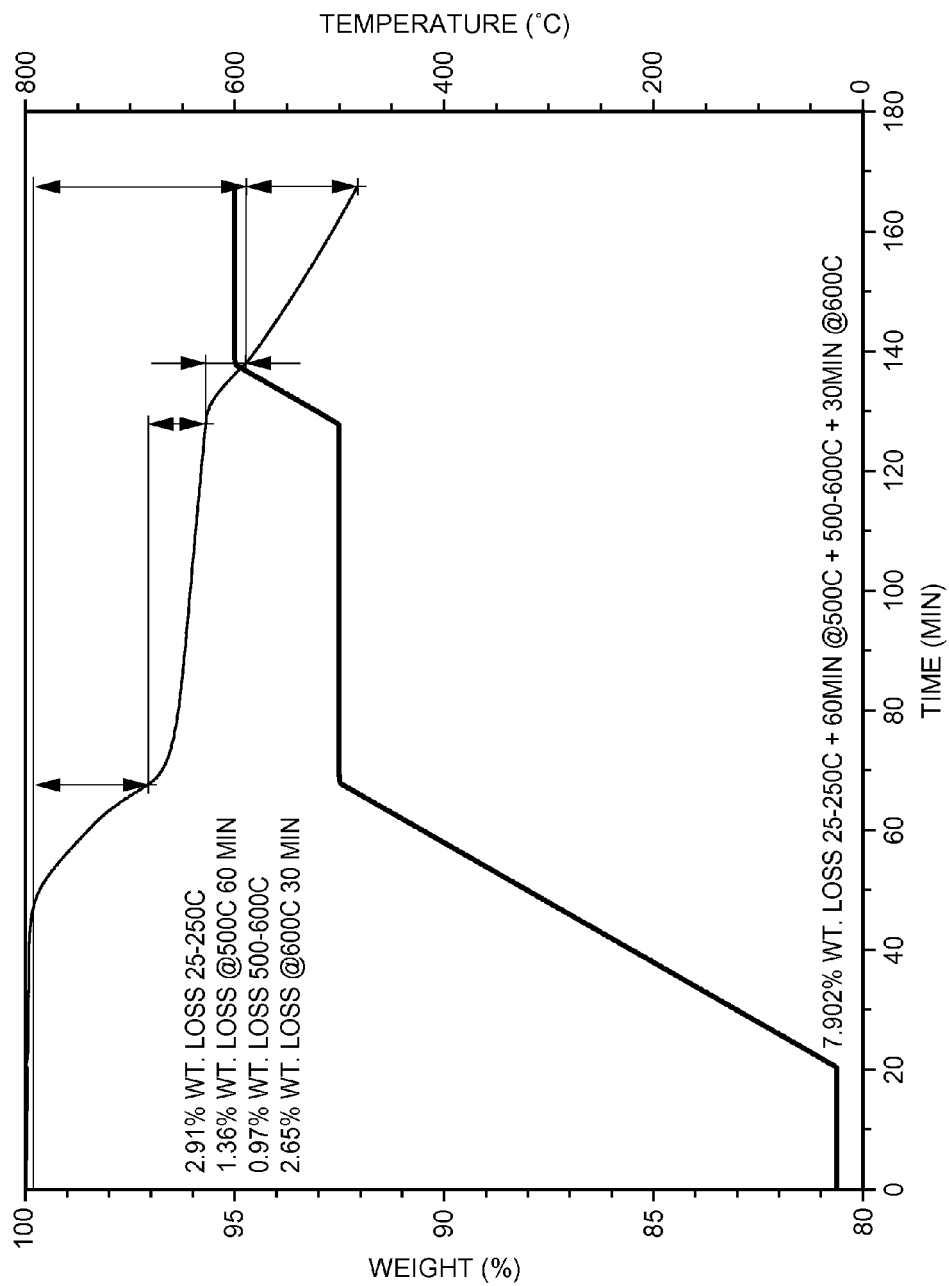

FIGS. 26 and 27 show the results of the TGA experiments, where FIG. 26 is a control composition comprising no surfactants and FIG. 27 shows the composition comprising surfactant.

Figure 28:
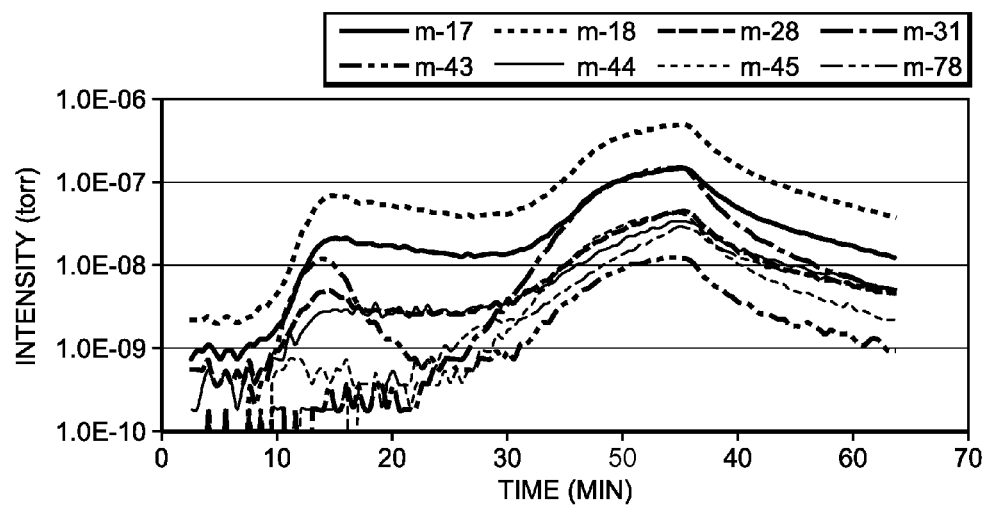
Figure 28:
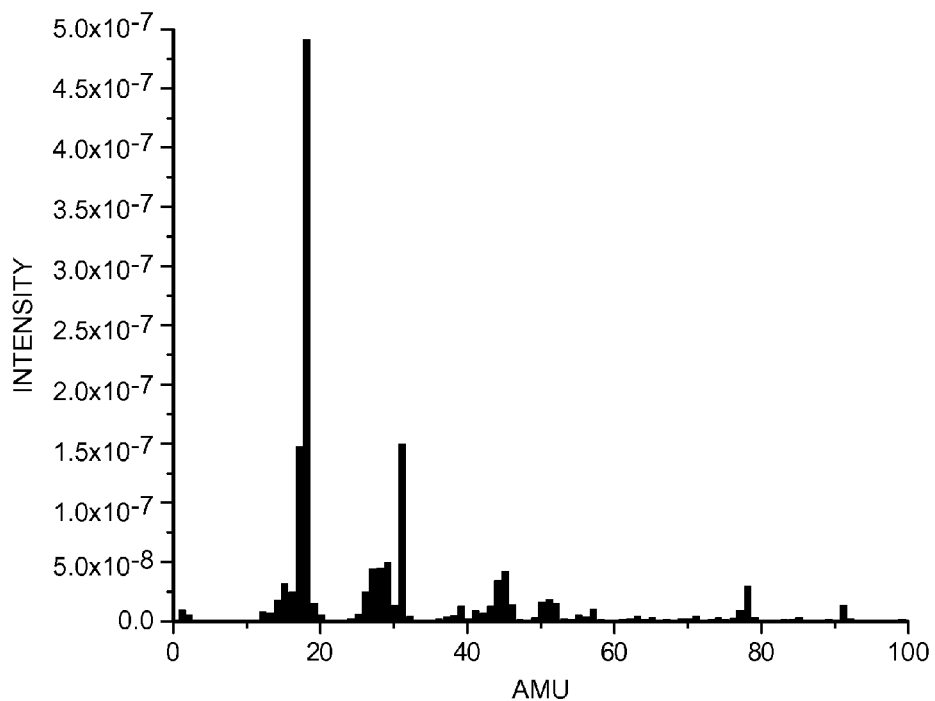
Figure 29:
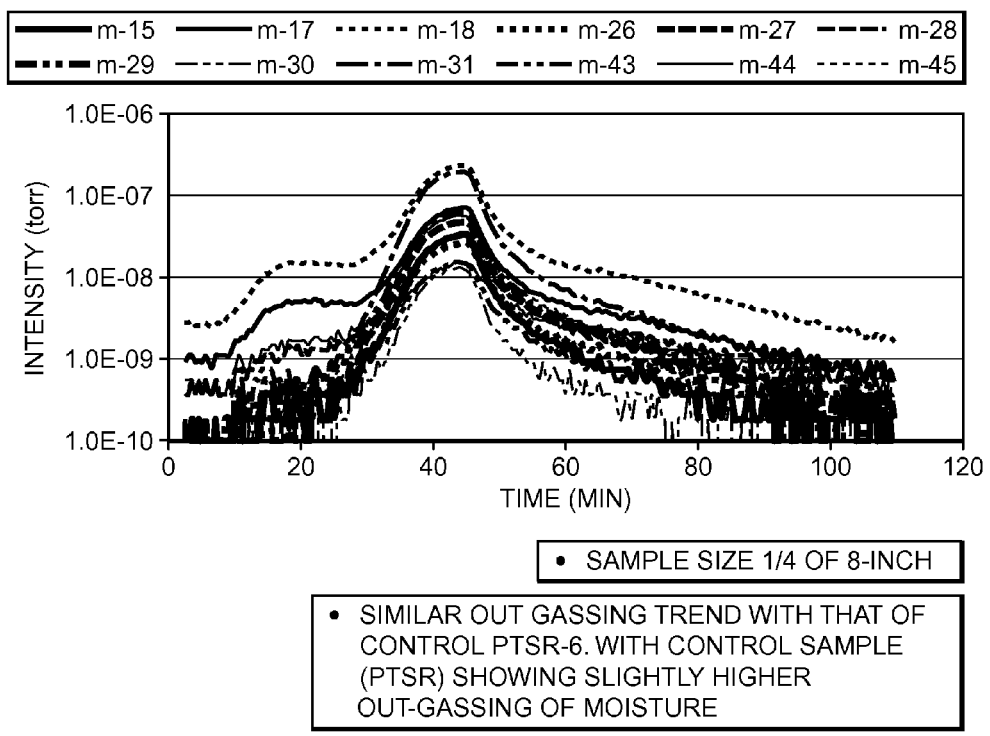
Figure 29:
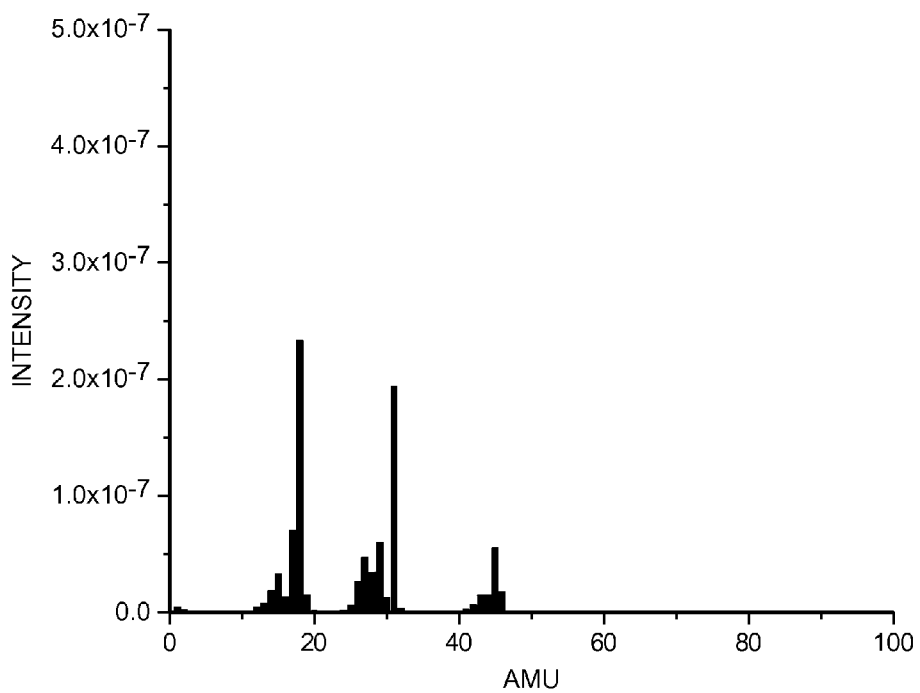

FIG. 28 shows the TDMS profile for the control, and FIG. 29 shows the TDMS profile for the surfactant-containing composition.\

FIG. 28A shows Table 28B, which shows a series of shelf-life studies for the surfactant-containing compositions.

FIG. 28B shows Table 29, which shows the GPC data that indicates molecular weight growth for these materials.

Figure 30:
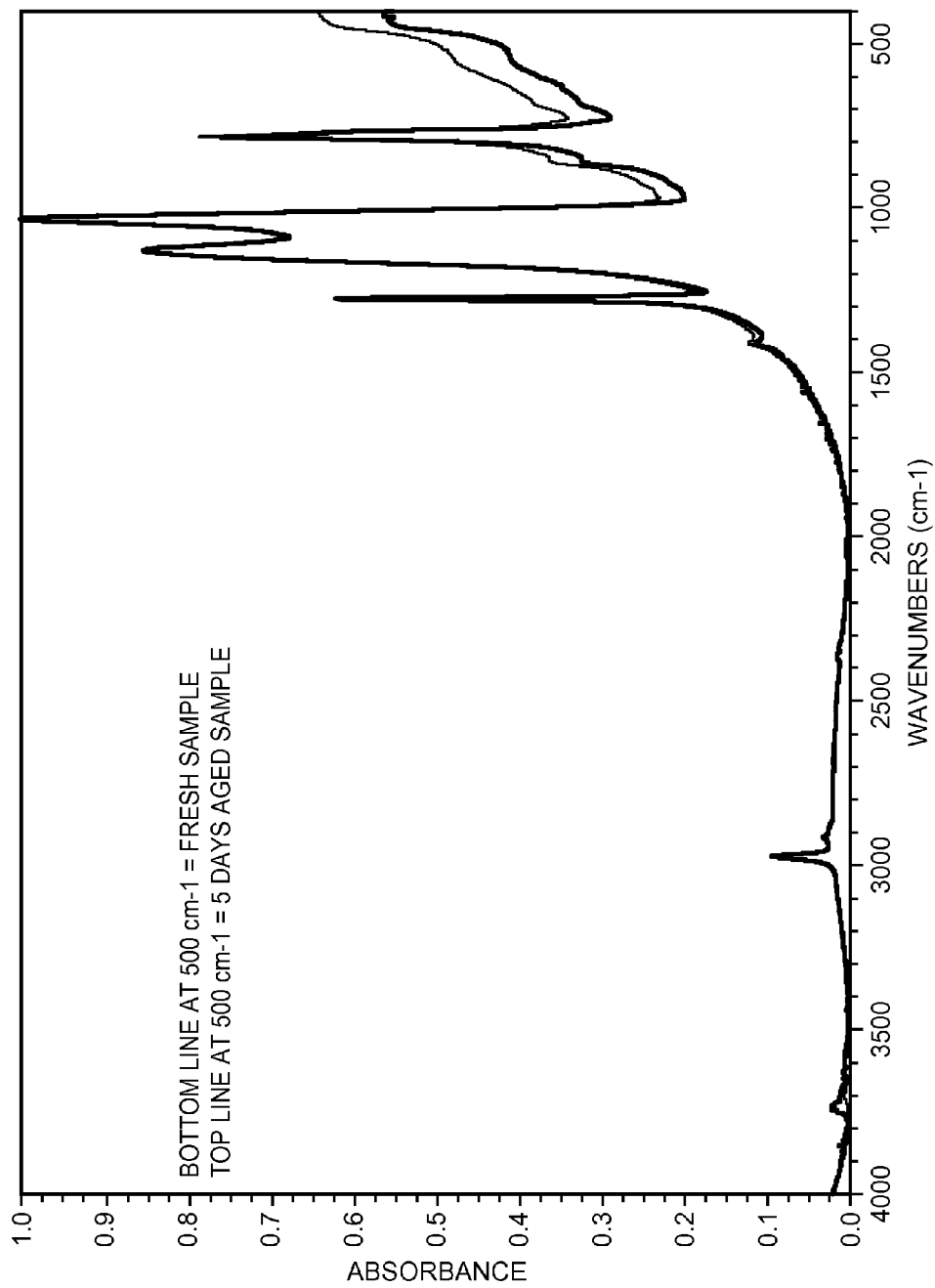

FIG. 30 shows FTIR data for several contemplated compositions.

DETAILED DESCRIPTION

In optical applications, organic materials that are being used as a part of the device are often unstable at higher temperature, are colored and have lower light transmittance (less than about 95%). Thus, there exists a need in the art for materials that are stable at high temperatures and provide crack-free and void-free gap-fill of narrow features at low process temperatures. It may also be useful in some cases for such materials to have adequate mechanical and chemical strength to withstand subtractive processes, such as enhanced $O_2$ plasma and wet etch processes.

Surprisingly, useful compositions have been developed and utilized in such a manner that can satisfy one or more of the following: a) serve several different functions, including as a passivation layer, a color filter planarizing overcoat, an OLED moisture barrier coating and adhesive, and a film and/or layer in flat panel displays and transistors; b) adequately gap fill in narrow trenches and channels; c) be formed using conventional structural and solvent constituents; d) withstand incorporation of other composition-modifying constituents, such as surfactants and adhesion promoters; e) planarize a surface or substrate to form a component that can be easily incorporated into an optoelectronic application; and/or f) be laid down in ultra-thin, thin and thicker films for multiple applications. To date, there has been no appreciation in the art that the compositions, films and layers described herein can be used in the manner described herein.

Contemplated crosslinkable compositions comprise at least one silicon-based compound, at least one catalyst, and at least one solvent. These compositions may also comprise at least one surfactant, at least one crosslinking agent, at least one adhesion promoter, at least one other additive or a combination thereof. Contemplated crosslinkable compositions are applied to suitable surfaces depending on the projected end-use of the coating, layer or film. The at least one catalyst is activated at a suitable point in the production of the layered material, device, film or display, thereby forming the light-transmissive film or layer.

Optoelectronic devices are also contemplated herein utilizing the above compositions to form a film, layer or coating as part of the device or apparatus. The optoelectronic device may comprise one or more light-transmissive films, coatings or layers, such as those described herein, and those light-transmissive films or layer may comprise the same chemical composition or one that is slightly different from another light-transmissive film or layer. In some embodiments, contemplated optoelectronic devices comprise a surface within the device, and at least one sufficiently light-transmissive crosslinked film, wherein the film is formed from at least one silicon-based material, at least one catalyst, and at least one solvent. Optoelectronic devices may also comprise a surface within the device, and at least one sufficiently light-transmissive crosslinkable composition, wherein the composition comprises at least one silicon-based material, at least one crosslinking agent and at least one solvent.

Contemplated optoelectronic devices comprise a transistor, a light-emitting diode, a color filter, a stainless steel or plastic surface, a photovoltaic cell, a flat panel display, x-ray detectors or a combination thereof. Contemplated devices comprise an active matrix thin film organic light emitting display, a passive matrix organic light emitting display, an active matrix thin film transistor liquid crystal display, an electrophoretic display or a combination thereof. Contemplated transistors comprise an amorphous silicon thin film transistor, a low temperature polysilicon transistor, an organic transistor, an organic field effect transistor, a static induction transistor, a crystalline silicon transistor or a combination thereof. In some embodiments, the light-transmissive film forms a passivation layer, a planarization layer or a combination thereof.

Crosslinkable Compositions

Silicon-Based Compounds

It is important to first understand the components that make up the crosslinkable compositions contemplated herein. These compositions comprise at least one silicon-based compound. Examples of silicon-based compounds comprise siloxane, silsesquioxane, polysiloxane, polysilsesquioxane, or silazane compounds, such as methylsiloxane, methylsilsesquioxane, phenylsiloxane, phenylsilsesquioxane, methylphenylsiloxane, methylphenylsilsesquioxane, silazane polymers, dimethylsiloxane, diphenylsiloxane, methylphenylsiloxane, polyphenylsilsesquioxane, polyphenylsiloxane, polymethylphenylsiloxane, polymethylphenylsilsesquioxane, polymethylsiloxane, polymethylsilsesquioxane, silicate polymers and combinations thereof. A contemplated silazane polymer is perhydrosilazane, which has a "transparent" polymer backbone. Contemplated compounds and materials are those that do not meaningfully absorb in the visible range, such as between 400 nm and 800 nm. In contemplated embodiments, the at least one silicon-based compound comprises polyphenylsilsesquioxane, polyphenylsiloxane, phenylsiloxane, phenylsilsesquioxane, methylphenylsiloxane, methylphenylsilsesquioxane, polymethylphenylsiloxane, polymethylphenylsilsesquioxane, polymethylsiloxane, polymethylsilsesquioxane or a combination thereof.

In some embodiments, contemplated silicon-based compounds comprise both alkyl and aryl constituents, such as methylphenylsilsesquioxane, methylphenylsiloxane, polymethylphenylsiloxane or polymethylphenylsilsesquioxane, wherein the alkyl concentration is varied between a low percentage and a higher percentage—depending on the application—where the total carbon in the compound is represented as the percent of carbon in each type of carbon-based entity. A "carbon-based entity" is understood to mean an alkyl group, an aryl group or an aromatic group. In the integrated "low alkyl-high aryl" case or LKHR ("K"=alkyl, "R"=aryl or aromatic) case, the percent of carbon represented as alkyl groups is less than about 20% compared with the percent of carbon represented as aryl groups, which is greater than about 80% of the total carbon in the compound. In some embodiments, the percent of carbon represented as alkyl groups may be less than about 10% compared with the percent of carbon represented as aryl groups, which is greater than about 90% of the total carbon in the compound. In the integrated "high alkyl-low aryl" case or HKLR case, the percent of carbon that is represented as alkyl groups is greater than about 20% compared with the percent of carbon that is represented as aryl groups, which is less than about 80% of the total carbon in the compound. In some embodiments, the percent of carbon that is represented as alkyl groups is greater than about 30% compared with the percent of carbon that is represented as aryl groups, which is less than about 70% of the total carbon in the compound. These compounds produce materials that have different overall properties, as compared with those silicon-based compounds that comprise alkyl only, aryl only or other substituents, as disclosed herein. For example, while an integrated LKHR-based material may be resistant to less aggressive photoresist strippers, an integrated HKLR-based material may be resistant to both less and more aggressive photoresist strippers. Several of the examples in the following Examples Section shows data collected for both the LKHR and HKLR materials, alone and in comparison with other materials disclosed herein.

As used herein, the term "integrated" means that the substituents are integrated onto one compound, such as the methylphenylsilsesquioxane. In other embodiments, compounds are "blended", wherein the substituents are found on different compounds, and the compounds are then blended or mixed to produce a material. An example of blending is to incorporate a methylsiloxane or methylsilsesquioxane with a phenylsiloxane or phenylsilsesquioxane. In the "blended" embodiments, one might have low and high percentages of alkyl or methyl groups and aryl or phenyl groups, as discussed earlier, but the properties of the material may be extremely different, since the substituents are included on different compounds and not the same compound.

Some contemplated silicon-based compounds include compositions formed from hydrolysis-condensation reactions of at least one reactant having the formula:

$$R^1_x Si(OR^2)_y,$$

where $R^1$ is an alkyl, alkenyl, aryl, or aralkyl group, and x is an integer between 0 and 2, and where $R^2$ is a alkyl group or acyl group and y is an integer between 0 and 2. Materials also contemplated include silsequioxane polymers of the general formula $(C_6H_5SiO_{1.5})_x$, where x is an integer greater than about 4.

Some contemplated silicon-based compounds include siloxane polymers, copolymers and blockpolymers, hydrogensiloxane polymers of the general formula $(H_{0-1.0}SiO_{1.5-2.0})_x$, hydrogensilsesquioxane polymers, which have the formula $(HSiO_{1.5})_x$, where x is greater than about four and derivatives of silicic acid and combinations thereof. Also included are copolymers of hydrogensilsesquioxane and an alkoxyhydridosiloxane or hydroxyhydridosiloxane. Materials contemplated herein additionally include organosiloxane polymers, acrylic siloxane polymers, silsesquioxane-based polymers, derivatives of silicic acid, organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl, and combinations thereof. Some useful organohydridosiloxane polymers have the sum of n and m from about four to about 5000 where R is a $C_1$-$C_{20}$ alkyl group or a $C_6$-$C_{12}$ aryl group. Some specific examples include alkylhydridosiloxanes, such as methylhydridosiloxanes, ethylhydridosiloxanes, propylhydridosiloxanes, t-butylhydridosiloxanes, phenylhydridosiloxanes; and alkylhydridosilsesquioxanes, such as methylhydridosilsesquioxanes, ethylhydridosilsesquioxanes, propylhydridosilsesquioxanes, t-butylhydridosilsequioxanes, phenylhydridosilsesquioxanes and combinations thereof.

In some contemplated embodiments, specific organohydridosiloxane resins utilized herein have the following general formulas:

| | |
|---|---|
| $[H—Si_{1.5}]_n[R—SiO_{1.5}]_m$ | Formula (1) |
| $[H_{0.5}—Si_{1.5-1.8}]_n[R_{0.5-1.0}—SiO_{1.5-1.8}]_m$ | Formula (2) |
| $[H_{0-1.0}—Si_{1.5}]_n[R—SiO_{1.5}]_m$ | Formula (3) |
| $[H—Si_{1.5}]_x[R—SiO_{1.5}]_y[SiO_2]_z$ | Formula (4) | wherein:
the sum of n and m, or the sum or x, y and z is from about 8 to about 5000; R is is selected from substituted and unsubstituted, normal and branched alkyls (methyl, ethyl, butyl, propyl, pentyl), alkenyl groups (vinyl, allyl, isopropenyl), cycloalkyls, cycloalkenyl groups, aryls (phenyl groups, benzyl groups, naphthalenyl groups, anthracenyl groups and phenanthrenyl groups), and mixtures thereof.

Some of the contemplated compounds and methods of producing those compounds previously mentioned are taught by commonly assigned U.S. Pat. No. 6,143,855 issued Nov. 17, 2000 and U.S. Pat. No. 7,011,889 issued Mar. 14, 2006 and organosilsesquioxanes taught by commonly assigned WO 01/29052 published Apr. 26, 2001. Other contemplated compounds are described in the following issued patents and pending applications, which are herein incorporated by reference in their entirety: WO 2000/077575 published Dec. 21, 2000; U.S. Pat. No. 6,268,457 issued Jul. 31, 2001; U.S. application Ser. No. 09/491,166 filed Jun. 10, 1999; U.S. Pat. No. 6,365,765 issued on Apr. 2, 2002; U.S. Pat. No. 6,268,457 issued on Jul. 31, 2001; U.S. Pat. No. 6,824,879 issued Nov. 20, 2004; WO 2000/041231 published Jul. 13, 2000; U.S. Pat. No. 6,177,199 issued Jan. 23, 2001; U.S. Pat. No. 6,358,559 issued Mar. 19, 2002; U.S. Pat. No. 6,218,020 issued Apr. 17, 2001; U.S. Pat. No. 6,361,820 issued Mar. 26, 2002; U.S. Pat. No. 6,218,497 issued Apr. 17, 2001; U.S. Pat. No. 6,359,099 issued Mar. 19, 2002; U.S. Pat. No. 6,143,855 issued Nov. 7, 2000; U.S. Pat. No. 6,512,071 issued Jan. 28, 2003; and U.S. Application Ser. No. 60/043,261). Silica compounds contemplated herein are those compounds found in U.S. Pat. Nos. 6,022,812; 6,037,275; 6,042,994; 6,048,804; 6,090,448; 6,126,733; 6,140,254; 6,204,202; 6,208,041; 6,318,124 and 6,319,855.

Catalysts

At least one catalyst may be added to the at least one silicon-based compound. In some embodiments, suitable catalysts are heat-activated catalysts. As used herein, the term "catalyst" means any substance that affects the rate of the chemical reaction by lowering the activation energy for the chemical reaction. In some cases, the catalyst will lower the activation energy of a chemical reaction without itself being consumed or undergoing a chemical change. These condensation catalysts are often only activated at a particular temperature, such as an elevated temperature. Thus, at one temperature (such as room temperature) the composition maintains a low molecular weight, thus enabling good planarization ability over a surface. When the temperature is elevated (such as to greater than 50° C.), the condensation catalyst catalyzes an Si—OH condensation reaction, which results in a more dense structure and, in some cases, improved performance overall. Contemplated condensation catalysts comprise those catalysts that can aid in maintaining a stable silicate solution. Contemplated metal-ion-free catalysts may comprise onium compounds and nucleophiles. The catalyst may be, for example an ammonium compound (such as quaternary ammonium salts), an amine, a phosphonium compound or a phosphine compound.

In some embodiments, contemplated catalysts include those catalysts that are relatively molecularly "small" or that produce relatively small cations, such as quaternary ammonium salts. In some embodiments, contemplated catalysts include tetramethylammonium acetate (TMAA), tetramethylammonium hydroxide (TMAH), tetrabutylammonium acetate (TBAA), cetyltrimethylammonium acetate (CTAA), tetramethylammonium nitrate (TMAN), other ammonium-based catalysts, amine-based and/or amine-generating catalysts and combinations thereof. Other appropriate catalysts include (2-hydroxyethyl)trimethylammonium chloride, (2-hydroxyethyl)trimethylammonium hydroxide, (2-hydroxyethyl)trimethylammonium acetate, (2-hydroxyethyl)trimethylammonium formate, (2-hydroxyethyl)trimethylammonium nitrate, (2-hydroxyethyl)trimethylammonium benzoate, tetramethylammonium formate and combinations thereof. In some contemplated embodiments, TMAN is used and can be obtained by either dissolving TMAN in water or by converting TMAA or TMAH to TMAN by using nitric acid.

Other suitable catalysts include (carboxymethyl)trimethylammonium chloride, (carboxymethyl)trimethylammonium hydroxide, (carboxymethyl)trimethylammonium formate and (carboxymethyl)trimethylammonium acetate. "(carboxymethyl)trimethylammonium" is also known as "Betaine". Advantages provided by utilizing betaine are: improved catalytic activity, low toxicity, and it eliminates the ionic species (residual ions can promote "image sticking" in some applications).

Solvents

At least one solvent is added to the at least one silicon-based compound and the at least one catalyst. Contemplated solvents include any suitable pure or mixture of organic molecules that are volatilized at a desired temperature and/or easily solvates the components discussed herein. The solvent may also comprise any suitable pure or mixture of polar and non-polar compounds. As used herein, the term "pure" means that component that has a constant composition. For example, pure water is composed solely of $H_2O$. As used herein, the term "mixture" means that component that is not pure, including salt water. As used herein, the term "polar" means that characteristic of a molecule or compound that creates an unequal charge, partial charge or spontaneous charge distribution at one point of or along the molecule or compound. As used herein, the term "non-polar" means that characteristic of a molecule or compound that creates an equal charge, partial charge or spontaneous charge distribution at one point of or along the molecule or compound.

Contemplated solvents are also those solvents that can, alone or in combination, modify the viscosity, intermolecular forces and surface energy of the solution in order to, in some cases, improve the gap-filling and planarization properties of the composition. It should be understood, however, that suitable solvents may be those solvents that influence the profile of the composition in other ways, such as by influencing the crosslinking efficiency, influencing the thermal stability, influencing the viscosity, and/or influencing the adhesion of the resulting layer or film to other layers, substrates or surfaces.

The at least one solvent may comprise those solvents that are considered part of the hydrocarbon family of solvents. Hydrocarbon solvents are those solvents that comprise carbon and hydrogen. It should be understood that a majority of hydrocarbon solvents are non-polar; however, there are a few hydrocarbon solvents that could be considered polar. Hydrocarbon solvents are generally broken down into three classes: aliphatic, cyclic and aromatic. Aliphatic hydrocarbon solvents may comprise both straight-chain compounds and compounds that are branched and possibly crosslinked, however, aliphatic hydrocarbon solvents are not considered cyclic. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally three or more unsaturated bonds with a single ring or multiple rings attached by a common bond and/or multiple rings fused together. Contemplated hydrocarbon solvents include toluene, xylene, p-xylene, m-xylene, mesitylene, solvent naphtha H, solvent naphtha A, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosine, isobutylbenzene, methylnaphthalene, ethyltoluene, ligroine. Particularly contemplated solvents include, but are not limited to, pentane, hexane, heptane, cyclohexane, benzene, toluene, xylene and mixtures or combinations thereof.

The at least one solvent may comprise those solvents that are not considered part of the hydrocarbon solvent family of compounds, such as ketones, such as acetone, diethyl ketone, methyl ethyl ketone and the like, alcohols, esters, ethers and amines. Other contemplated solvents include ethyl lactate, propylene glycol monomethyl ether acetate (PGMEA) or a combination thereof. In yet other contemplated embodiments, the at least one solvent may comprise a combination of any of the solvents mentioned herein.

The at least one solvent may be present in solution in an amount less than about 90% by weight. In some embodiments, at least one solvent may be present in solution in an amount from about 50 to 90% by weight. In other embodiments, at least one solvent may be present in solution in an amount from about 55 to 85% by weight. In yet other embodiments, at least one solvent may be present in solution in an amount from about 65 to 85% by weight. The determination of what is the appropriate amount of solvent to add to composition depends on a number of factors, including: a) thicknesses of the desired layers or films, b) desired concentration of the solids in the composition, c) application technique of the composition and/or d) spin speeds, when spin-coating techniques are utilized. In addition, the higher the solid concentration (or the resin or polymer) is in the formulation, the higher the viscosity. Spin and spray coaters can handle compositions with low viscosity (i.e. 3 centipoises), but slot die or slit coaters often need compositions having a high viscosity. Hence, the solid content should be increased (or reduce solvent amount) to get viscous material—i.e. 9 centipoises. In addition, the viscous formulation or formulation with higher solid content will give thicker film (>2 µm).

The solvents used herein may comprise any suitable impurity level. In some embodiments, the solvents utilized have a relatively low level of impurities, such as less than about 1 ppm, less than about 100 ppb, less than about 10 ppb, less than about 1 ppb, less than about 100 ppt, less than about 10 ppt and in some cases, less than about 1 ppt. These solvents may be purchased having impurity levels that are appropriate for use in these contemplated applications or may need to be further purified to remove additional impurities and to reach the less than about 10 ppb, less than about 1 ppb, less than about 100 ppt or lower levels that suitable and/or desired.

Composition-Modifying Constituents

Optionally, the compositions may further comprise at least one composition-modifying constituent, such as at least one surfactant, at least one adhesion promoter, at least one crosslinking agent, at least one other additive or a combination thereof. These composition-modifying constituents are designed to influence the properties of the compositions, coatings, layers and/or films. Contemplated properties which may be influenced, are surface tension, adhesion to other layers or surfaces, viscosity, density, transmittance/transparency or a combination thereof.

At least one surfactant is considered to be one of the contemplated composition-modifying constituents. Surfactants may be added to lower surface tension. As used herein, the term "surfactant" means any compound that reduces the surface tension when dissolved in $H_2O$ or other liquids, or which reduces interfacial tension between two liquids, or between a liquid and a solid. Contemplated surfactants may include at least one anionic surfactant, cationic surfactant, non-ionic surfactant, Zwitterionic surfactant or a combination thereof.

The surfactant may be dissolved directly into the composition or may be added with one of the compositions components (the at least one silicon-based compound, the at least one catalyst, the at least one solvent) before forming the final composition. Contemplated surfactants may include: polyether modified polydimethylsiloxanes such as BYK 307 (polyether modified poly-dimethyl-siloxane, BYK-Chemie), sulfonates such as dodecylbenzene sulfonate, tetrapropylenebenzene sulfonate, dodecylbenzene sulfonate, a fluorinated anionic surfactant such as Fluorad FC-93, and L-18691 (3M), fluorinated nonionic surfactants such as FC-4430 (3M), FC-4432 (3M), and L-18242 (3M), quaternary amines, such as dodecyltrimethylammonium bromide or cetyltrimethylammonium bromide, alkyl phenoxy polyethylene oxide alcohols, alkyl phenoxy polyglycidols, acetylinic alcohols, polyglycol ethers such as Tergitol TMN-6 (Dow) and Tergitol minifoam 2× (Dow), polyoxyethylene fatty ethers such as Brij-30 (Aldrich), Brij-35 (Aldrich), Brij-58 (Aldrich), Brij-72 (Aldrich), Brij-76 (Aldrich), Brij-78 (Aldrich), Brij-98 (Aldrich), and Brij-700 (Aldrich), betaines, sulfobetaines, such as cocoamidopropyl betaine, and synthetic phospholipids, such as dioctanoylphosphatidylcholine and lecithin and combinations thereof.

Other contemplated surfactants include those found in U.S. Pat. Nos. 5,858,547 and 6,517,951 issued to Hacker et al., which are commonly-owned, assigned and incorporated herein by reference in their entirety. As contemplated herein, the at least one surfactant may be present in solution in an amount less than about 1% by weight. In some embodiments, the at least one surfactant may be present in solution in an amount from about 0.001% to about 1% by weight. In other embodiments, the at least one surfactant may be present in solution in an amount from about 0.001% to about 0.25% by weight. In some embodiments, at least two surfactant constituents may be present in solution. The determination of what is the appropriate amount of a composition-modifying constituent to add to composition depends on a number of factors, including: a) minimizing defects in the film, and/or b) balancing the film between good adhesion and desirable film properties.

In other embodiments, at least one adhesion promoter may be added to the composition, alone or with the at least one surfactant, in order to influence the ability of the layer, coating or film to adhere to surrounding substrates, layers, coatings, films and/or surfaces. In some contemplated embodiments, the at least one adhesion promoter comprises at least one of the following characteristics: a) is thermally stable after heat treatment, such as baking, at temperatures generally used for optoelectronic component manufacture, and/or b) can surprisingly act as an adhesion promoter by promoting electrostatic and coulombic interactions between layers of materials, as well as promoting understood Van der Waals interactions in some embodiments.

In a contemplated embodiment, the addition of at least one adhesion promoter, such as at least one weak acid/weak base, at least one weak acid/strong base, at least one strong acid/strong base, at least one strong acid/weak base, at least one amine base, at least one amine salt or a combination thereof increases the electrostatic and coulombic interaction. Contemplated adhesion promoters include aminopropyl triethoxysilane (APTEOS) nitrate, APTEOS acetate, APTEOS sulfonate, APTEOS methanesulfonate, APTEOS triflate, APTEOS tosylate, APTEOS nonafluorobutane-1-sulfonate (nfbs) or any other amine salt or combination of amine salts, Suitable amine bases comprise ammonium, pyridine, aniline, TMAH, CTAH, TBAH, APTEOS or a combination thereof. Other contemplated adhesion promoters include 3-(triethoxysilyl)propylsuccininc anhydride, dimethyldihydroxy silane, methylphenyl dihydroxysilane or combinations thereof. As contemplated herein, the at least one adhesion promoter may be present in solution in an amount less than about 20% by weight. In some embodiments, the at least one adhesion promoter may be present in solution in an amount from about 0.001% to about 20% by weight. In other embodiments, the at least one adhesion promoter may be present in solution in an amount from about 0.26% to about 2.6% by weight. In some embodiments, at least two adhesion promoters may be present in solution.

At least one crosslinking agent may be added to the composition. As used herein, the term "crosslinking" refers to a process in which at least two molecules, or two portions of a long molecule, are joined together by a chemical interaction or reaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules. The chemical reaction may take place between two identical, or non-identical reactive groups, which may be located on the same or on two separate backbones. It is also contemplated that the reactive groups may react with one or more than one exogenous crosslinking molecules to crosslink the at least one silicon-based polymer. It should be understood that while the at least one catalyst lowers the activation energy of the composition in order to effect crosslinking of the at least one silicon-based compound, the at least one crosslinking agent may be added in order to continue crosslinking the at least one silicon-based compound in order to increase the crosslinking density of the coating, layer or film.

With respect to the properties of the compositions, coatings, films, layers or combination thereof, it may be beneficial to either lower or increase one or both the viscosity and the intermolecular forces constituent in order to optimize the gap-filling and planarization properties for the particular end use. One method used to modify the planarization composition is to modify and/or replace the at least one solvent, wherein the at least one solvent is compatible with the at least one silicon-based compound and modifies at least one of the intermolecular forces or surface forces components of the planarization composition to which it is added. Another method is to add at least one composition-modifying constituent, such as those mentioned herein. As used herein, the phrase "intermolecular forces" means those bonding or non-bonding forces, such as Van der Waals, electrostatic, steric, coulombic, hydrogen bonding, ionic, covalent, dipole-dipole, dispersion, magnetic attraction and combinations thereof, that take place between two or more parts of matter or components, such as a planarization composition and a surface, a planarization composition and another layer of material, molecules that make up the planarization composition and combinations thereof.

In other contemplated embodiments, the at least one solvent, the at least one composition-modifying constituent or a combination thereof modifies the apparent viscosity by at least about 10%. In other contemplated embodiments, the apparent viscosity is modified by at least about 20%. In yet other contemplated embodiments, the apparent viscosity is modified by at least about 30%. As used herein, the phrase "apparent viscosity" means the characteristic of fluid's internal resistance to flow and which equals the ratio of stress to the rate of strain. In micron and submicron trenches, the apparent viscosity represents the integral effect of surface forces and usually decreases from the nominal viscosity due to the size effect where the ratio between surface force and body force is large. Also as used herein, the phrase "nominal viscosity" means that viscosity that is the bulk fluid property determined from a commercially available viscometer, such as a Brookfield viscometer, and is calculated from measurements of forces and velocities when liquid is Newtonian.

In yet other embodiments, a surface forces component, such as an interfacial surface tension, is created by the planarization composition and the interaction of the planarization composition with the surface, substrate or wafer. Solvents and composition-modifying constituents contemplated herein can modify the interfacial surface tension by at least about 10% when compared to a conventional planarization composition known to one of ordinary skill in the art of layered materials. In some embodiments, the at least one solvent, the at least one composition-modifying constituent or combination thereof can modify the interfacial surface tension by at least about 20% when compared to a conventional planarization composition. In yet other embodiments, the at least one solvent, the at least one composition-modifying constituent or combination thereof can modify the interfacial surface tension by at least about 30% when compared to a conventional planarization composition.

As a general example, a silicon-based compound, such as a phenylsilsesquioxane oligomer-containing formulation, is applied to a silicon substrate and cured to form a polymer film. The phenylsilsesquioxane oligomer has a molecular weight of 500-2500 AMU. In some embodiments, contemplated phenylsilsesquioxane oligomers have a molecular weight of 700-2100 AMU. In other embodiments, contemplated phenylsilsesquioxane oligomers have a molecular weight of 800-1900 AMU. The formulation can be prepared by dissolving the phenylsilsesquioxane oligomer into propylene glycol monomethyl ether acetate (PGMEA) in an amount varying between 15 and 45 percent by weight. A condensation catalyst (tetramethylammonium nitrate) is added in a concentration ranging from 15-250 ppm. A surfactant (such as BYK 307 from BYK-Chemie) may be added to the formulation to improve film quality of thicker films. The formulation is then applied to the substrate by spinning, slot die coating, dipping, or spraying. The film is formed on the substrate by baking between 150 and 300° C. to remove solvent, followed by a curing step of between 150 and 400° C. to induce crosslinking of the phenylsilsesquioxane. The thickness of the resulting film varies between 0.3 and 2.5 um, depending on the weight percent phenylsilsesquioxane content of the formulation. Film properties include low outgassing, good planarization, high optical transparency, high thermal stability, high refractive index and good electrical insulation (k~3). These properties are desirable for use in various optoelectronic applications, such as flat panel displays. Contemplated materials, coatings, layers and/or films may have a relatively high refractive index. In some embodiments, the refractive index is greater than about 1.5.

Uses of the Compositions in Optoelectronic Applications

Optoelectronic devices are also contemplated herein, comprising at least one light-transmissive film or layer produced by providing at least one silicon-based compound, providing at least one catalyst, providing at least one solvent, blending the at least one silicon-based compound, the at least one catalyst and the at least one solvent to form a composition, applying the composition to a suitable surface, and at least partially activating the at least one catalyst in order to form the light-transmissive film or layer. It is contemplated that an optoelectronic device may comprise one or more light-transmissive films or layers, such as those described herein, and those light-transmissive films or layer may comprise the same chemical composition or one that is slightly different from another light-transmissive film or layer. In other embodiments, at least one composition-modifying constituent may be added to the composition.

Contemplated compositions are applied to suitable surfaces, such as layers, films or substrates depending on the projected end-use of the film formed from the composition. Contemplated films are, in some embodiments, etch resistant to at least one aggressive etch chemistry. In general, photoresist strippers (those that are used to remove photoresist after using it for etching the dielectric or metal) are chosen to achieve a high etch rate of the order of 3000 A/min or higher, which can be considered an aggressive etch chemistry. To achieve such high rates, usually photoresist stripping temperature is high of the order of 50 C or above. These high rates should be achieved without losing selectivity to underlying exposed layers to maintain critical dimension. Commonly used photoresist strippers are ST106, NMP, PRS2000™ and so on. At temperatures above 50 C, these strippers impart etch rates of the order of 5000 A/min or higher. Compositions described herein comprising primarily aryl moieties, such as phenyl, are soluble in photoresist strippers at temperatures above 40 C. However, contemplated compositions that comprise a combination of alkyl and aryl (such as methyl and phenyl) provide a very high selectivity (or very low etch rates of the order of 100 A per min or lower in photoresist strippers) of 40:1=photoresist:dielectric or higher.

Surfaces contemplated herein may comprise any desirable substantially solid material, such as a glass, stainless steel or plastic substrate found in the optoelectronic manufacturing industry. The surfaces may be coated or uncoated, patterned or unpatterned, and may reside anywhere in the optoelectronic device, such as on the top of a TFT structure, between or in TFT structures, on top of a stainless steel or plastic substrate above which TFT or any suitable semiconductor device structures (or other structures) are placed, adjacent a color filter in an LCD, adjacent an OLED device, adjacent an electrophoretic device or adjacent any other surface within a flat panel or other display or optoelectronic device. Some contemplated surfaces comprise a non-planar surface topography and other contemplated surfaces that have already been planarized. Particularly desirable surfaces comprise films, glass, ceramic, plastic, metal or coated metal, or composite material. Surfaces comprise at least one layer and in some instances comprise a plurality of layers. In other embodiments, the surface comprises a material common in the optoelectronic industries. Suitable surfaces contemplated herein may also include another previously formed layered stack, other layered component, or other component altogether.

The at least one catalyst is activated at a suitable point in the production of the layered material, device, film or display, thereby forming the light-transmissive film or layer. In some embodiments, the composition is applied to a suitable surface and the at least one catalyst is at least partially activated. By "at least partially activated", the at least one catalyst may be activated in that it converts the composition to a partially crosslinked gelled film, but has not been activated as such to convert the composition to a fully crosslinked film. In other embodiments, the composition is at least partially activated before application to a surface, substrate, layer or film. In yet other embodiments, the composition is applied to a suitable surface, layer, film or substrate and the at least one catalyst is fully activated thus resulting in a crosslinked and dense film or layer. Contemplated catalysts may be activated by any suitable device, method or action, including by applying heat, light, vibration or another chemical compound.

Compositions contemplated herein may be coated onto a surface by any suitable method, including continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

In some contemplated compositions, where the composition comprises at least one sufficiently light-transmissive crosslinkable composition, wherein the composition comprises at least one silicon-based material, at least one crosslinking agent and at least one solvent, the composition after a cure or curing step having at least one cure temperature and at least one cure time has a weight loss of less than about 2% during further processing at or below the cure temperature. In other embodiments, this weight loss is less than about 1%. In some embodiments, the at least one cure temperature ranges from about 150° C. to about 400° C., and the at least one cure time is less than about 2 hours.

The films produced by the compositions and processes described herein may have one or more advantages over those previously known to the art, including improved dielectric breakdown strength also known as electric field to breakdown (FBD), which enables the film to be used in optoelectronic applications. In the manufacture of optical devices such as flat panel displays, gate dielectrics, planarization layers and passivation layers may need to have a FBD of at least about 2.5 MV/cm, and in some embodiments, greater breakdown fields are desirable. A transparency to light in the range of about 400 nm to about 800 nm of at least about 90% is desirable in contemplated films. In some embodiments, the films, coatings and layers have a transparency to light of at least about 95%. In some embodiments, the films, coatings and layers have a transparency to light of at least about 98%. In other embodiments, the films, coatings and layers have a transparency to light of at least about 99%. In some embodiments, the films, coatings and layers have a degree of planarization of above 90% over topographies. In other embodiments, the films, coatings and layers have root mean square surface roughness lower than 10 nm or Angstroms.

In optoelectronic devices and displays, conformal coatings are used as insulators for an interlayer dielectric, such as CVD $SiO_2$ and SiN. Using a planarizing/gap filling material is desirable as it avoids sharp corners that can create shorts in subsequent metallization steps. For the passivation layer, $SiN/SiO_2$ can also be used, but using a planarizing material increases the area of the pixel electrode and therefore increases the brightness of the display. Sometimes for the passivation layer or planarizing layer, organic materials are used, such as benzocyclobutene (BCB) or a photoimageable acrylic. In the case of BCB, materials disclosed herein have a higher thermal stability. In the case of the photoimageable acrylic resin, materials disclosed herein have a higher thermal stability, and also have higher transparency. High thermal stability is often very desirable, as it prevents outgassing that can cause adhesion problems as well as damage moisture sensitive components in the finished device.

Thin Film Transistors (TFTs)

Compositions, coatings, materials, films and layers disclosed herein may be used as interlevel (between $1^{st}$ and second metal layers, or between second metal and pixel electrode layer) or intralevel (between metal lines or contacts in the same level) dielectric (ILD) layers in thin film transistors, such as amorphous silicon thin film transistors, low temperature polysilicon transistors, crystalline silicon transistors, organic transistors, organic field effect transistors or static induction transistors. In all these devices, contemplated compositions are used as an intralayer dielectric between source and drain (S/D) contacts, an interlayer or interlevel dielectric between gate and S/D contacts, between gate and pixel electrode in LCDs or between any two metallic conducting regions. The contemplated compositions may also replace the insulator (known as gate dielectric and the material commonly used in current devices is SiN) above the gate. The contemplated compositions, films and/or layers may also function as passivation layers and planarization layers in these devices.

Figure 1A:
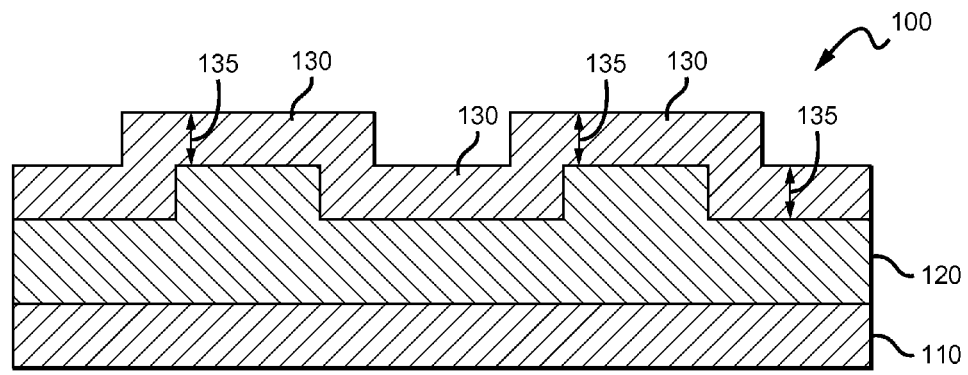
FIG. 1(a) shows a cross-section of a thin film transistor (100) comprising a substrate (110), a surface (120) with topography and a conformal layer or coating comprising $SiN_x$ applied by chemical vapor deposition (CVD).
Figure 1B:
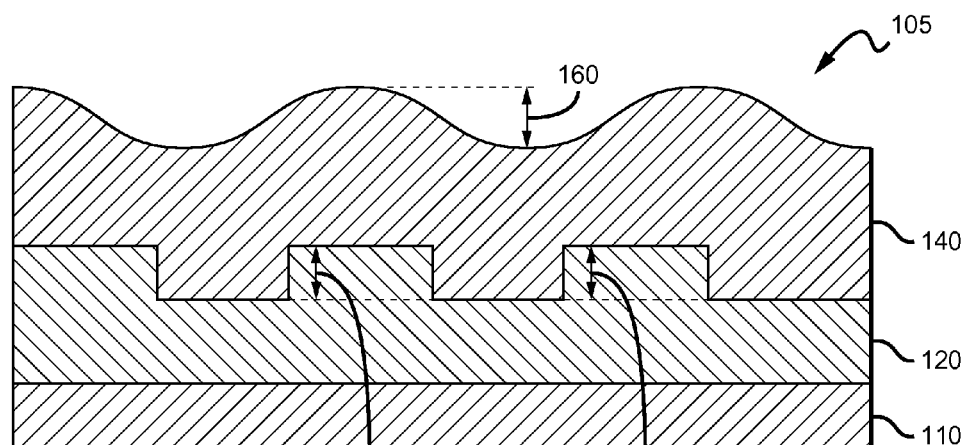
FIG. 1(b) shows a cross-section of a thin film transistor (105) comprising a substrate (110) and a surface (120) with topography and a planarizing layer (140).

Planarizing layer differs from conformal layers such as chemical vapor deposited silicon nitride in thickness variation across the surface as shown in FIGS. 1(a) and 1(b). FIG. 1(a) shows a cross-section of a conformal coated patterned substrate (100) comprising a substrate (110), a surface (120) with topography and a conformal layer or coating comprising $SiN_x$ applied by chemical vapor deposition (CVD). Conformal layers (130) give rise to uniform thickness (135) all over the surface (120) thereby keeping the topography of the surface (120) intact as shown in FIG. 1(a). FIG. 1(b) shows a cross-section of a planarized substrate (105) comprising a substrate (110) and a surface (120) with topography and a planarizing layer (140), Planarizing layers give rise to different thicknesses in different regions (lower thickness on top of hills and higher thickness in the valleys) such that the topography of the surface is altered and the surface becomes almost flat as shown in FIG. 1(b). The degree of planarization (DOP, expressed in percentage) is the difference between the initial height of the feature on a given surface before coating (150) and the dip (160) in the planarizing coating (from the top surface of coating) at the valley region normalized to the initial height of the feature. DOP is represented by this ratio $(1-\{(x-y)/x\})$ and is expressed as a percentage. Layers that yield greater than 90% DOP are considered to be good planarizing layers. Usually the amount of solid or resin content in the formulation or the amount of solvent is adjusted, or the solvent(s) is(are) changed to achieve a flat surface for a given topography.

Figure 2:
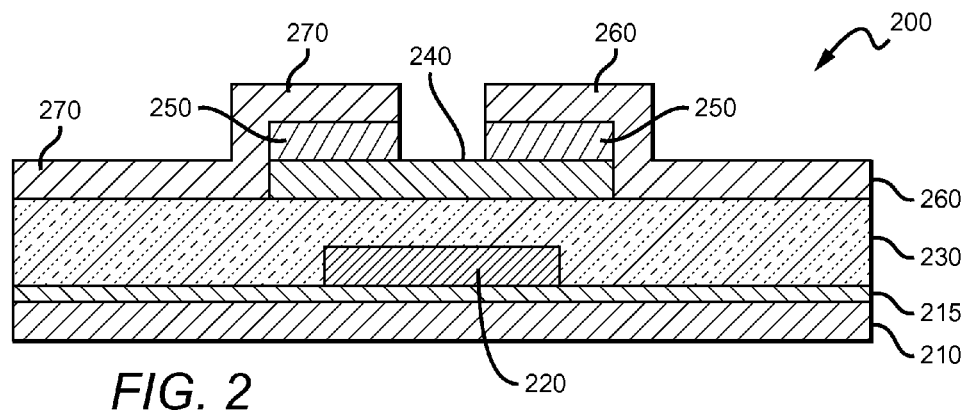
FIG. 2 shows the cross section of a typical thin film transistor device (200) in which a contemplated formulation is used as a gate dielectric (230).

Thin film transistors, being the heart of any flat panel screen, in general comprise three terminals known as gate, source and drain. FIG. 2 shows the cross section of a typical thin film transistor device (200) in which a contemplated formulation is used as a gate dielectric (230). The substrate (210) could be glass, plastic or metal. A metal layer is formed on the top of a substrate (210) usually by physical vapor deposition process (such as sputtering) and patterned to form the gate metal (220). When the gate dielectric material (230) is coated on a substrate (210) patterned with a gate metal (220), the dielectric material (230) planarizes the surface topography as shown in FIG. 2. On top of the gate dielectric, amorphous silicon (240) is deposited. Source and drain regions in a-Si are doped with n+ to achieve a low contact resistance. The source (270) and drain (260) contacts are formed on the n+ doped (250) regions of amorphous silicon (240). In general, whenever a planarizing layer is used, the surface topography is largely reduced.

Figure 3:
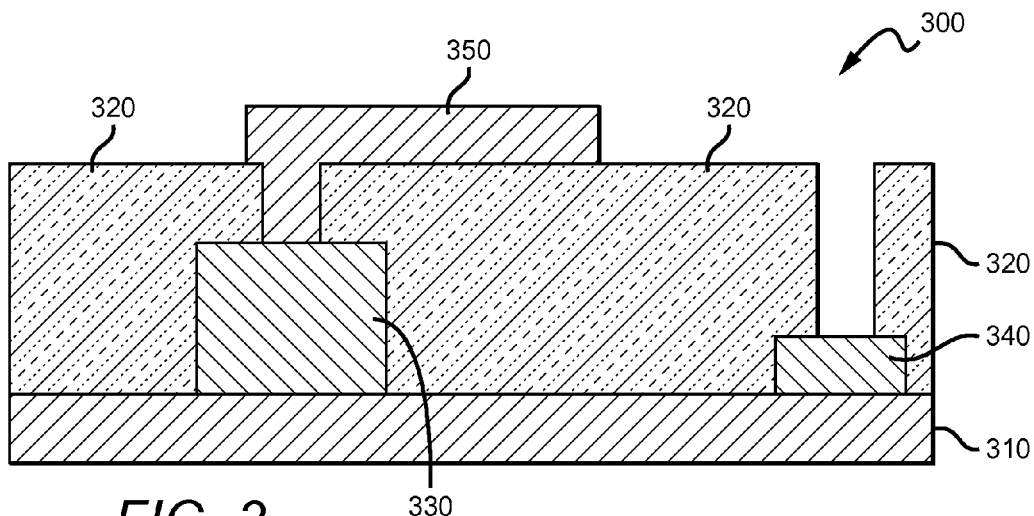
FIG. 3 shows a contemplated device (300) where the surface is planarized using the contemplated formulation (320).

In a contemplated device (300), after building the TFT regions (330) on a substrate (310), the surface is planarized using the contemplated formulation (320) as shown in FIG. 3. This layer (320) is usually known as interlayer dielectric as it exists between the first metal layer (340) (which also forms the gate in TFT regions) and the pixel electrode (350). The pixel electrode (350) is connected to the drain (not shown) of the TFT. This layer (320) is also called passivation layer as it protects the TFT regions during further processing steps and it isolates the liquid crystal region from the TFT region.

Color Filter in Liquid Crystal Displays:

Among flat panel displays, liquid crystal display (LCD) devices have been commonly used due to their thin profile, light weight, and low power consumption. In LCD systems, the liquid crystal molecules are oriented in different directions to selectively allow (or block) light passage and thereby achieve image displaying. The color to the image is imparted by the color filter screen. A color filter screen is a contemplated end use for the compositions, layers and films disclosed herein.

Figure 4A:
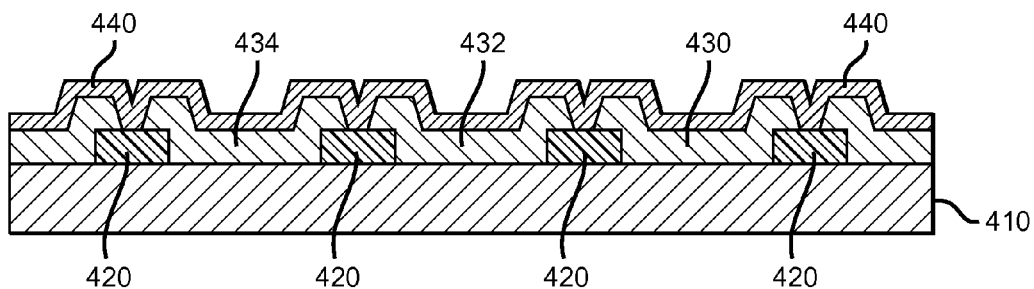
FIG. 4(a) shows the cross-section of a typical color filter.
Figure 4B:
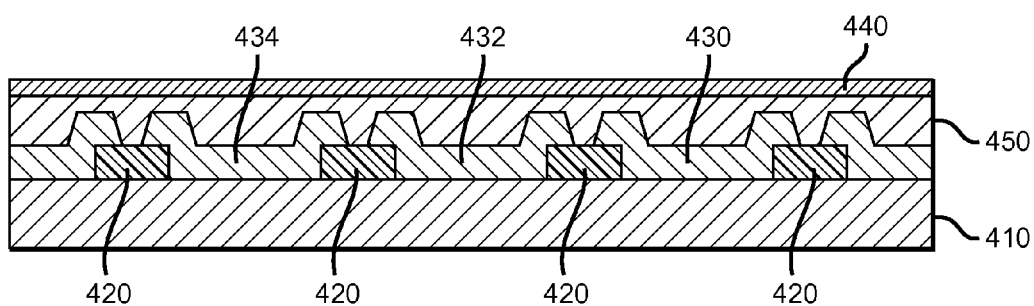
FIG. 4(b) shows how contemplated materials are used in a color filter.

FIG. 4(a) shows the cross section of a typical color filter and FIG. 4(b) shows how contemplated materials are used in a color filter. In general, a color filter screen in a LCD is fabricated by first depositing a chromium-based or resin-based black matrix (420) on a substrate (410) and patterning it. This step is followed by forming three primary color regions (430, 432, 434) by depositing the respective resins and patterning to define red, green and blue regions. A transparent conducting electrode (440) usually indium tin oxide (ITO)—common electrode for liquid crystals to function—is deposited on top of the color patterns interspersed with black matrix. The common electrode (440) follows the topography of the underlying color regions. A polyimide layer is deposited on top of the electrode (not shown) to complete the color filter screen. Because of the topography in ITO, differential field results leading to differential response of liquid crystals. ITO deposition is a sputtering process, which may also damage color resins. To protect the three primary color regions the surface is covered by an overcoat layer (450) as shown in FIG. 4(b). This overcoat layer (450) may comprise contemplated formulations, as described throughout this disclosure. This layer in addition to protecting color regions, planarizes the surface. The common electrode (440) deposited on top of this overcoat is flat and provides a uniform field to the liquid crystal in a given pixel or subpixel.

Thus, the contemplated layers, films, materials or composition may be used as a gate dielectric, inter- or intra-level dielectric, passivation and planarization layers in different regions of the TFTLCD and as color filter overcoat in color filter screens.

Figure 5:
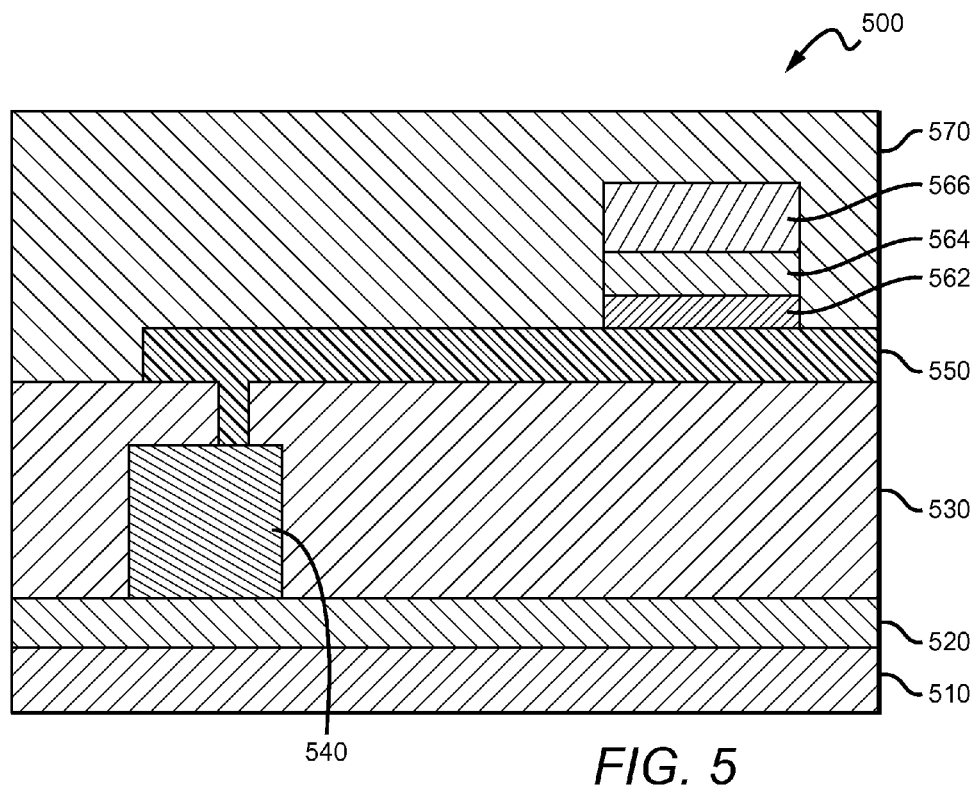
FIG. 5 shows the cross section of an active matrix organic light emitting diode (AMOLED) (500).

Organic Light-Emitting Diode (OLEO):

FIG. 5 shows the cross section of an active matrix organic light emitting diode (AMOLED) (500). As shown in the figure, an OLED device comprises a cathode (566) (usually Ca, Al or Ba), a light emitting polymer and an anode (usually ITO) (550). The light emitting polymer comprises a hole transport layer (562) to conduct holes and an electron transport layer (564) to transport electrons. Light is emitted when holes combine with electrons. To fabricate an AMOLED device (500), the substrate (510) is first coated with a moisture barrier layer (520). The contemplated formulation may be used for this purpose. Then the TFT regions (540) are formed on the contemplated moisture barrier layer (520). A passivation layer (530) (also called an ILD) of the contemplated formulation is deposited all over and opened at the drain region of the TFT to connect the anode (550) of OLED. This passivation layer should have moisture and $O_2$ diffusion barrier properties. The contemplated formulation is also deposited on top of OLED region as an encapsulation layer (570) to prevent moisture and $O_2$ diffusion from the top and the sides.

The OLED region needs to be completely encapsulated by such a barrier layer or plurality of barrier layers to prevent diffusion of water, oxygen or other extraneous substances in the environment. The diffusion of such species to OLED reduces the lifetime and reliability of OLED devices. The contemplated material may be used in general as oxygen and moisture diffusion barrier layers surrounding the OLED regions and in particular as encapsulation above the OLED regions and passivation layer below the anode. In AMOLED, the contemplated material can also be used as interlayer dielectric to planarize topographies, gate dielectric and passivation layer in TFT regions.

Figure 6A:
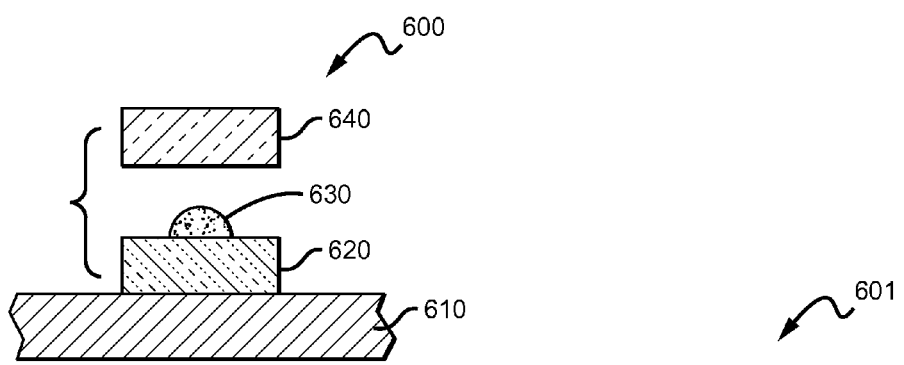
FIGS. 6(a) and 6(b) show schematic cross-sections of a contemplated LED (601) and the breakout of a contemplated LED (600), wherein the compositions contemplated herein may be utilized on top of the LED in top-emitting LEDs or on the substrate at the bottom for the bottom emitting LEDs (not shown).
Figure 6B:
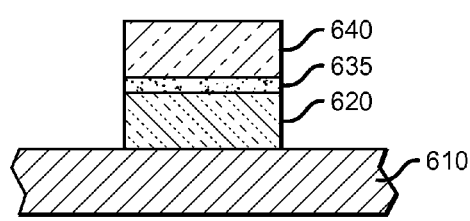

Light Extraction Layer in Light-Emitting Diodes (LEDs):

Light-emitting diodes are two terminal devices with a p and n type semiconductors deposited on sapphire/GaN substrate with an inherent high refractive index. The pn junction emits light when biased with a certain voltage. FIG. 6 shows a schematic cross-sections of a contemplated LED (601) and the breakout of a contemplated LED (600), wherein the compositions contemplated herein may be utilized on top of the LED in top-emitting LEDs or on the substrate at the bottom for the bottom emitting LEDs (not shown). The contemplated composition, materials, films and layers are used as a light extraction layer (630 and 635). The contemplated formulation is applied on top of the LED region (620), which is on top of a substrate layer (610), as an adhesive to the lens (640) (usually made of polycarbonate) that goes on top of the LED region (620). This adhesive layer (630 and 635) is transparent and its refractive index is between the refractive indices of LED layer (620) and lens layer (640). By refractive index matching using this layer, the total internal reflection of light back into the LED region is reduced and more of the emitted light from LED is extracted to the lens (or from the substrate to outside in bottom emitting LED device architecture—not shown in figure), which reduces light intensity loss due to total internal reflection and makes the LEDs to have high brightness. Contemplated materials, coatings, layers and/or films may have a relatively high refractive index. In some embodiments, the refractive index is greater than about 1.5. These materials, coatings, layers and/or films can also achieve increased thickness without cracking, and have high thermal stability. In some embodiments, the thickness is greater than 1 μm. In other embodiments, the thickness is greater than about 2.5 μm. The contemplated composition or layer gives rise to thick films with a good adhesion between LED layers, lens and substrate layers.

Figure 7A:
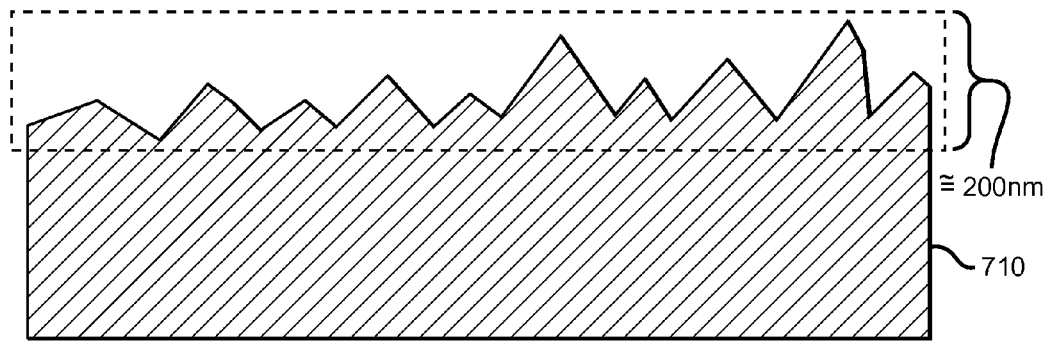
FIGS. 7(a) and 7(b) show contemplated flexible substrates. These substrates (710) are in general rough (roughness of the order of a few hundred nanometers) as shown in the figure.
Figure 7B:
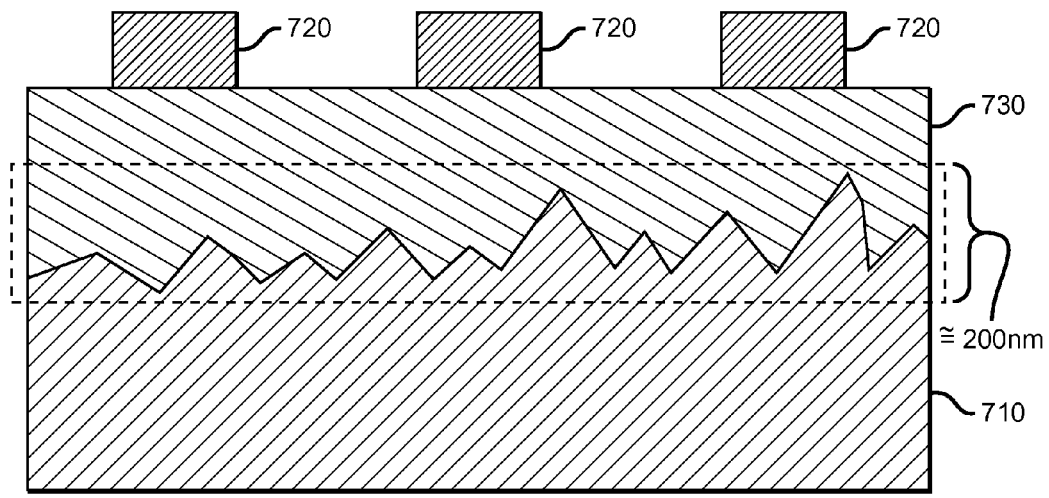

Substrate Planarization:

Traditionally glass substrates are used to build flat panel display screens. However flexible displays require the substrate to be flexible and therefore stainless steel or plastic substrates are the choices. These substrates (710) are in general rough (roughness of the order of a few hundred nanometers) as shown in FIGS. 7(*a*) and 7(*b*). A smooth optically flat surface is required before building any device (thin film transistor or photovoltaic cell or others) on top. If the substrate is stainless steel, a conducting substrate, it has to be isolated electrically from the devices (in this case, TFT devices represented by 720) built on top of it. Some photovoltaic customers want just enough planarization, but not enough, to cover all the rough peaks on the surface. This requirement uses the stainless steel substrate as a functional element in the device—the back contact. However, a thin layer of metal needs to be deposited on top of the dielectric to the complete the back contact process.

Some contemplated substrates include PET, PEN and modified polycarbonates (PC). PET can go to a maximum temperature of 150 C. PEN substrates can go up to 180 C, but they do not work well with LCD, because of birefringence. Modified polycarbonates have higher TGs (around 215 C). These plastic films have a refractive index of 1.59.

The formulation, layers, and films (represented as 730) contemplated herein are used to planarize stainless steel, metal foil or plastic where transistors or any other devices would subsequently be built. On a plastic surface, the main functionalities provided by the contemplated material are surface planarization and moisture barrier properties. The coatings can be applied to the substrate by Mayer Rod applicators or by any other coating methods mentioned earlier. The films are thermal cured at 150 C. for 5 minutes and UV cured at 450 mJ/cm$^2$ for about 5 seconds. The films are generally about 3-4 micrometers in thickness and should provide moisture transmission resistance.

The initial roughness shows that the films are quite flat— around 2 nm for the roughness or Ra measurement. On one embodiment using a PC substrate, the Ra was shown to be about 0.5 nm.

Figure 8:
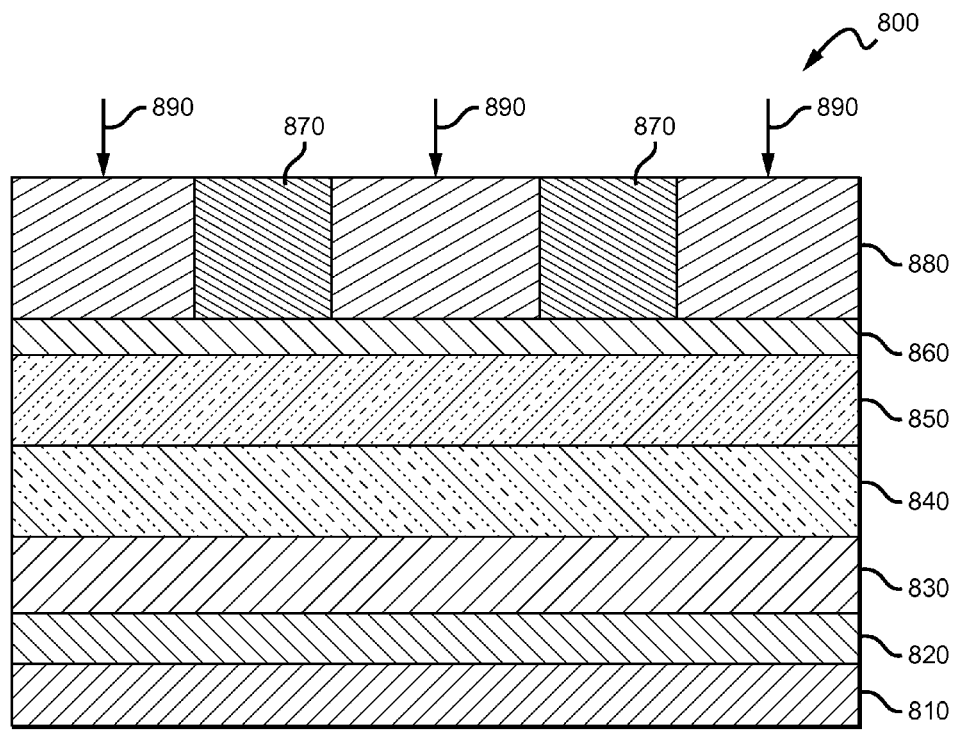
FIG. 8 shows a typical cross section of a solar cell (800).

Photovoltaic Cell:

A photovoltaic cell converts light to electric current and is the heart of solar cells. The cell is constructed with two layers of semiconductors, p- and n-type sandwiched together to form a 'pn junction'. When light is incident on the semiconductor, it is absorbed by the semiconductor and the energy is transferred to electrons in the n-type semiconductor which are then able to move through the material. For each electron, a corresponding positive charge carrier or 'hole', is created to maintain electrical neutrality. The electrons and holes near the pn junction are swept across in opposite directions by the action of the electric field. This separation of charge induces a voltage across the device generating electricity in external circuit. A typical cross section of a solar cell (800) is given in FIG. 8. The incident light is represented by (890). Traditionally solar cells are built on glass substrates. Recently plastic or stainless steel substrates (810) are candidates for substrates. The rough surface of these substrates is planarized using the contemplated material (820) and a back contact (830) made from metal is added to the layered material. On top of this, p-type and n-type semiconductor materials (840 and 850, respectively) are deposited. A thin layer (860) of antireflective coating is deposited on top of the shiny semiconductor (such as silicon) surface to promote more absorption of the incident light (890). The cell (800) is finished with a front contact (870) on top of n-type semiconductor. The contemplated material (880) is deposited on top of the front contact to protect metal regions (870) from environmental damage.

Figure 9:
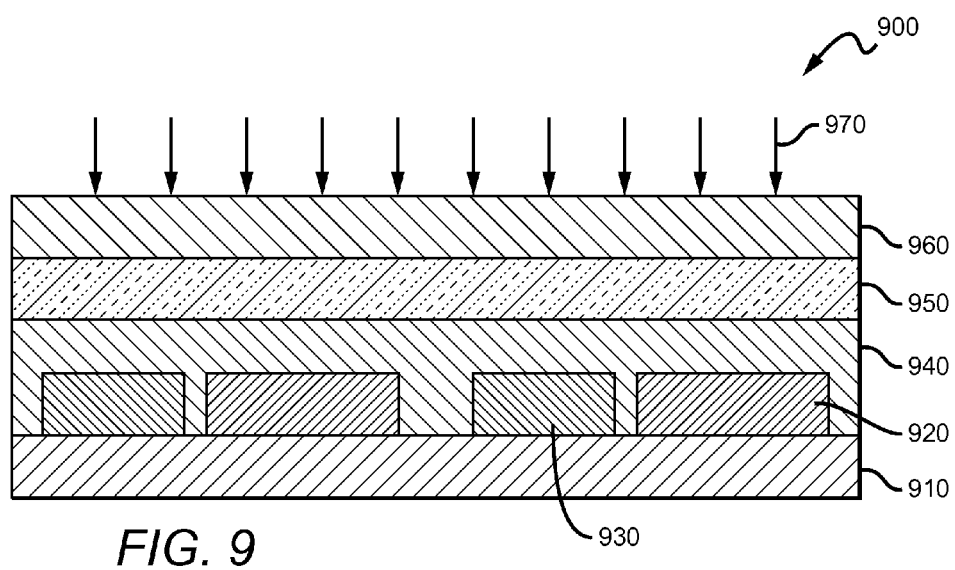
FIG. 9 shows an X-ray detector (900), which comprises a sensor (photoconductor), capacitor and an active matrix thin film transistor addressing unit.

X-Ray Detectors:

In general, the flat panel x-ray detector is a pixel array, comprising a million or more pixels. As shown in FIG. 9, an X-ray detector (900) in general comprises a sensor (photoconductor), capacitor and an active matrix thin film transistor addressing unit. The sensor is the photoconductor (940) that absorbs the incoming x-rays (970) and creates a corresponding electric charge which gets stored in a capacitor (920). The photoconductor (940) is coated with contemplated dielectric layers (950) and then a top electrode (960). The active matrix addressing detects the charge and sends the readout of the signal to external electronics which in turn displays the image. Each pixel in the addressing unit contains one addressing transistor (930, TFT). The layered material is built on a substrate (910), which may be glass. A thickness of around 300 to 500 μm is needed to reduce the incident X-ray energy to acceptable level that is not harmful, thin layer of amorphous silicon photoconductor alone cannot achieve this thickness. Therefore, phosphors or photoconductors are used which will convert the incident X-ray (after emerging form object to image) to either light or electron respectively; which in turn will be read out by the amorphous silicon arrays (just like in a flat panel display). Alternately, a scintillating layer (typically CsI) and photodiode can be used instead of the photoconductor and capacitor (not shown). The materials that are used for the scintillating layer are corrosive, so the contemplated material can be used as a protecting overcoat layer between the TFT's and the scintillating layer. The contemplated layers can also be used in TFT layer as gate dielectric, ILD and passivation as described earlier.

EXAMPLES

Example 1

29.25 g of polyphenylsilsesquioxane (GR950F manufactured by TECHNEGLAS™) is dissolved in 70 g of PGMEA. 0.75 g of APTEOS (utilized as an adhesion promoter) is added and the solution is heated to 80° C. After 2 hours the solution is cooled and 0.83 g of glacial acetic acid is added. A TMAN solution is prepared by weighing 0.5 g of TMAN (96% powder) and adding 99.5 g of deionized water. This TMAN solution is stirred for 30 minutes at room temperature and stored at room temperature. The silsesquioxane solution is filtered through 0.1 micron filter and then TMAN is added. The solution can then be used to form a film on a substrate by spin coating or another method.

The material described above is coated on stainless steel forming a film, which was free of 'dewets' after bake and cure. As used herein, the term "dewets" refers to film defects caused by poor adhesion which typically appear between film-formation and cure.

Example 2

In this Example, a contemplated composition is prepared which comprises 30 g of phenylsilsesquioxane (GR950F manufactured by TECHNEGLAS™) and is blended with 70 g of PGMEA, along with 0.3333 g of a TMAN solution.

GR950F is a resin flake of >98% phenylsilsesquioxane. It has a MW range of 800-1200 AMU and a melting point of 60° C. The 30 g of GR950F is placed in an empty HOPE bottle, along with the 70 g of PGMEA. A TMAN solution is prepared by weighing 0.5 g of TMAN (96% powder) and adding 99.5 g of deionized water. This TMAN solution is stirred for 30 minutes at room temperature and stored at room temperature. 0.3333 g of this TMAN solution is added to the GR950F solution, which results in a total of 16.6 ppm TMAN in the final solution. The solution is kept at room temperature and stirred for 3 hours using a magnetic stirrer. The solution is filtered through a double 0.2 µm filter. The filtered solution is then spin-coated at 1500 RPM onto a silicon surface. The thickness was approximately 1 µm.

Example 3

In this Example, a contemplated composition is prepared which comprises 30 g of phenylsilsesquioxane (GR150F manufactured by TECHNEGLAS™) and is blended with 70 g of PGMEA, along with 0.3333 g of a TMAN solution.

GR150F is a resin flake of methyl-phenylsilsesquioxane. It has a MW of roughly 2200 AMU. The 30 g of GR150F is placed in an empty HDPE bottle, along with the 70 g of PGMEA. A 2% TMAN solution is prepared by weighing 2.0 g of TMAN and adding 98.0 of deionized water. This TMAN solution is stirred for 30 minutes at room temperature and stored at room temperature. 0.8 g of this TMAN solution is added to the GR150F solution, which results in a total of 160 ppm TMAN in the final solution. The solution is kept at room temperature and stirred for 3 hours using a magnetic stirrer. The solution is filtered through a double 0.2 µm filter. The filtered solution is then spin-coated at 1500 RPM onto a silicon surface. The thickness was approximately 1 µm. The characteristic of this film provides for wet chemical resistance to PR strippers and other aggressive chemistries used for patterning metal or ITO (oxalic acid).

Example 4

The composition from Example 2 was applied to an unpatterned silicon substrate and subjected to a bake and cure. The substrate and composition are baked at 160/200/300° C. for 1 minute at each temperature on a hot plate in a flowing nitrogen environment or ambient air. The baked substrate is then cured at 400° C. for 1 hour. Surface roughness (also called root mean square roughness or surface roughness) was measured with a high resolution profiler (atomic force microscope) having a probe size of less than 10 nm. Five scans were conducted where each scan had a 1, 5 and 10 µm scan size. Root mean square roughness was 5-7 Å and roughness in Z direction (the average of the five tallest peaks and 5 lowest valleys) was 16-30 Å.

Example 5

Figure 10:
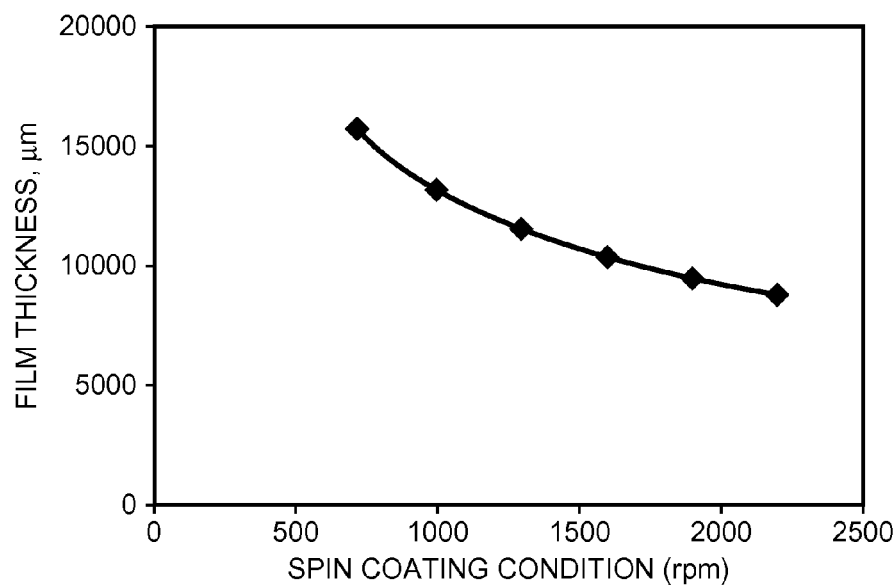
FIG. 10 shows a typical post-bake spin curve for Example 4.
Figure 11:
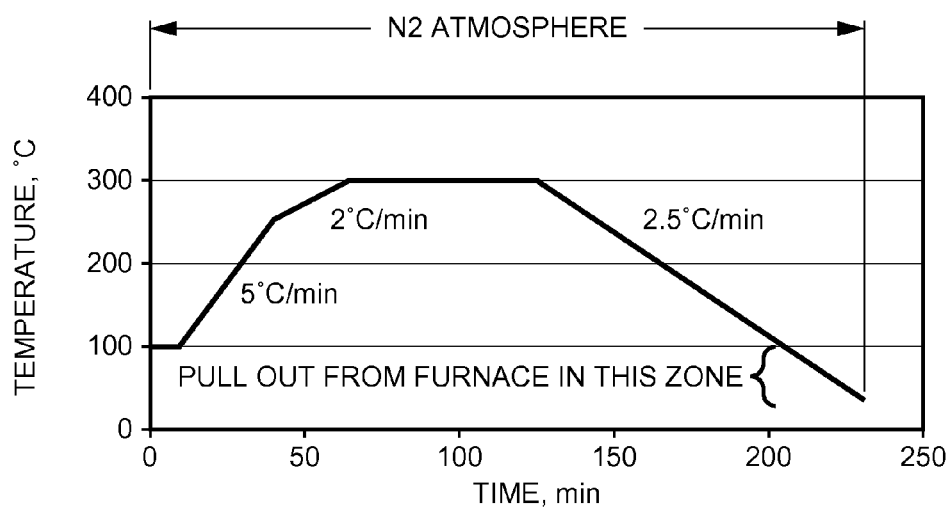
FIG. 11 shows a contemplated curing profile for a 300° C. cure.
Figure 12:
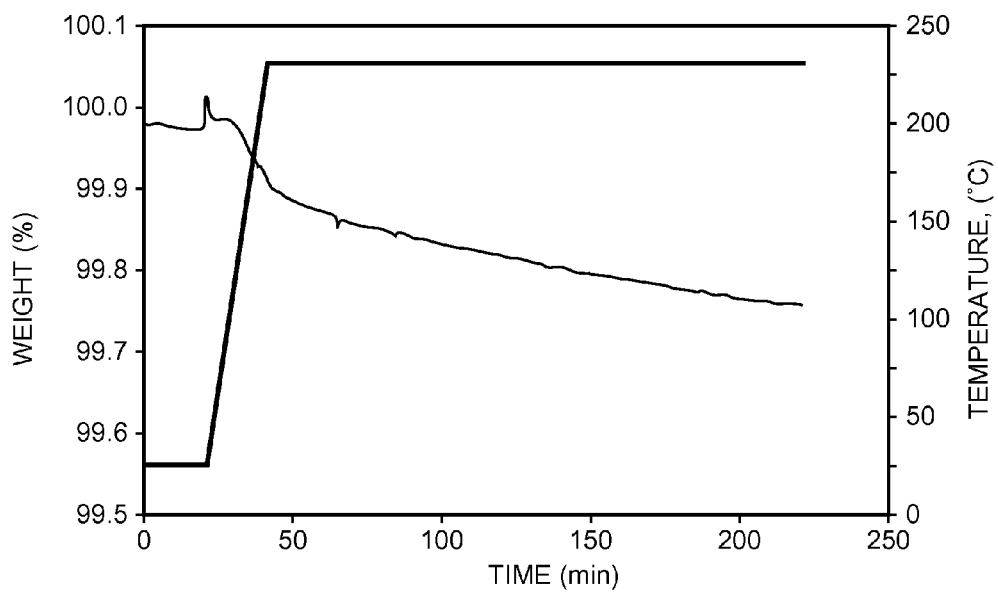
FIGS. 12 and 13 show respectively the weight loss of 230° C. and 300° C. cured material.
Figure 13:
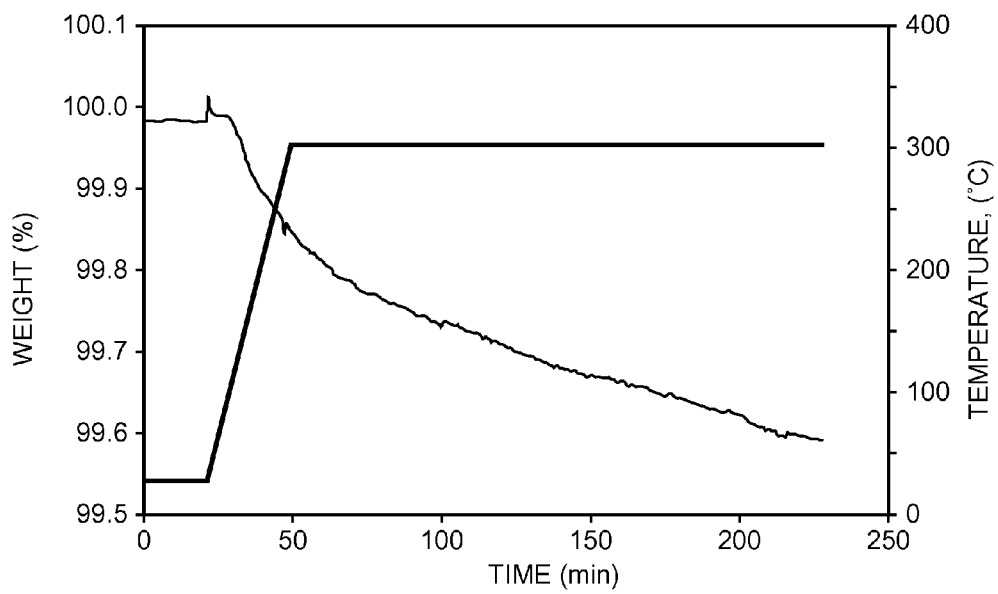

In order to identify the right concentration of the formulation that gives rise to the targeted thickness spin curves are first generated for a given formulation. FIG. 10 shows a typical post-bake spin curve. In this, film thickness is plotted as a function of rotations per minute of the wafer during spin coating. At ~1500 rpm, the formulation gives rise to ~1 µm film, New formulations with either higher or lower solid content can be prepared if specific rpm ranges are desired. The composition from Example 2 was spin-coated onto 8" silicon wafers and baked at 160 C/200 C for 1 min. Some of the wafers were cured at 230° C. for an hour in $N_2$ environment in a furnace and others were cured in $N_2$ in furnace at 300° C. for an hour. The post cure thickness was 1 um and bake-to-cure shrinkage of the film was 0.5 to 0.7% in 230° and 300° C. cured films. FIG. 11 shows a contemplated curing profile for 300° C. cure. The cured film was scraped from the wafers and weight loss at high temperature was characterized by ThermoGravimetric Analysis (TGA). The TGA procedure was as follows: 1) Hold for 20 minutes at 25° C., 2) Ramp from 25° C. to corresponding cure temperature (230 and 300° C.) and hold at the maximum cure temperature for 3 hours. FIGS. 12 and 13 show respectively the weight loss of 230° C. and 300° C. cured material. The cumulative weight loss after ramp and after 1, 2 and 3 hours of holding at cure temperature is summarized in Table 1. The weight loss is very low compared to other organic and acrylic materials used as planarization layers in flat panel screens. Weight loss of ~2 to 5% was reported for PC403 (manufactured by JSR) when heated above 230° C.

Figure 14:
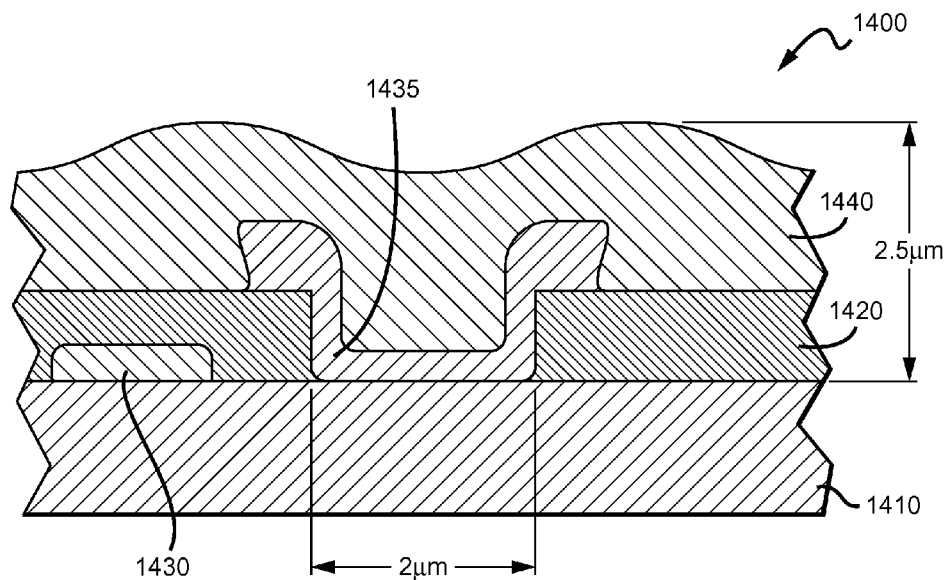
FIG. 14 shows a schematic depiction of a micrograph, where the surface is planarized by the contemplated material.

The material described in Example 2 was coated on a patterned substrate to find how well this material planarizes topographies. FIG. 14 shows a schematic depiction of a micrograph, where the surface is planarized by the contemplated material. Conformal PECVD $SiO_2$ (1420) was first formed on top of patterned Metal 1 (1430). The $SiO_2$ (1420) was etched and Metal 2 (1435) was deposited on etched regions. All of these layers are built onto a substrate 1410. The topography after Metal 2 deposition was planarized by the contemplated material (1440). The difference in layer thickness on top of and near the feature is <0.1 µm giving rise to a degree of planarization of >93%.

Example 6

Gate Dielectric

Figure 15:
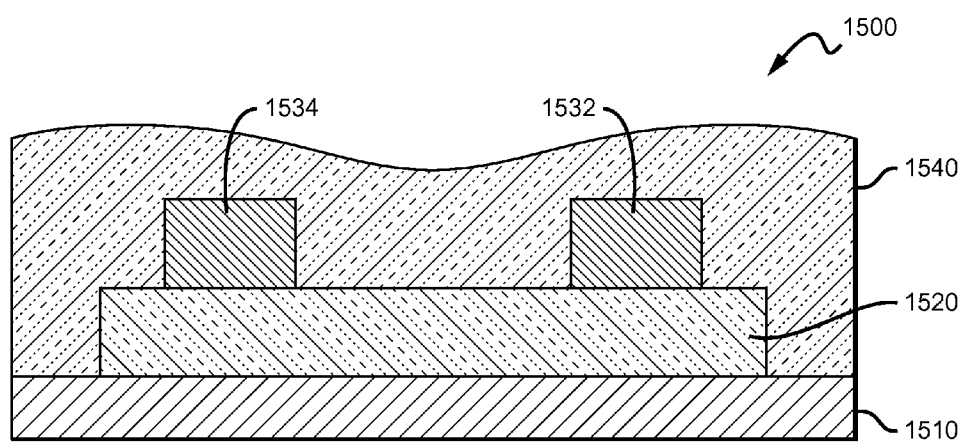
FIG. 15 shows a cross-section of the organic TFT (OTFT) (1500) fabricated to test the contemplated material as gate dielectric.
Figure 16A:
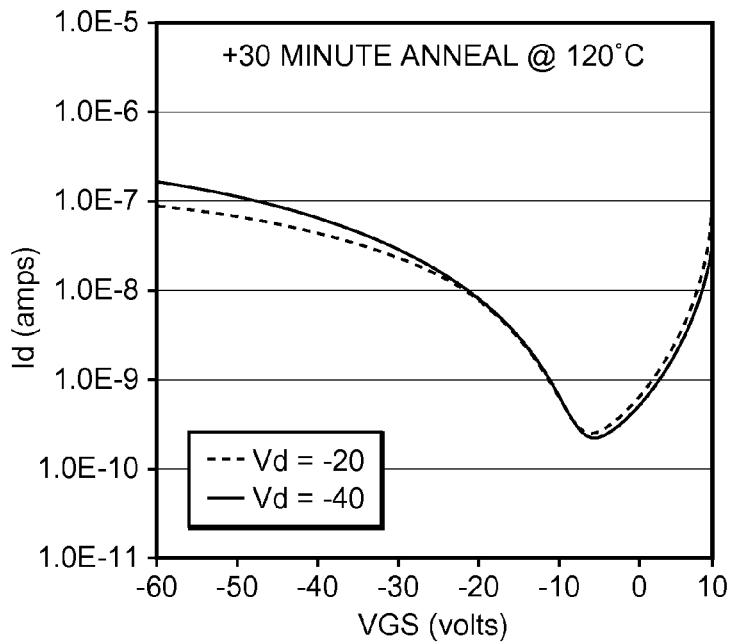
FIGS. 16(a) and (b) show the device characteristics of OTFT.
Figure 16B:
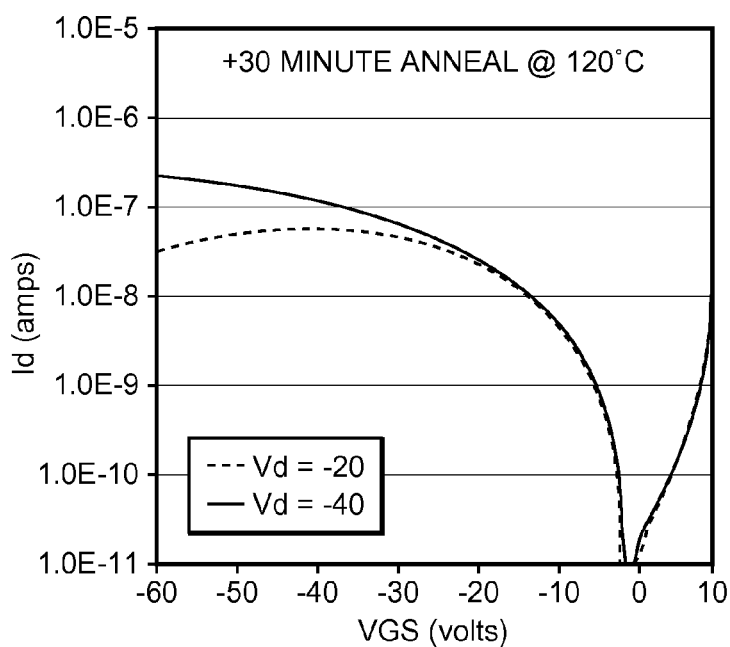

The cross-section of the organic TFT (OTFT) (1500) fabricated to test the contemplated material as gate dielectric is shown in FIG. 15. To integrate the contemplated material as gate dielectric (1520), the formulation was spin coated on p+ silicon wafer or substrate (1510) and cured at 300° C. The p+ silicon wafer functions as a gate electrode. Source/drain contacts (1532 and 1534) were fabricated on top of the gate dielectric (1520). Organic semiconductor poly-3-hexyl thiophene (1540) was deposited in a $N_2$ environment under a glove box and the semiconductor was annealed at different conditions shown in Table 2. Control samples were made with a thermal oxide as a gate dielectric. Measurements were made holding the samples in the glove box. FIGS. 16(a) and (b) show the device characteristics of OTFT. Drain current (Id) as a function of gate to source voltage (VGS) when drain voltage was 20 and 40V is plotted for thermal oxide in FIG. 16(a) and for a contemplated material in FIG. 16(b). The Ion and Ioff (on and off current) were obtained from when the device is turned on at high VGS and when the VGS is zero respectively. The table lists the different device parameters obtained from FIGS. 16(a) and (b) for OTFTs made with thermal oxide or a contemplated material as a gate dielectric. The material functions almost equal to that of thermal oxide or better (when annealed at 120° C./30 min) as seen from Table 2 and FIGS. 16(a) and (b).

Example 7

TFT Passivation

Dielectric materials with a dielectric constant of less than that of $SiO_2$ (3.9) is traditionally used in microelectronic circuits to reduce capacitive coupling thereby increase the speed of operating devices. These materials contain organic groups attached to Si in —Si—O— framework and these are deposited by chemical vapor deposition. The dielectric is used to insulate adjacent metal lines and vias on the same layer (intra-layer dielectric) or on two different layers (inter-layer dielectric). Flat panel display industry has adopted most of the materials and technology from microelectronic industries to build flat panel display screens. Traditionally the dielectric in flat panel displays is $SiN_x$ or $SiO_2$ and is deposited by plasma enhanced chemical vapor deposition (PECVD). It is known that the CVD methods give rise to a conformal coating with almost the same dielectric thickness all over the surface topology. The electrical performance of $SiN_x$ is excellent and it is the most commonly used interlayer dielectric [see M. Katayama, TFT-LCD Technology, Thin Solid Films, 341 (1999) 140-147] in thin film transistor (TFT) that functions as the on/off switch in flat panel screens. However, when the topology of the surface and the substrate size (with generations) are large, CVD cannot meet the requirements of cost and planarization of surface [see H. Matsumura, J. Appl. Phys., 66, 3612 (1989)]. Solution-based coating of dielectric materials is able to planarize the surface on the TFT array glass and provide a flat surface upon which LCD or OLED can be integrated easily. Patterning precision is also improved by using solution-based coating methods. Flat panel display industry is open to solution based coatings unlike microelectronic industries because of the sheer size of the panels, high cost associated with CVD and larger device dimensions (>5 μm size) with the associated less stringent electrical requirements.

There are well-documented reports on the performance and reliability of microelectronic devices formed of interconnects (metal and dielectric layers) with hybrid $SiO_2$—organic, commonly known as CDO—carbon doped oxides of silicon. [see Mok, T. S., W. J. Yoo and A. Krishnamoorthy, Physical and Failure analysis of Integrated Circuits (IPFA) 2004, Proceedings of 11$^{th}$ International symposium, pp. 181-4; M. Gotuaco, P. Huebler H. Ruelke, C. Streck, W. Senninger, Solid State Technology January, 2004; E. Ogawa, et al., 2002 IEEE TRPS, pp. 312-321.]

The major issue is caused by the dielectric damage upon exposure to wet etching, plasma treatments, resist strip, wet cleans and so on. The display panels are not far off from these requirements. Dielectric materials with organics built in Si—O framework deposited from solutions are expected to exhibit resistance to wet chemical and plasma etch processes, and photoresist strip and wet clean processes. Table 3 lists the main properties required for ILD applications in LCD or OLED containing flat panel displays.

TABLE 3

Property sets required from a TFT passivation or ILD material

| Properties | TFT passivation/ILD |
| --- | --- |
| Thermal Budget/cure temperature | ~400° C. (LTPS)<br>~350° C. (a-Si)<br><200° C. (org. SC) |
| Film Thickness & shrinkage | From 1.5 μm to 3.5 μm<br>Low shrinkage and low stress in film |
| Transmittance | >95% |
| Planarization | >95% |
| Resistance to plasma induced damage | Fluorine-based plasma ($SF_6$, $CF_4$, $CHF_3$), $O_2$ plasma used for photoresist ash |
| Wet chemical resistance | ST106, PRS2000, N300, TMAH, KOH and so on |
| Adhesion | Al, Cr, ITO, SiN, organic layers |
| Outgassing | Low (less than typical CVD chamber pressure) |
| Moisture uptake/$O_2$ diffusion | Low moisture uptake |
| Dispense tool | Spin or slot die coaters, screen printers, spray coating |

The formulation is usually dispensed on a large glass substrate using slot die coaters where a ribbon of liquid material is first dropped on the surface. The substrate may be spun at a low speed (300-600 rpm) to achieve coating thickness uniformity if the slot die tool has this provision. Otherwise, the material is left on the glass panel to dry naturally or aided by vacuum drying process.

Typical Process Steps in Making a TFT Array Glass:

Typical TFT arrays were previously discussed in the specification. The general sequence of process steps is described here: Glass substrate is first deposited with the metal layer and patterned to form gate metal regions. Then a thin layer of gate dielectric usually SiNx is deposited by PECVD, which is followed by semiconductor layer deposition usually amorphous silicon and n+ a-Si. Next, the pixel electrode material usually indium tin oxide (ITO) is deposited and patterned. The n+ a-Si layer is patterned to define Source (5) and Drain (D) contacts. SiNx is deposited next by PECVD to form ILD (this layer is also called TFT passivation layer as it covers the TFT region and separates it from LCD regions). When CVD SiNx is replaced by solution processable passivation layer, the integration sequence is different. The passivation layer is formed after S/D patterning by a solution processable material. The pixel electrode is formed in the end and patterned. In doing this, the transmitting area or the aperture ratio is improved with pixel being able to extend from drain region to bus line region.

Historical materials based on acrylics or alicyclics have suffered limited thermal stability, poor electrical properties and adhesion to surrounding layers. Here it is described how a siloxane based material can meet all the requirements of an interlayer and TFT passivation dielectric.

Dielectric formulations ("planarzing and thermally stable" or "PTS") comprising organic siloxanes were prepared in organic solvents and spin-coated on to silicon or glass wafers. Amorphous-silicon or low temperature poly-silicon (LTPS) based TFT array glass fabrication [H. Koike, "High Temperature Polysilicon Technology that Simultaneously Achieves Aperture 1.2× ratio and 1.5× Contrast", Flat Panel Displays, Part 3-8, pp 80-85, 2005.] can accommodate materials cured at higher temperatures such as 300 to 400° C. Plastic substrates or any other layers in cross section such as organic semiconductors cannot survive at high temperatures above 180° C. In such cases, a low temperature curable dielectric is needed. In this example, results from two different products—a contemplated composition comprising phenyl siloxane and a contemplated composition comprising methylphenylsilsesquioxane (HKLR)—are discussed. The phenyl siloxane-based material was hot-plate baked at 160° C./200° C./300° C. for 1 min each and cured at 400° C. for 1 hr in furnace in flowing $N_2$ environment. The HKLR-based material is baked at 80° C. for 2 min on a hot plate and then cured at 230° C. for 30 minutes in oven in air ambient. However, various combinations of bake/cure conditions are possible to form dielectric films for different applications. The phenyl siloxane-based material was characterized for the property sets required for high temperature LTPS-LCD passivation application. The HKLR-based material is characterized for low temperature TFT passivation application. However, these materials can be used interchangeably depending upon the maximum thickness and wet chemical resistance requirements.

The dielectric properties were measured using a mercury probe at 100 kHz frequency. Film thickness was measured after bake and after cure using Thermawave® to calculate the film thickness shrinkage (in z direction) due to curing. Refractive index (RI) of the film was also measured after bake and cure. Thermal stability was measured using a Thermal Desorption Mass Spectroscopy (TDMS) with the wafer maintained at the respective cure temperature. Weight loss of films before and after moisture exposure was characterized using thermal gravimetric analysis (TGA). Wafers were sliced into small pieces and immersed in wet chemistries for a fixed period of time to characterize wet etch resistance. Dry etch methods were developed to pattern the dielectric film, Adhesion to different layers (metals, other dielectric films, organic films) was measured using a standard scotch tape test. Film was first scribed using a diamond tip and then scotch tape was attached on the scribed area and pulled. Optical micrographs of the surface reveal how good or bad the adhesion is. Material was characterized for slot die coating compatibility on a TAZMO slot die coater. Films were coated on a surface patterned with metal or polymer and the degree of planarization in cross section was measured using scanning electron microscope.

Basic Property Sets:

Film shrinkage from bake to cure is low (<2%) for this material as seen from Table 4. The higher cure temperature leads to a little higher shrinkage. Refractive index is ~1.5 for the HKLR-based material and 1.55 for the phenyl siloxane-based material.

TABLE 4

Film properties of dielectric materials for TFT passivation and ILD applications

| Product | After bake (160/200/300° C./1 min on a bake plate) | | | After cure (400° C. in $N_2$ in furnace) | | | |
|---|---|---|---|---|---|---|---|
| | Thickness (Å) | RI | % standard deviation | Thickness (Å) | RI | % standard deviation | % shrinkage |
| Phenyl-based material | 9997 | 1.551 | 0.14 | 9872 | 1.5412 | 0.18 | −1.3 |
| | 10023 | 1.5509 | 0.41 | 9912 | 1.5418 | 0.53 | −1.1 |

| Product | After bake (80° C./2 min on a bake plate) | | | After cure (230° C./30 min in oven/air ambient) | | | |
|---|---|---|---|---|---|---|---|
| | Thickness (Å) | RI | % standard deviation | Thickness (Å) | RI | % standard deviation | % shrinkage |
| HKLR-based material | 14710 | 1.5056 | 0.45 | 14720 | 1.4991 | 0.49 | 0.07 |
| | 14759 | 1.5057 | 0.68 | 14765 | 1.4992 | 0.67 | 0.04 |

Contact angle is 88 to 90 for all the films and the film is hydrophobic. The hydrophobicity is due to the organic content in the film. Adhesion of these materials with other films (metal, other dielectric layers and organic layer) commonly used in a standard display panel is good.

As listed in Table 5, the dielectric materials have a dielectric constant (κ) value of ~3 to 3.3. Breakdown strength of the dielectrics (measured at 1 μA current) is high in the range of 4.4 to 5.0 MV/cm. Leakage current density measured at 2 MV/cm is 25 to 90 nA/cm². The low dielectric constant combined with low leakage make the film very well suited for the TFT passivation and inter-layer dielectric applications in flat panel displays.

TABLE 5

Dielectric properties of the phenyl siloxane-based material and HKLR-based material

| Material | Dielectric constant, κ | % standard deviation | Field at 1 μA (FBD), MV/cm | % Standard deviation | Current density at 2 MV/cm (A/cm$^2$) |
|---|---|---|---|---|---|
| Phenyl-siloxane based material | 3.09 | 0.3 | 4.5 | 4.9 | 8.90E−08 |
|  | 3.08 | 0.4 | 4.39 | 4.2 | 7.06E−08 |
| HKLR-based material | 3.3 | 0.4 | 4.79 | 3.2 | 2.49E−08 |
|  | 3.31 | 0.3 | 4.7 | 4.5 | 2.37E−08 |

Figure 17:
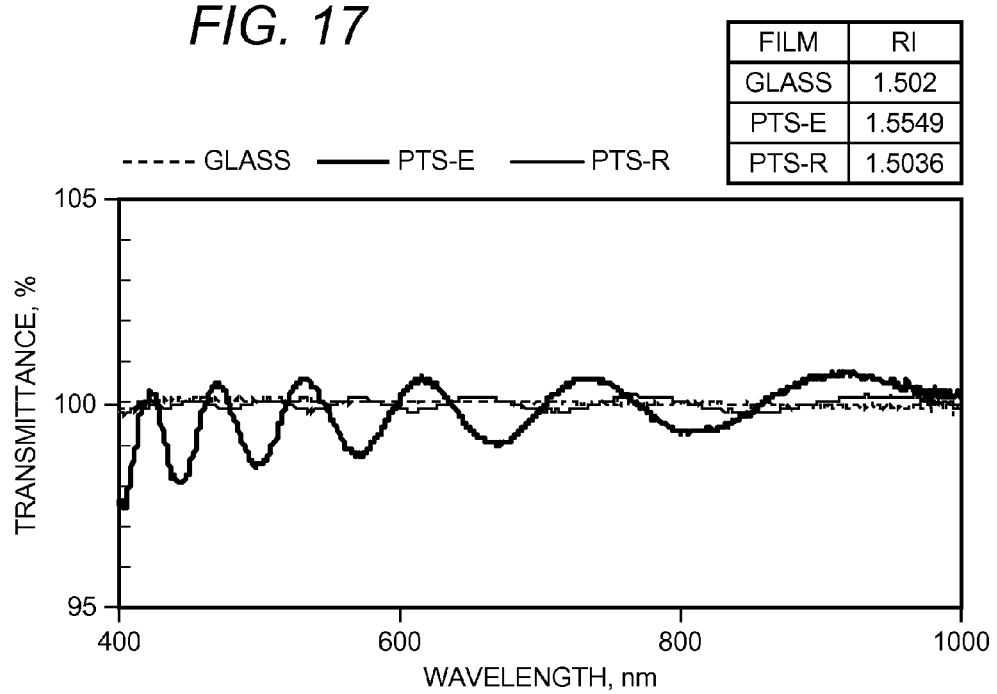
FIG. 17 shows the transmittance of the phenylsiloxane-based material and HKLR-based material with respect to glass in the visible optical wavelength range from 400 to 1000 nm.

FIG. 17 shows the transmittance of these materials with respect to glass in the visible optical wavelength range from 400 to 1000 nm. Overall, the optical transmittance is higher than 95% for both the films. The peaks and valleys in the transmittance curve are due to the refractive index (RI) difference between glass and the material. The higher the difference between the glass and the material, the higher the interference and the associated fringes, which does not affect the optical performance and clarity of the film as the transmittance is >97% with respect to glass.

Planarization of a substrate with organic layer using the phenyl siloxane-based material resulted in a degree of planarization (DOP) of 98%. Planarization of glass substrate with metal patterns using the HKLR-based material resulted in 95% DOP. In both the cases the surface is nearly flat after coating.

Spin and Slot Die Coating of PTS-Series Materials

Films made from the contemplated materials in this Example can be easily coated on Si wafer or glass panels using spin and slot die coaters. The PTS-series materials are applied to the Si substrate by spin coating and different spin curves are obtained. The bake temperature used to generate the spin curve ranges from 80° C. to 200° C. and the cure temperature ranges from 230° C. to 400° C.

In general there will be no significant thickness difference for the same material cured at different temperature (230 C to 400 C). The bake to cure shrinkage of these films are less or equal to 2.0%. The provided spin curves can be used to predict the needed film thickness for respective solids loading.

Figure 18A:
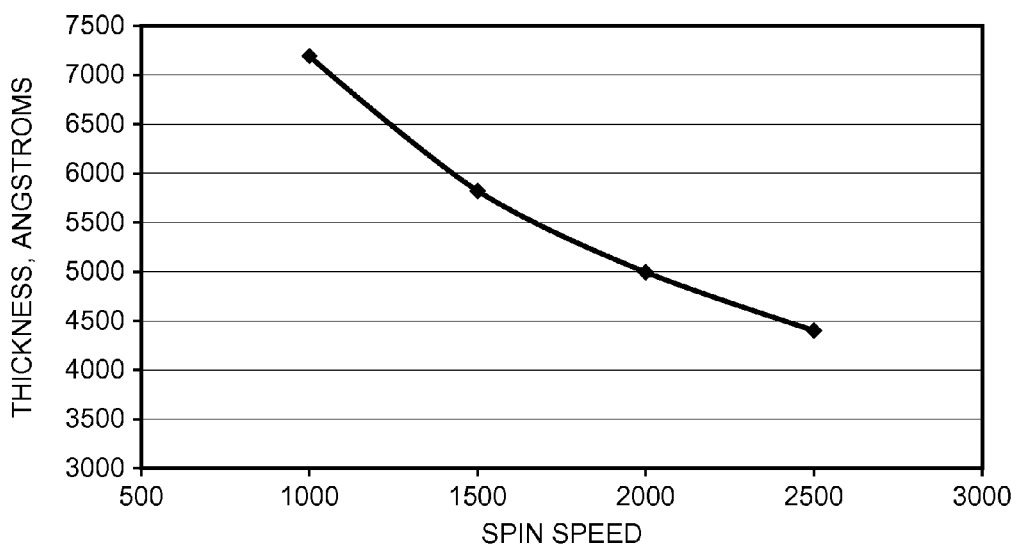
FIGS. 18A-18K show spin curces for PTS-series materials obtained by spin coating of the formulations on silicon wafers.

FIGS. 18A through K show spin curves for these materials obtained by spin coating of formulations on Si wafers. The properties of these materials are as follows:

FIG. 18A (PTS-E-4): 20% Solids Loading (20 g GR950F+80 g PGMEA+160 ppmTMAN)

Figure 18B:
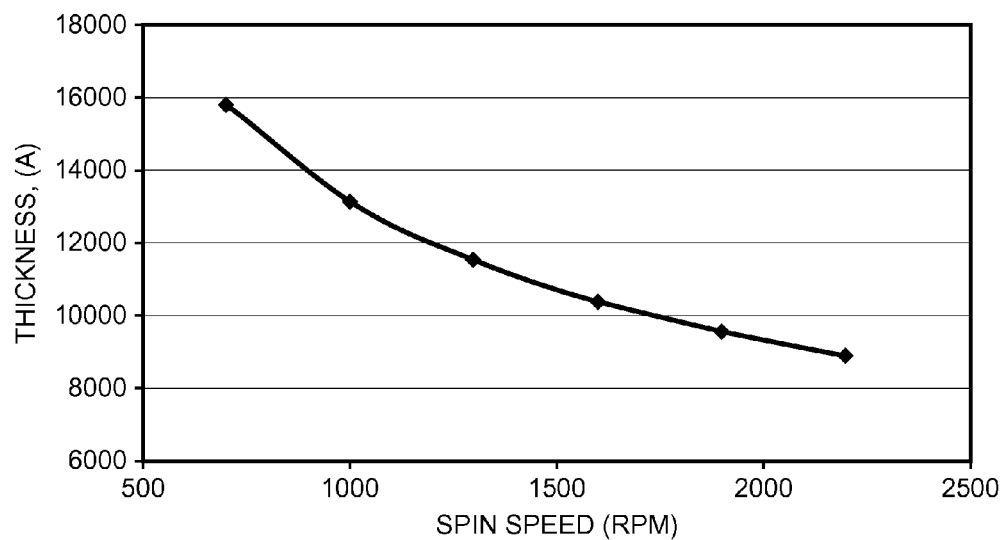

FIG. 18B (PTS-E-6): 30% Solids Loading (30 g GR950F+70 g PGMEA+160 ppmTMAN)

Figure 18C:
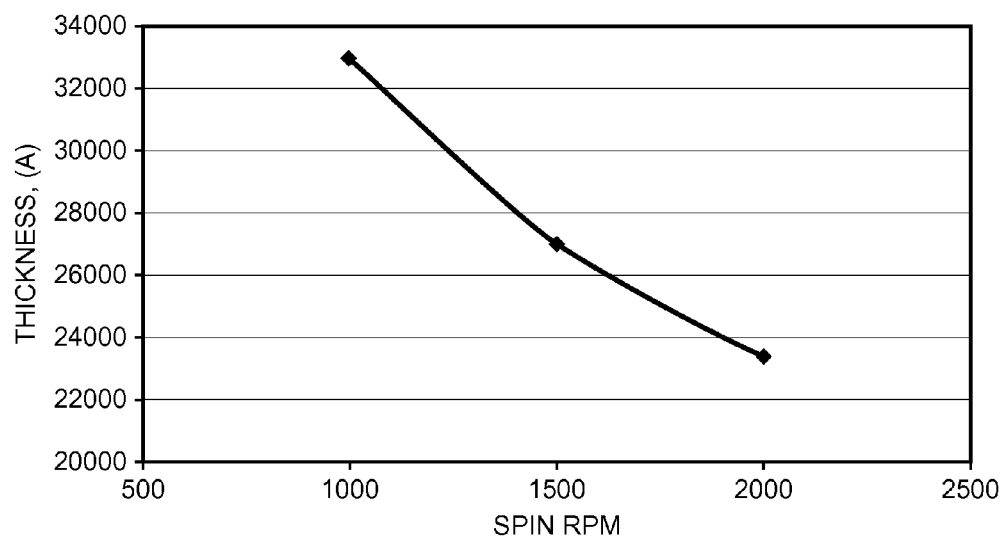

FIG. 18C (PTS-E-9): 45% Solids Loading (45 g GR950F+55 g PGMEA+160 ppmTMAN)

Figure 18D:
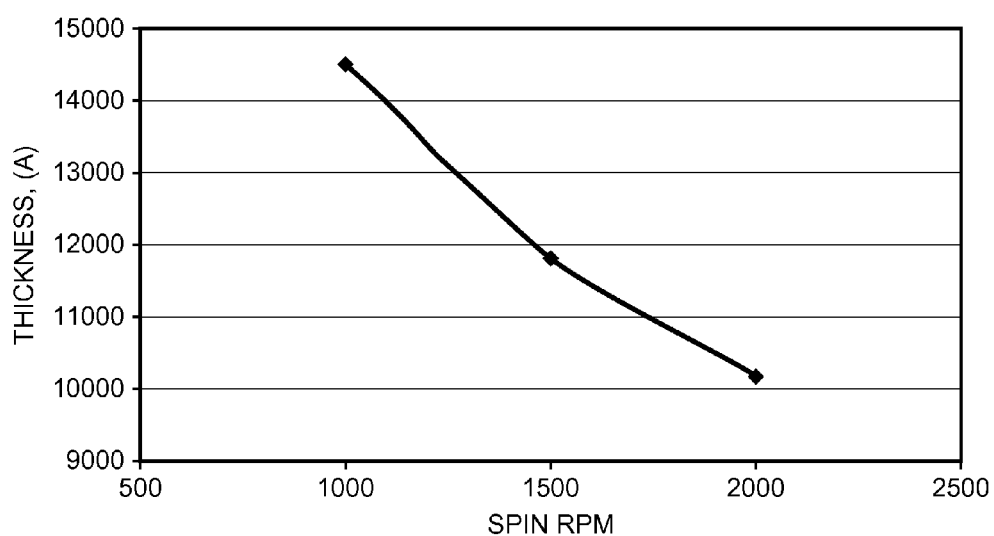

FIG. 18D (PTS-R-6): 30% Solids Loading (30 g GR150F+70 g PGMEA+160 ppmTMAN)

Figure 18E:
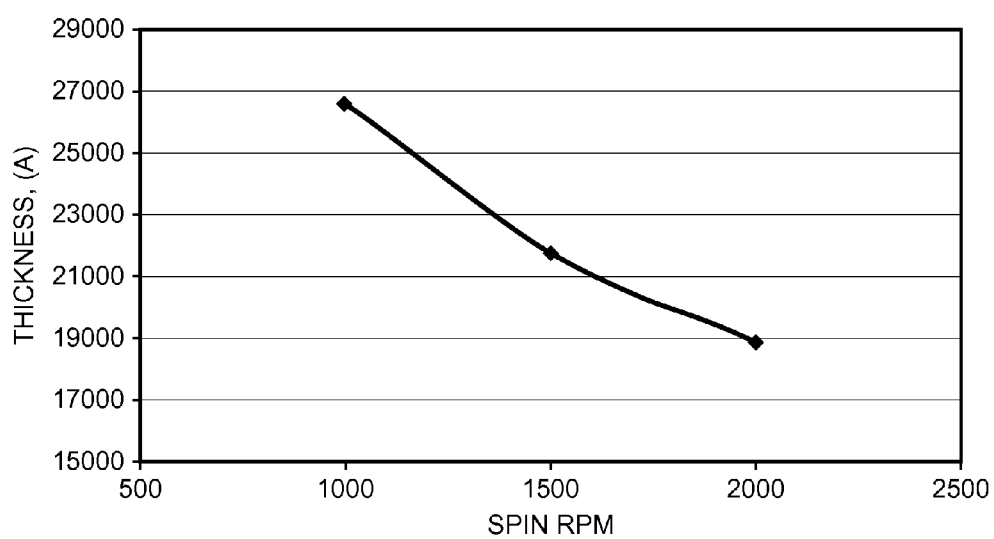

FIG. 18E (PTS-R-8): 40% Solids Loading (40 g GR150F+60 g PGMEA+160 ppmTMAN)

Figure 18F:
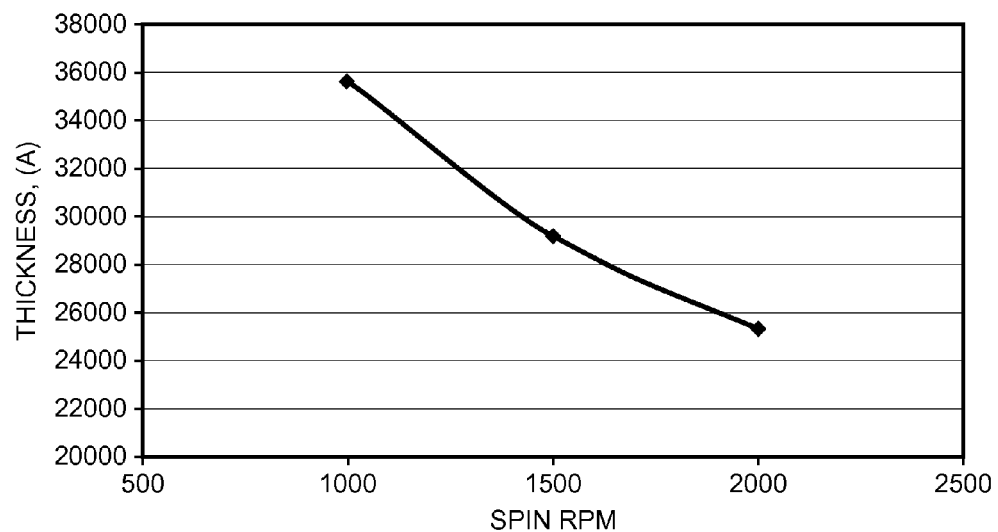

FIG. 18F (PTS-R-9): 45% Solids Loading (45 g GR150F+55 g PGMEA+160 ppmTMAN)

Figure 18G:
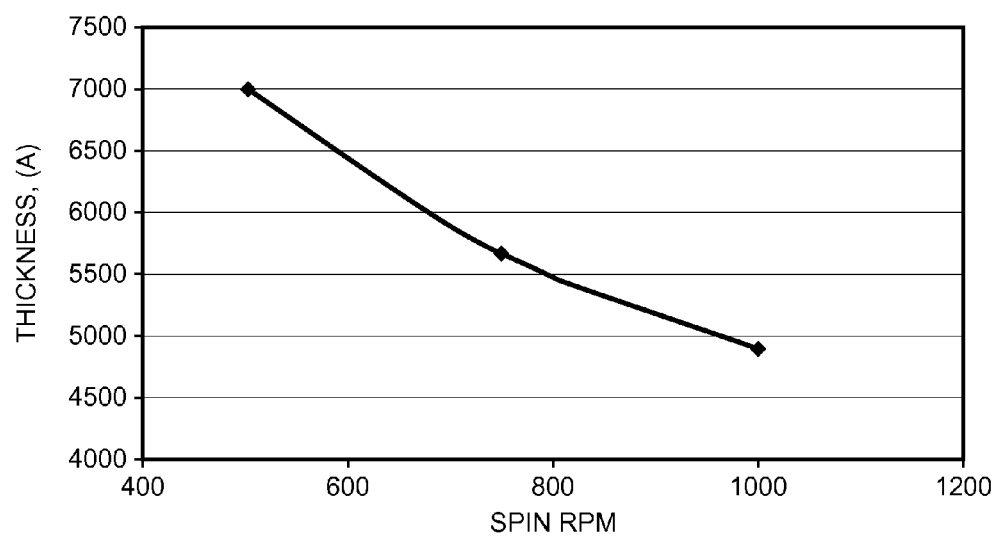

FIG. 18G (PTS-G-3): 15% Solids Loading (15 g GR908F+85 g PGMEA+160 ppmTMAN

Figure 18H:
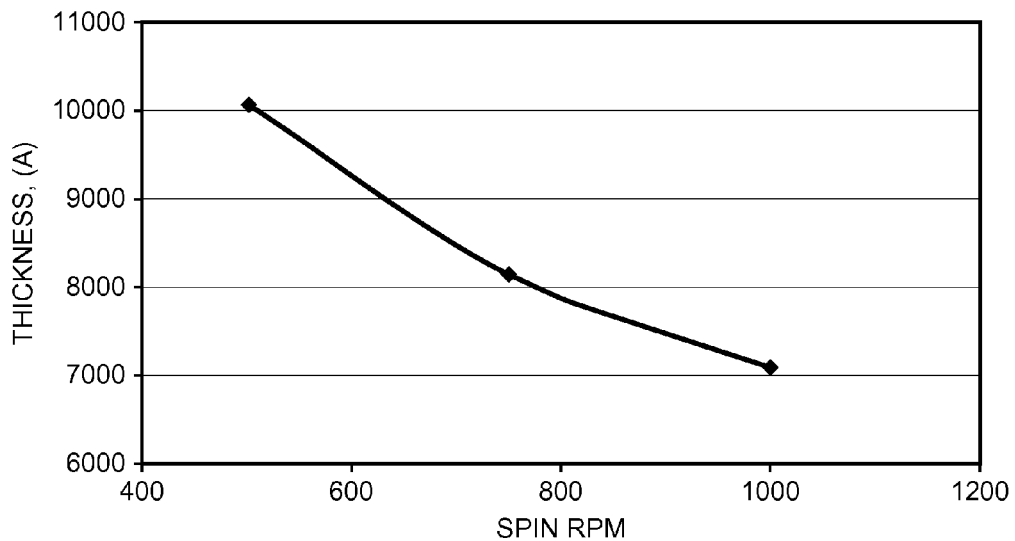

FIG. 18H (PTS-G-4): 20% Solids Loading (20 g GR908F+60 g PGMEA+160 ppmTMAN)

Figure 18I:
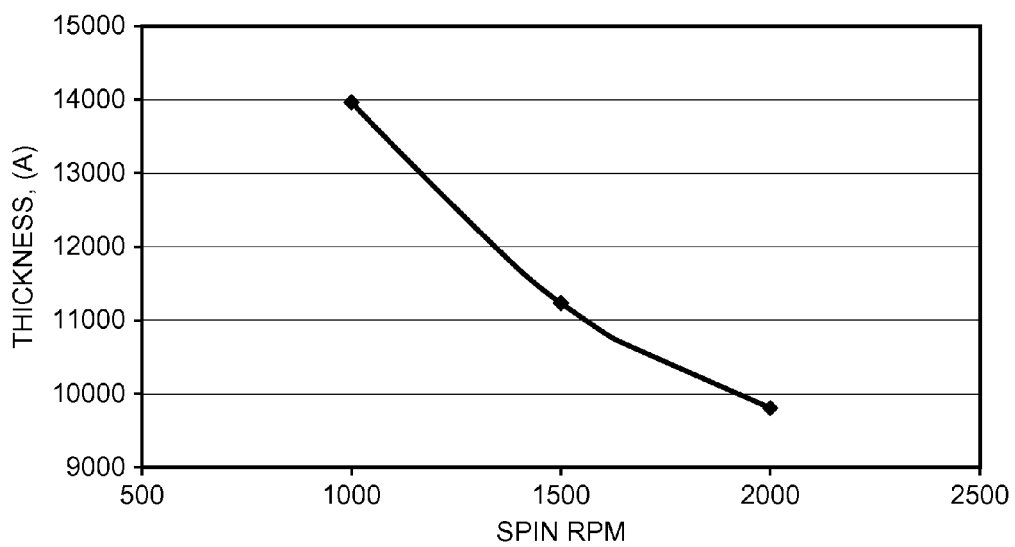

FIG. 18I (PTS-G-6): 30%% Solids Loading (30 g GR908F+70 g PGMEA+160 ppmTMAN)

Figure 18J:
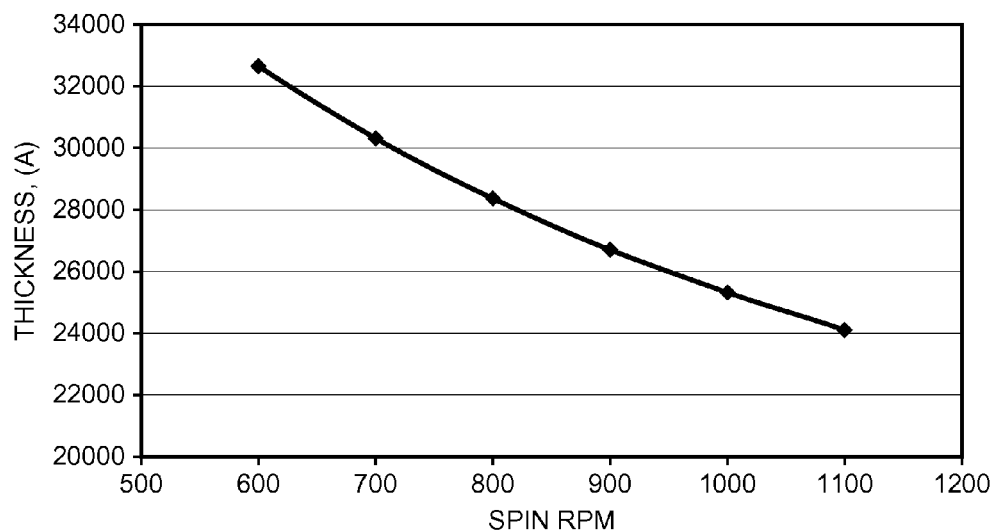

FIG. 18J (PTS-G-8): 40% Solids Loading (40 g GR908F+60 g PGMEA+160 ppmTMAN)

Figure 18K:
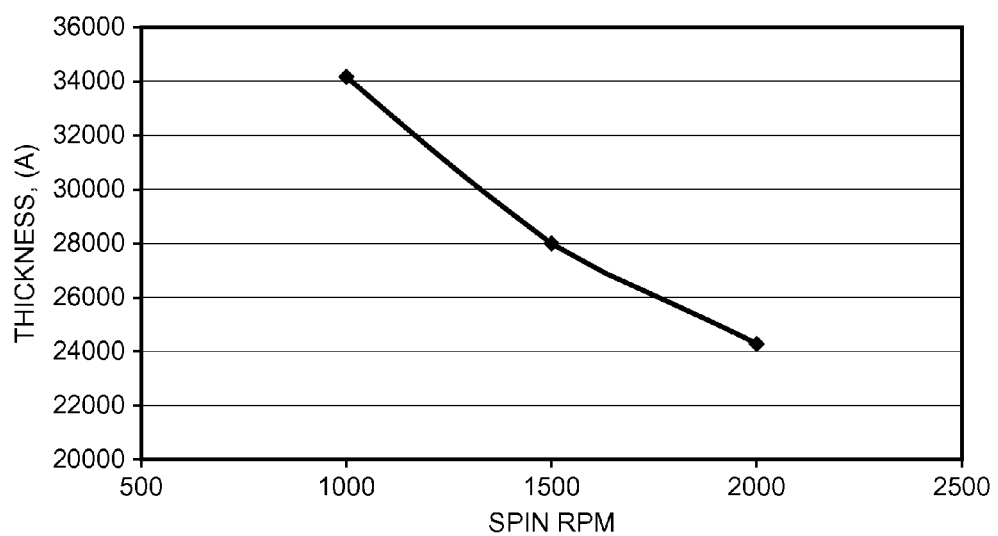

FIG. 18K (PTS-G-9): 45% Solids Loading (45 g GR908F+55 g PGMEA+160 ppmTMAN)

The maximum thickness achieved without cracking from the phenyl siloxane-based material is 1.5 μm and that from the HKLR-based material is ~3.5 μm. The film quality in both cases is good with no particles, striations, dewets, wind ripples and other defects.

Table 6 lists the thickness and % non-uniformity of slot-die coated contemplated films on G2 glass substrates (370/470 mm). Slot die coater parameters are the pressure P, gap (G) between the slit and the substrate and the speed (V) with which the slit moves while coating. The numbers 6 and 4 refer to different concentrations of formulations. The viscosity of these contemplated formulations can be tweaked in the range of 4-12 and 6-20 cp respectively. Both materials coated well on glass substrates with no striations or other defects.

TABLE 6

Slot die coating results using contemplated materials

| Material | P (kPa) | G (μm) | V (mm/s) | Thickness (μm) | % Non-uniformity |
|---|---|---|---|---|---|
| Phenyl siloxane-based material | 16 | 80 | 100 | 1.04 | 9.62 |
|  | 16 | 80 | 120 | 0.81 | 8.13 |
|  | 16 | 80 | 150 | 0.69 | 7.14 |
| HKLR-based material | 16 | 80 | 35 | 2.24 | 5.15 |
|  | 16 | 80 | 40 | 1.95 | 7.26 |
|  | 16 | 80 | 45 | 1.66 | 6.99 |

Dry Etch Results:

As the material is not photoimageable, it has to be photo-patterned using photoresist and should therefore be dry etchable. Both films are etched in $SF_6+O_2$ or $CHF_3+O_2$ gas mixtures. The etch rate can be tuned in the range from 6000 to 9000 Å by changing the dry etch conditions with 1% non-uniformity in thickness across an 8" wafer.

Outgassing and Thermal Stability:

One of the main requirements of a display dielectric is low outgassing. Outgassing in siloxane-based polymers can be due to many factors: (1) post-processing conditions may trigger some unfinished condensation reactions (in cured films)—that is why the post-processing temperature must not exceed cure temperature, (2) the organics in the material may decompose and come out of the film as outgassed components, and (3) the material may absorb water during different process steps and liberate during post-processing. In a completely cured and cross-linked film at or below cure temperature, the outgassing will be low if the material is resistant to moisture absorption, penetration and diffusion.

Figure 19:
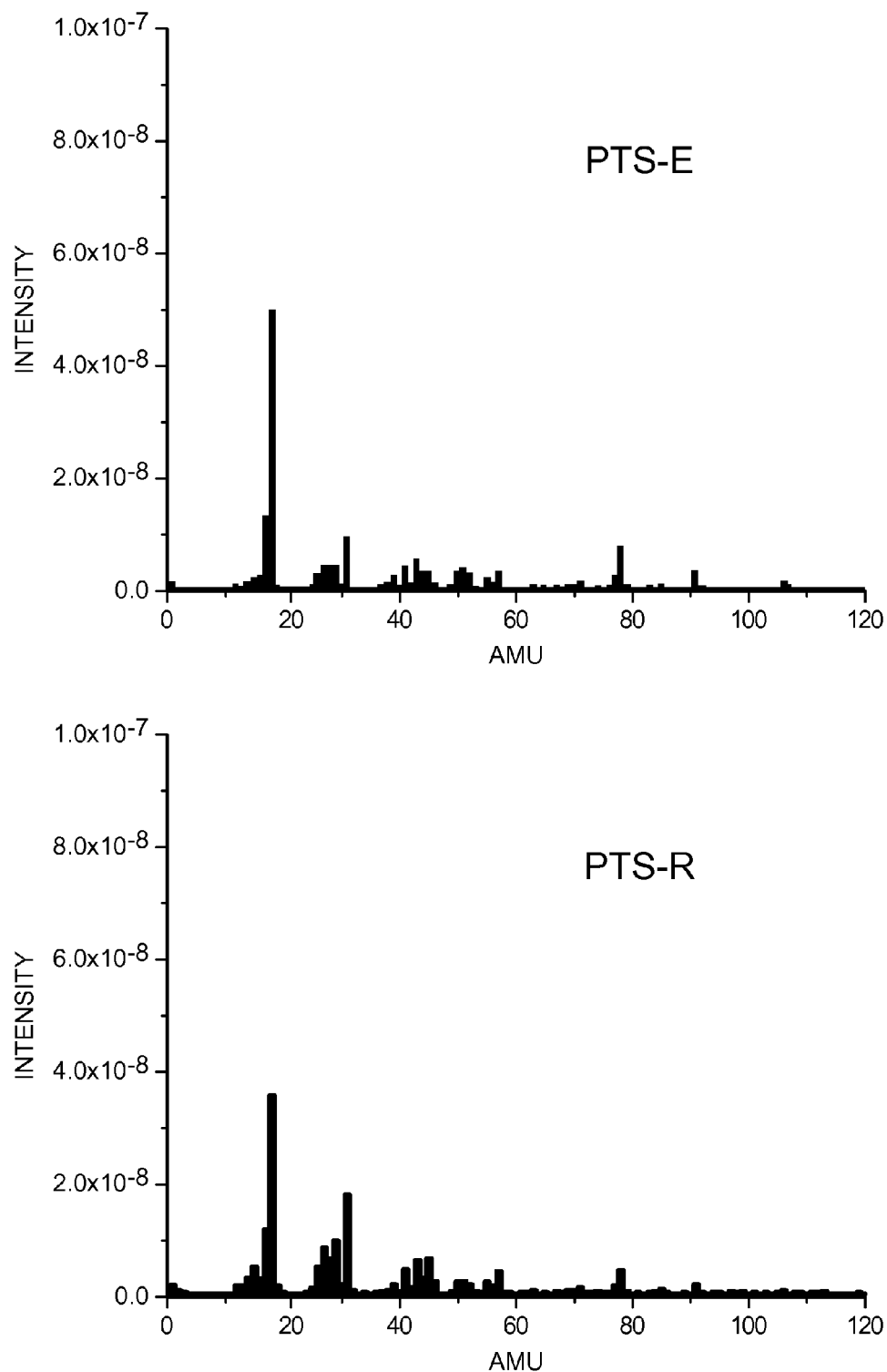
FIG. 19 shows the outgassing profile of a 250 C-cured HKLR-based material film and the outgassing profile of a 400 C cured phenylsiloxane-based film.

FIG. 19(a) shows the outgassing profile of 250° C.-cured HKLR-based material film and 400° C. phenyl siloxane-based film (FIG. 19(b)). Cured films are loaded in a thermal desorption mass spectrometer and the temperature was ramped to 250° C. or 400° C. for each material respectively at 10° C./min and held there for an hour. The outgassed components and their intensity in terms of pressure are shown in FIGS. 19(a) and (b). The main outgassed component is water. Total outgassing is very low of the order of $5 \times 10^{-8}$ Torr.

A moisture exposure test was done on the film by using the following method. Wafers were placed on a perforated holder with the film side facing water in a closed container. The film was exposed to moisture for 17 hours in this closed chamber. The wafers were removed and dried in $N_2$. Weight loss of the films before and after exposure was characterized in a thermal gravimetric analyzer. The films were scraped from the wafer surface and taken in an Al pan and loaded in the TGA chamber. Temperature was ramped from room temperature to cure temperature and then held at cure temperature for 1 hour.

Table 7 shows the weight loss of the films before and after moisture exposure measured using TGA. The results clearly indicate that there is no significant difference in weight loss between the pre- and post-moisture exposed films.

TABLE 7

Weight loss of moisture exposed and pristine films

| | | | Weight loss in weight % | |
|---|---|---|---|---|
| Film ID | Temperature details | Time details | before exposure | after exposure |
| HKLR-based material | 25-250° C. | 10° C./min | 0.12 | 0.11 |
| | 250° C./1 hr | 1st hour | 0.08 | 0.05 |
| | 250° C./2 hr | 2nd hour | 0.09 | 0.07 |
| | 250° C./1 hr | 3rd hour | 0.11 | 0.14 |
| | 25-250° C. | Total | 0.4 | 0.37 |
| Phenyl siloxane-based material | 25-400° C. | 20° C./min | 0.67 | 0.66 |
| | 400° C./1 hr | 1st hour | 0.66 | 0.73 |
| | 400° C./2 hr | 2nd hour | 1.16 | 1.14 |
| | 400° C./1 hr | 3rd hour | 1.55 | 1.49 |
| | 25-400° C. | Total | 4.04 | 4.02 |

Other properties such as the dielectric constant (κ), breakdown field (FBD), leakage current density (J) and the surface contact angle are not affected by moisture exposure as seen from the Table 8. Contact angle did not change after moisture exposure indicating there is no surface change or degradation of the film.

TABLE 8

Electrical properties of film before and after moisture exposure

| | Before exposure to moisture | | | After exposure to moisture | | |
|---|---|---|---|---|---|---|
| Film | κ | FBD in MV/cm | J at 2 MV/cm in A/cm$^2$ | κ | FBD in MV/cm | J at 2 MV/cm in A/cm$^2$ |
| Phenyl siloxane-based material | 3.08 | 4.5 | 7.98E−08 | 3.09 | 4.3 | 8.36E−08 |
| HKLR-based material | 3.32 | 5.31 | 2.07E−08 | 3.28 | 5.21 | 2.27E−08 |

All the above-mentioned properties are basic requirements of the film. Both films meet all these basic requirements.

Wet Chemical Resistance:

Contemplated phenyl siloxane-based material films were deposited onto Si wafer and cured at 400° C. was subjected to different chemistries. As shown in Table 9, this film is resistant to standard chemistries used in integration such as IPA, NMP, PGMEA, TMAH, BOE and DHF. The film swells in ST106, but this can be recovered completely by baking on a hotplate at 150° C. for 3 min. However, a film produced using this material is not resistant to photoresist stripping chemistries such as N-300, PRS-2000 and related chemistries.

TABLE 9

Wet chemical resistance of phenyl siloxane-based material films cured at 400° C.

| Chemistries | Pre etch (Å) | Post etch (Å) | Etch time | Etch rate (Å/min) |
|---|---|---|---|---|
| ST 106 | 10291 | 10526 | 2 min | −118 |
| 500:1 BOE | 10291 | 10259 | 2 min | 16 |
| 500:1 DHF | 10380 | 10343 | 2 min | 19 |
| | 10313 | 10366 | 10 min | −5 |
| 10% TMAH | 10347 | 10406 | 2 min | −30 |
| PGMEA | 10322 | 10700 | 5 min | −76 |
| | 10342 | 10402 | 10 min | −6 |
| IPA | 10280 | 10377 | 5 min | −19 |
| NMP | 10273 | 10481 | 5 min | −42 |
| | 10375 | 10296 | 10 min | 8 |
| PRS2000 | 10254 | NA | 2 min | Etched off completely |

While integrating this material, it is necessary to use $O_2$ plasma to first remove etch-hardened photoresist. This material is not etched or damaged by $O_2$ plasma. The etch rate in standard PR aching chemistries is ~100 Å/min with a selectivity of PR:PTS-E::38:1. The surface becomes hydrophilic after exposure to PR ash recipes. However, the original hydrophobic surface can be retrieved by a hotplate bake at 150° C./3 min. Even the electrical properties of the dielectric are recovered as seen from the Table 10.

TABLE 10

Electrical properties of oxygen plasma ashed film

| Condition | Dielectric constant (κ) | FBD* (MV/cm) | J at 2 MV/cm (A/cm$^2$) | RI | Contact angle |
|---|---|---|---|---|---|
| Before $O_2$ plasma ash | 3.22 | 4.5 | 7.93E−08 | 1.5502 | 99 |
| After ash | 3.18 | 4.79 | 1.89E−07 | 1.5555 | 5 |
| After hotplate bake | 3.2 | 4.48 | 6.93E−08 | 1.551 | 98 |

The cured dielectric film on Si wafer was coated with a standard 1-line photoresist and etched using $SF_6+O_2$ plasma. The photoresist was then removed by $O_2$ ash step. The samples were cross-sectioned and analyzed using scanning electron microscope. The material can be patterned using photoresist and $SF_6+O_2$ plasma etch without imparting damage to the dielectric.

Contemplated HKLR-based materials and films made from these materials are generally completely resistant to many etch chemistries as shown in Table 11. This makes the material very easy to integrate; the removal of etch hardened photoresist can be achieved by using aggressive chemistries such as PRS2000 at high temperatures above 50° C. without damaging the film. Contemplated HKLR-based materials are also resistant to $O_2$ plasma and therefore the etch-hardened photoresist can be removed by PR ash process followed by PR residue removal with mild wet chemistries such as ST106.

TABLE 11

Wet chemical resistance of 250° C. cured film

| Chemistries | Pre etch (Å) | Post etch (Å) | Etch time | Etch rate (Å/min) |
|---|---|---|---|---|
| PRS2000/70° C. | 11525 | 11522 | 6 min | Not etched |
| ST106/60° C. | 11835 | 11826 | 10 min | Not etched |

TABLE 11-continued

Wet chemical resistance of 250° C. cured film

| Chemistries | Pre etch (Å) | Post etch (Å) | Etch time | Etch rate (Å/min) |
|---|---|---|---|---|
| NMP | 11858 | 11908 | 6 min | Not etched |
| BOE | 11823 | 11825 | 6 min | Not etched |

Summary of Properties

The films disclosed in this example (and also in this disclosure) belong to a family of dielectrics developed for flat panel display dielectric applications. By comparing the properties of these materials summarized in Table 12 with the required properties listed in Table 3 it is clear that the dielectrics developed meet all the required properties of display dielectrics.

TABLE 12

List of properties of dielectric films for different applications

| Properties | Phenyl siloxane-based material | HKLR-based material |
|---|---|---|
| Thermal Budget | 350-400° C. | 230-250° C. |
| Film Thickness & shrinkage | >1.5 μm up to 2.2 μm | Max 3.5 μm |
| Transmittance | >97% | >97% |
| Planarization | >95% | >95% |
| Chemical/plasma resistance | Resistant to ST106, TMAH, KOH | PRS2000, N300, ST106, oxalic acid, TMAH, KOH |
| Plasma resistance | Resistant to $O_2$ plasma etched by $SF_6 + O_2$ | Resistant to $O_2$ plasma; etched by $SF_6 + O_2$ |
| Adhesion | Sticks well to Al, Cr, Mo, ITO, SiN, polyimide and color resist | Sticks well with Al, Cr, Mo, ITO, SiN and organic layers |
| Outgassing | $<8 \times 10^{-8}$ torr at cure temperature | $<5 \times 10^{-7}$ torr at cure temperature |
| Moisture uptake/$O_2$ diffusion | No higher out-gassing after exposure to humidity | Moisture and $O_2$ diffusion resistant - same level of Outgassing |
| Dispense tool | Can be coated by spin or slot die coaters to 1% and 5% non-uniformity respectively | Can be coated by spin or slot die coaters to 1% and 5% non-uniformity respectively |

These dielectric materials meet all the property requirements of display dielectric films such as hydrophobic surface, low cure temperature, high thermal stability with associated low outgassing, moisture absorption, and penetration resistance, very high planarizing ability, optical transmittance, low dielectric constant (κ=3.1 to 3.3), good electrical properties, high crack threshold (as high as 3.5 μm), high planarizing ability, resistance to photoresist strip and ash chemistries and a very smooth surface.

Example 8

Comparison of High & Low Alkyl/Aryl Percent Materials

Three silicon-based compound materials were compared for this Example. These materials are considered some of the contemplated embodiments of the LKHR-based materials and the HKLR-based materials disclosed earlier. For this example, the three materials utilized were:
GR908F: About 95% phenyl, 5% methyl (LKHR)
GR150F: About 65% phenyl, 35% methyl (HKLR)
GR100F: About 50% phenyl, 50% methyl (HKLR)

These compositions, which are shown in Table 13, and their resulting films were evaluated for the following properties: a) film quality, b) PRS 2000 resistance, c) electrical properties, d) TGA (% weight loss at cure temperature) and e) TOMS (outgassing).

Table 14 shows the processes for producing layers and then films of each of these compositions. Table 15 and 16 shows the PRS 2000 resistance for a continuous six minute exposure at 70° C. Table 17 shows a collection of electrical properties monitored for these compositions.

Figure 20:
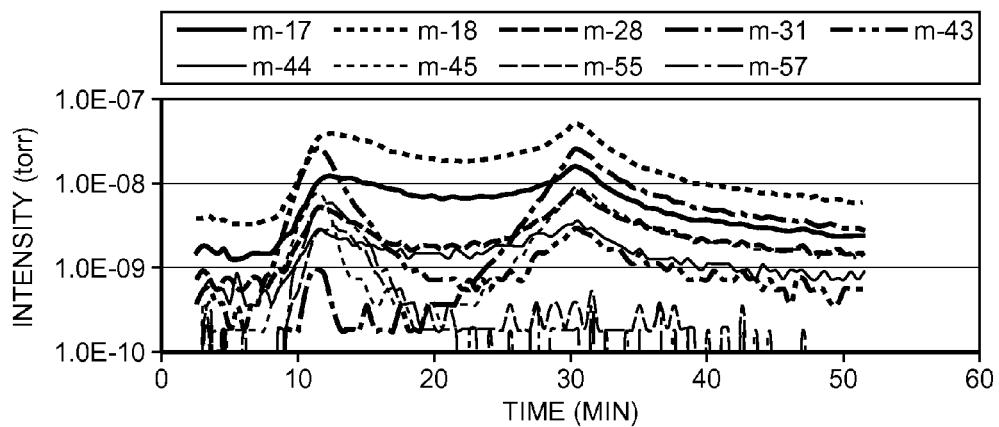
FIG. 20 shows the TDMS profile for GR908F.
Figure 20:
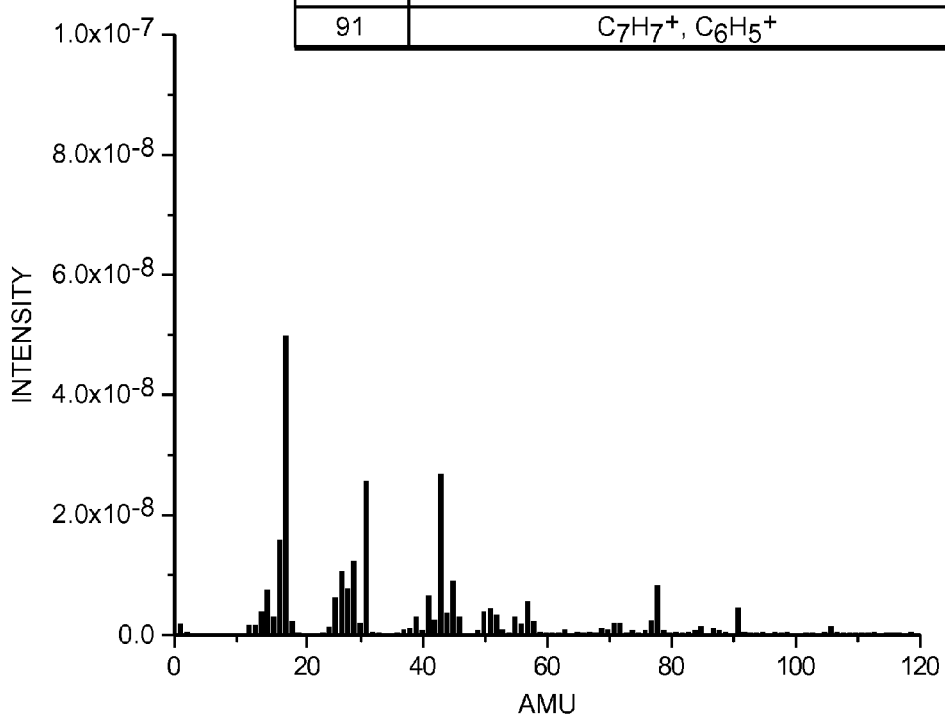
Figure 21:
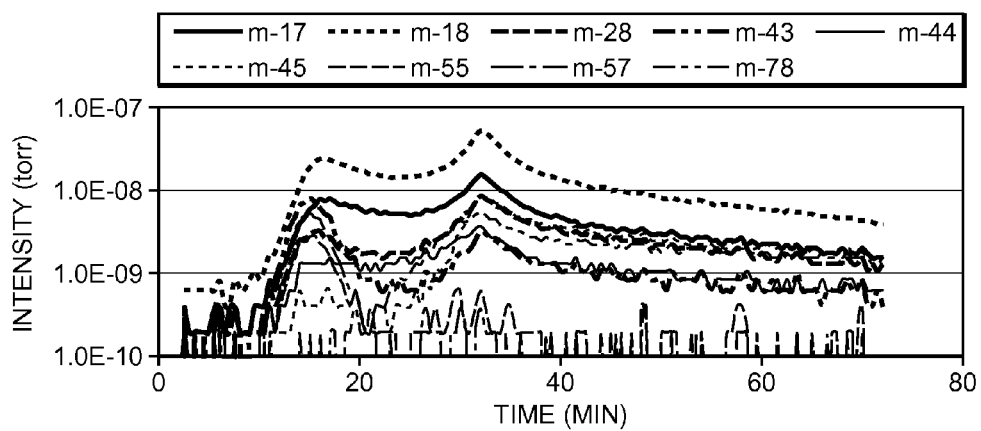
FIG. 21 shows the TDMS profile for GR 150F.
Figure 21:
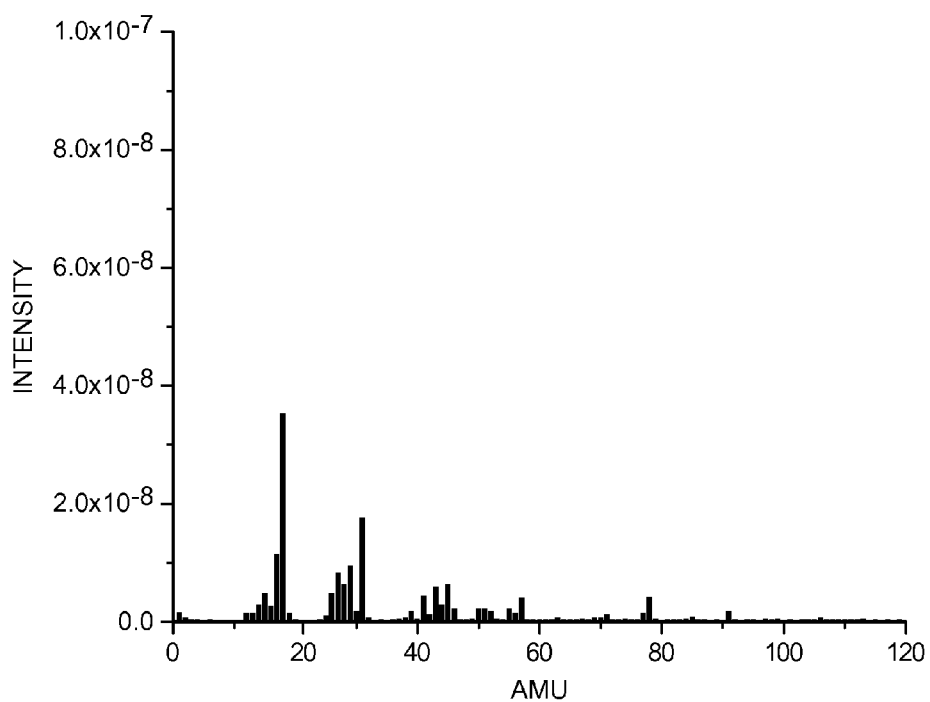
Figure 22:
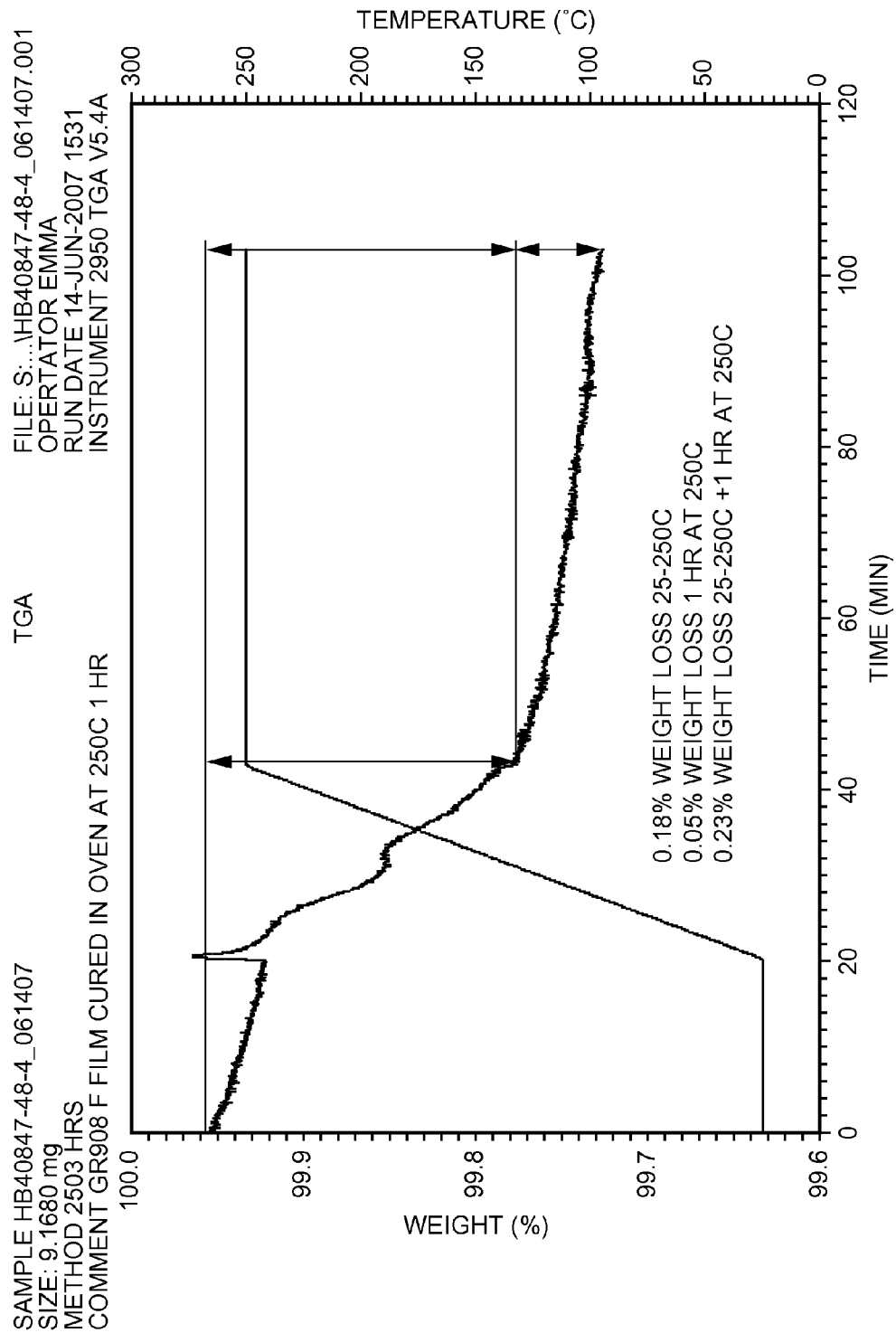
FIG. 22 shows the TGA analysis for GR908F.
Figure 23:
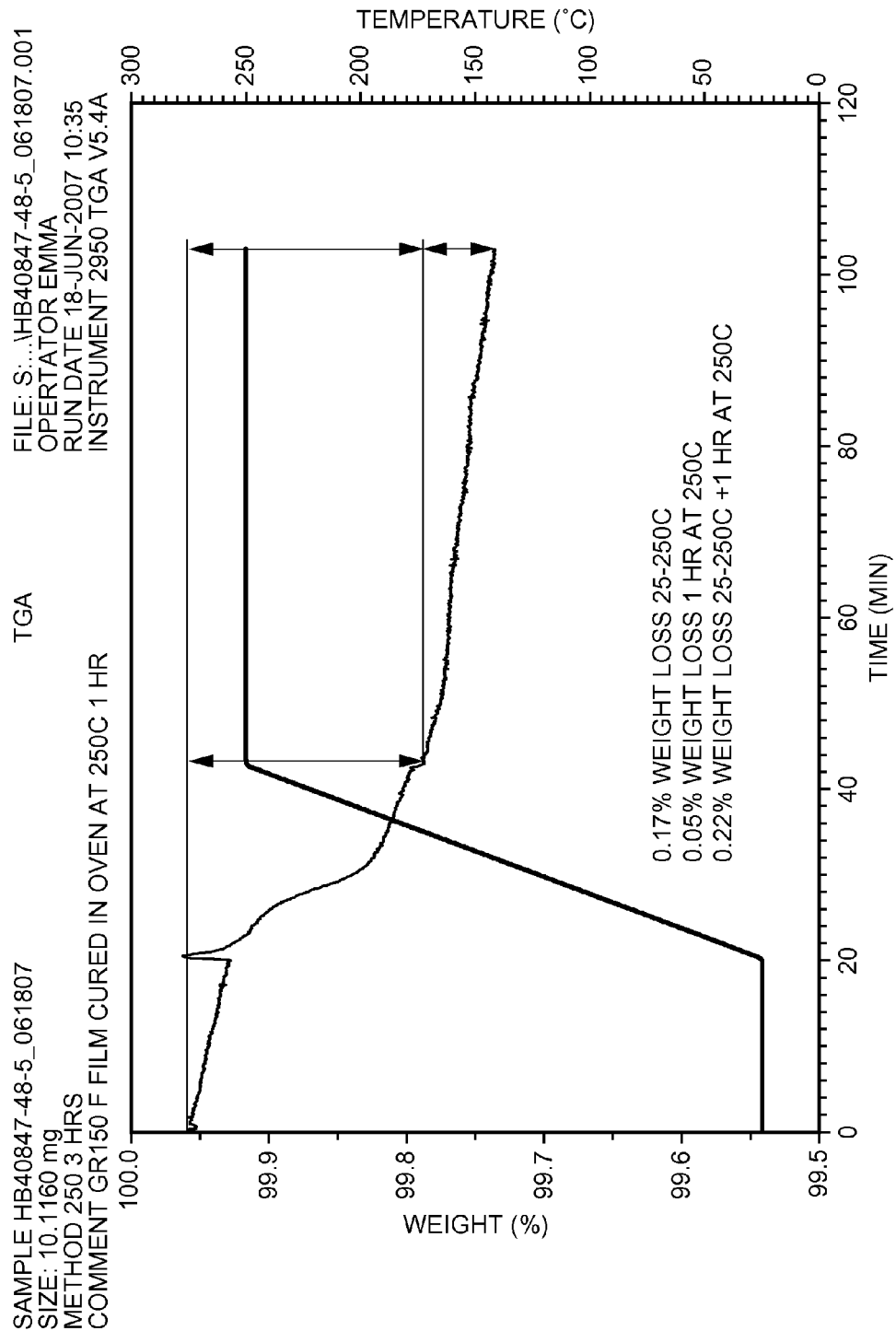
FIG. 23 shows the TGA analysis for GR150F.

TDMS or outgassing profiles were run on these materials during a 250° C. cure. The materials were ramped from room temperature to 250° C. and held at that temperature for 60 minutes. The ramp rate was 10° C./min. FIG. 20 shows the TDMS profile for GR908F. Outgassing of mass 31, 43, 45, 55 and 57 were detected during ramp up and moisture is also detected. Outgassing of all species diminished during isothermal holding at 250° C. (for 1 hr). FIG. 21 shows the TDMS profile for GR 150F. An increased outgassing above 135° C. during ramp up was observed, along with the observation that outgassing of all species diminished during isothermal holding at 250° C. for the first 30 minutes. FIG. 22 shows the TGA analysis for GR908F. The sample size was 9.1680 mg. The method was 250 C for 3 hours. The film was cured in oven at 250 C for 1 hour. FIG. 23 shows the TGA analysis for GR150F. The sample size was 10.1160 mg. The method was 250 C for 3 hours. The film was cured in oven at 250 C for 1 hour.

Example 9

Comparison of Phenyl-Based Siloxane Material with High & Low Alkyl/Aryl Percent Materials Three silicon-based compound materials were compared for this Example. These materials are considered some of the contemplated embodiments of the phenyl-based materials, LKHR-based materials and the HKLR-based materials disclosed earlier. For this example, the three materials utilized were:
PTS-E-9: Phenyl-based siloxane polymer
PTS-G-9: Low alkyl/High aryl-based siloxane polymer
PTS-R-9: High alkyl/Low aryl-based siloxane polymer
Table 18 shows a collection of required properties for display dielectrics. Table 19 shows the comparison of the properties for each of the three contemplated materials reviewed for this example.

Figure 24:
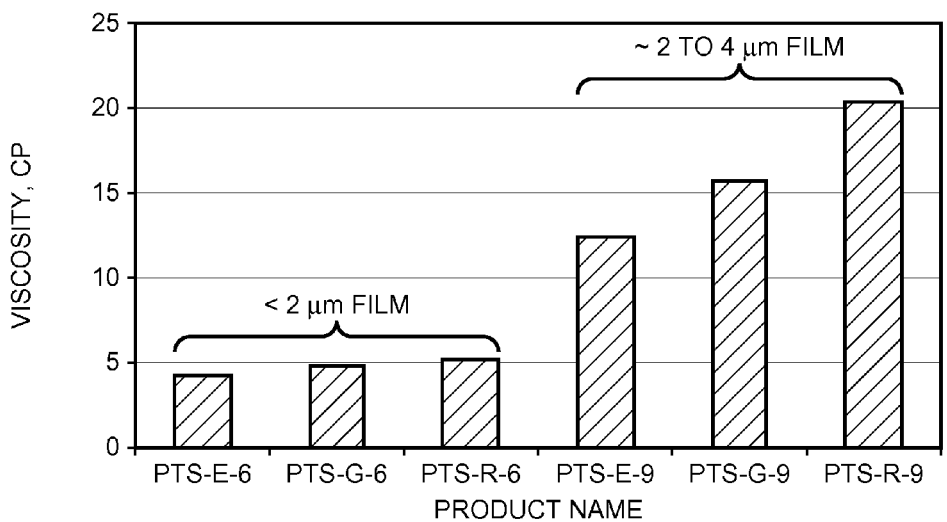
FIG. 24 shows the viscosity of contemplated formulations.
Figure 25:
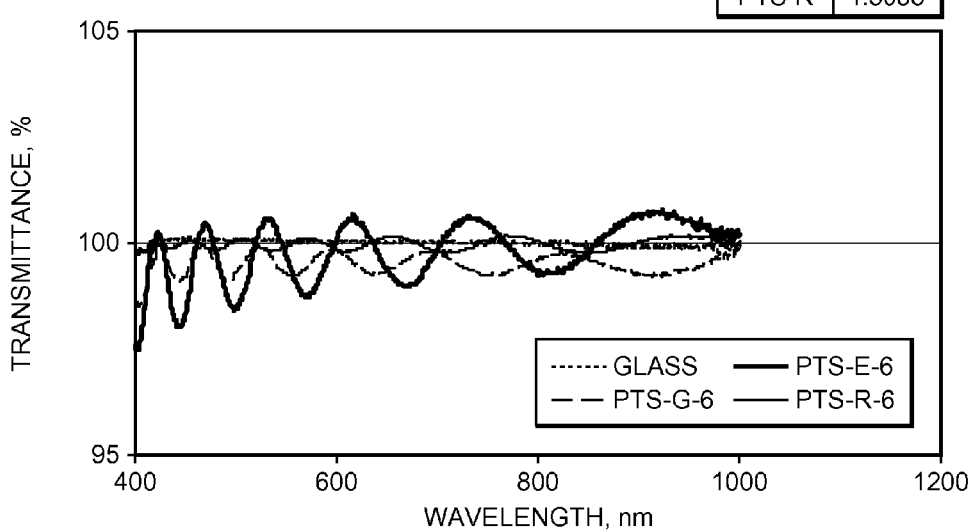
FIG. 25 shows the transmittance of the films from the materials utilized in this example.

Table 20 shows physical properties of films produced using the contemplated materials on 8" wafers. The bake and cure processes are disclosed, along with the post-bake and post-cure measurements. The bake to cure film shrinkage is less than 2%. FIG. 24 shows the viscosity of the formulations and FIG. 25 shows the transmittance of the films from the materials utilized in this example. The transmittance is above 95% for all of the films reviewed for this example. The interference fringes are caused by the refractive index difference between the glass substrate and the films. The fringes will disappear when the refractive index of the film is the same as that of the glass. Table 21 shows the "n" and "k" measurements of the materials. Electrical data was collected for these contemplated materials and is shown in Table 22.

Table 23 shows moisture resistance data using a similar procedure as that in Example 6. There was no significant difference in contact angle (hydrophobic) before and after moisture exposure and they remain hydrophobic even after 16 hours of exposure. There was no water absorption or penetration. The films do not absorb moisture and do not show any significant change in thickness, electrical properties, refractive index and extinction coefficient.

Tables 24 and 25 show shelf life data for the formulations described in this example. The formulations were stored at room temperature for 7 days, and the molecular weight of the polymer was assessed using GPC. The films were formed by baking at 170° C. for 2 minutes and cured in a furnace at 250° C. for 60 minutes. The film quality made with the 7-day room temperature stored formulations was the same as that of fresh solutions.

Example 10

Phenyl-Based Siloxane Material with Surfactant Additives

Phenyl-based siloxane materials comprising surfactant additives were produced and baked/cured to form films. The materials were processed at 160/170° C. for 1 minute of each bake. The films were then cured for 1 hour at 250° C. The films properties that were evaluated were thickness, refractive index, uniformity, bake to cure shrinkage, thermal stability (TGA), outgassing (TDMS), electrical properties and PRS 2000 resistance at 70° C. for 30 minutes.

Table 26 shows the processes for producing layers and then films of each of these compositions. Table 27 shows the PRS 2000 resistance for a continuous exposure of at least 30 minutes at 70° C. Table 28A shows a collection of electrical properties monitored for these compositions.

Thermal stability was measured by using TGA. The weight loss calculation for a 250° C. cured film was tested when the film was heated at a high temperature of 600° C. Specifically, the temperature was ramped from 25° C. to 500° C. and then held for 1 hour at 500° C. The temperature was then ramped from 500° C. to 600° C. and held at 600° C. for 30 minutes. FIGS. 26 and 27 show the results of the TGA experiments, where FIG. 26 is a control composition comprising no surfactants and FIG. 27 shows the composition comprising surfactant.

Outgassing of the control composition and the surfactant-containing composition was measured using TDMS. The control composition is cured at 250° C., ramped from room temperature to 400° C. and then held at 400° C. for 30 minutes. The ramp was at a rate of 10° C./minute. The surfactant-containing composition was prepared under the same conditions. FIG. 28 shows the TDMS profile for the control, and FIG. 29 shows the TDMS profile for the surfactant-containing composition.

Table 28B shows a series of shelf-life studies for the surfactant-containing compositions. There were no significant changes in film quality, film thickness or refractive index during these studies. There was also no percentage of expansion after aging at room temperature for 5 days. Table 29 shows the GPC data that indicates molecular weight growth for these materials. There is no significant change in molecular weight after 8 days at room temperature. These results are confirmed in the FTIR data shown in FIG. 30.

Thus, specific embodiments, methods of compositions, materials, layers and films for optoelectronic devices, methods of production and uses thereof have been disclosed. It should be apparent, however, to those skilled in the art that many more modifications besides those already described are possible without departing from the inventive concepts herein. The inventive subject matter, therefore, is not to be restricted except in the spirit of the disclosure herein. Moreover, in interpreting the specification and claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A crosslinkable composition, comprising:
    at least one silicon-based material comprising at least one alkyl group and at least one aryl group, wherein the at least one aryl group comprises an aryl percent of carbon and the aryl percent of carbon is present in an amount greater than about 80% of the total carbon present in the at least one alkyl group and at least one aryl group;
    at least one heat-activated condensation catalyst, wherein the catalyst comprises an ammonium compound, an amine, a phosphonium compound, a phosphine compound or a combination thereof;
    at least one surfactant; and
    at least one solvent.

2. The crosslinkable composition of claim 1, wherein the at least one alkyl group comprises methyl.

3. The crosslinkable composition of claim 1, wherein the at least one aryl or aromatic group comprises phenyl.

4. The crosslinkable composition of claim 1, wherein the at least one alkyl group comprises an alkyl percent of carbon and the alkyl percent of carbon is present in an amount of less than about 20% of the total carbon present in the at least one alkyl group and at least one aryl group.

5. The crosslinkable composition of claim 4, wherein the at least one alkyl group comprises an alkyl percent of carbon and the alkyl percent of carbon is present in an amount of less than about 10% of the total carbon present in the at least one alkyl group and at least one aryl group.

6. The crosslinkable composition of claim 4, wherein the at least one aryl group comprises an aryl percent of carbon and the aryl percent of carbon is present in an amount of greater than about 90% of the total carbon present in the at least one alkyl group and at least one aryl group.

7. The crosslinkable composition of claim 1, wherein the at least one silicon-based material comprises methylphenylsiloxane, methylphenylsilsesquioxane, polymethylphenylsiloxane, polymethylphenylsilsesquioxane or a combination thereof.

8. A crosslinked film formed from the composition of claim 1.

9. The crosslinked film of claim 8, wherein the film is etch resistant to at least one aggressive etch chemistry.

10. The crosslinked film of claim 9, wherein the at least one aggressive etch chemistry comprises PRS2000, ST106, NMP or BOE.

11. An optoelectronic device comprising the crosslinked film of claim 8.

12. The optoelectronic device of claim 11, wherein the device comprises a transistor, a light emitting diode, a color filter, a stainless steel or plastic surface, a photovoltaic cell, a flat panel display, an electrophoretic display, an x-ray detector or a combination thereof.

13. The optoelectronic device of claim 11, wherein the device comprises an active matrix thin film organic light emitting display, a passive matrix organic light emitting display, an active matrix thin film transistor liquid crystal display or a combination thereof.

14. The optoelectronic device of claim 12, wherein the transistor comprises an amorphous silicon thin film transistor, a low temperature polysilicon transistor, an organic transistor, an organic field effect transistor, a static induction transistor, a crystalline silicon transistor or a combination thereof.

15. The optoelectronic device of claim 11, wherein the crosslinked film has an optical transmittance greater than 95%.

16. The optoelectronic device of claim 11, wherein the film has a thickness of up to about 3.5 micrometers.

17. The optoelectronic device of claim 16, wherein the film has a thickness from about 2 micrometers to about 3.5 micrometers.

18. The crosslinked film of claim 8, wherein the film does not absorb light in the visible region.

19. A crosslinkable composition, consisting essentially of:
   at least one silicon-based material comprising at least one alkyl group and at least one aryl or aromatic group, wherein the at least one aryl or aromatic group comprises a percent of carbon present in the at least one aryl group, the percent of carbon is present in the at least one aryl group being greater than about 80% of the total carbon present in the at least one alkyl group and at least one aryl group;
   at least one heat-activated condensation catalyst, wherein the catalyst comprises an ammonium compound, an amine, a phosphonium compound, a phosphine compound or a combination thereof;
   at least one surfactant;
   at least one solvent; and
   optionally, at least one additive selected from at least one crosslinking agent, at least one adhesion promoter, and at least one additive designed to influence the surface tension, viscosity, density, transmittance, or transparency of the composition.

20. The crosslinkable composition of claim 19, wherein the at least one aryl group comprises an aryl percent of carbon and the aryl percent of carbon is present in an amount of greater than about 90% of the total carbon present in the at least one alkyl group and at least one aryl group.

21. The crosslinkable composition of claim 19, wherein the at least one alkyl group is methyl and the at least one aryl or aromatic group is phenyl.

* * * * *